(12) United States Patent
Zook

(10) Patent No.: US 6,662,336 B1
(45) Date of Patent: Dec. 9, 2003

(54) ERROR CORRECTION METHOD AND APPARATUS

(75) Inventor: Christopher P. Zook, Longmont, CO (US)

(73) Assignee: Cirrus Logic, Inc., Freemont, CA (US)

( * ) Notice: Subject to any disclaimer, the term of this patent is extended or adjusted under 35 U.S.C. 154(b) by 0 days.

(21) Appl. No.: 09/526,032

(22) Filed: Mar. 15, 2000

Related U.S. Application Data

(60) Provisional application No. 60/142,444, filed on Jul. 6, 1999.

(51) Int. Cl.$^7$ .............................................. H03M 13/03
(52) U.S. Cl. ........................ 714/786; 714/785; 714/781
(58) Field of Search ................................ 714/786, 746, 714/785, 781, 784, 759

(56) References Cited

U.S. PATENT DOCUMENTS

| | | | |
|---|---|---|---|
| 5,446,743 A | | 8/1995 | Zook |
| 5,467,297 A | * | 11/1995 | Zook |
| 5,555,516 A | | 9/1996 | Zook |
| 5,592,404 A | | 1/1997 | Zook |
| 5,600,662 A | | 2/1997 | Zook |
| 5,602,857 A | | 2/1997 | Zook et al. |
| 5,629,949 A | | 5/1997 | Zook |
| 5,671,237 A | | 9/1997 | Zook |
| 5,724,368 A | | 3/1998 | Zook |
| 6,453,441 B1 | * | 9/2002 | Daoudi et al. ............... 714/784 |

OTHER PUBLICATIONS

Glover et al, "Practical Error Correction Design for Engineers", 2$^{nd}$ Edition, Cirrus Logic, 1991.

* cited by examiner

Primary Examiner—Phung M. Chung
(74) Attorney, Agent, or Firm—Nixon & Vanderhye, P.C.

(57) ABSTRACT

Using a Berlekamp-Massey process operating with unique recursion rules, a fast correction subsystem performs, for each t-byte codeword having m-bit symbols, a series of error locator iterations, followed by a series of error evaluator iterations, followed by a series of correction iterations to generate and use an error pattern for correcting a codeword. The fast correction subsystem includes three sets of registers and various multipliers distributed over t+1 component slices. In accordance with the recursion rules and multiplier implementations, only three types of registers (120, 130, 140) are required per slice and all operations are preferably performed in m/2 or less clocks. A first set of registers ("σ registers") ultimately contains quantities which include coefficients of an error locator polynomial for the codeword. A second set of registers ("τ registers") are utilized, e.g., to update the σ registers A third set of registers ("R registers") ultimately contains quantities which include coefficients of an error evaluator polynomial for the codeword.

70 Claims, 18 Drawing Sheets

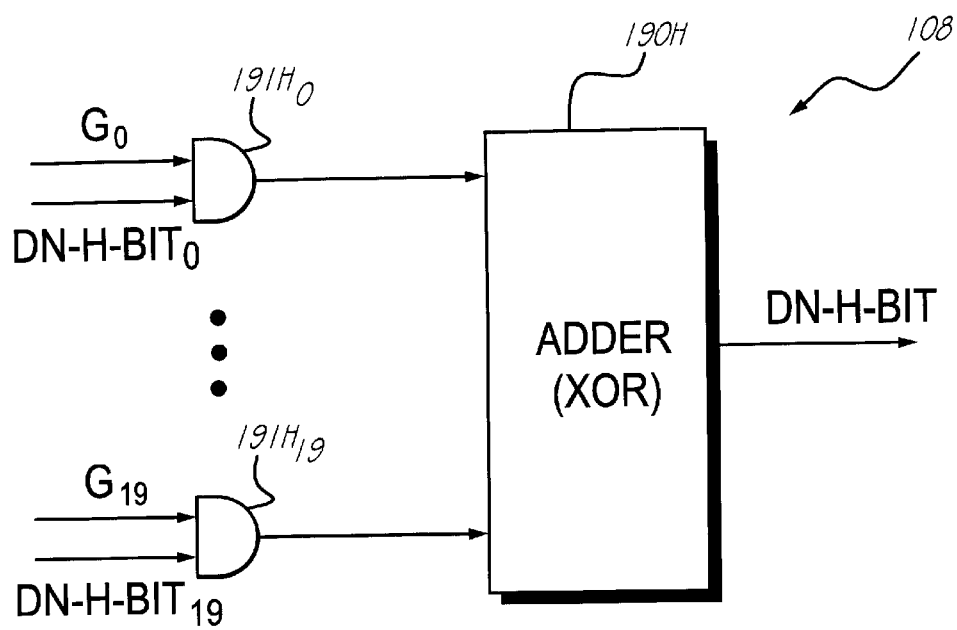
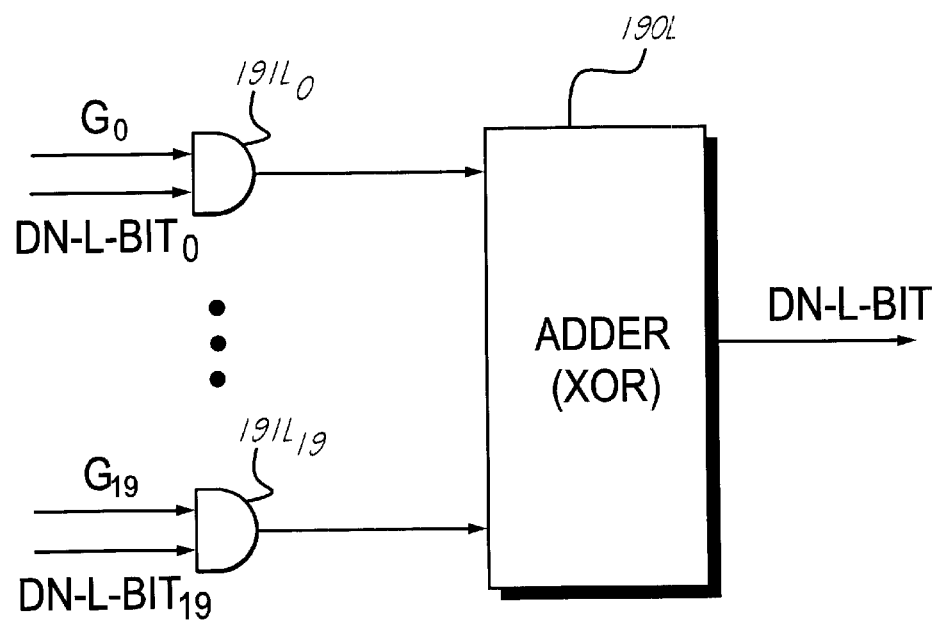
*Fig. 19*

ERROR CORRECTION METHOD AND APPARATUS

This application claims the priority and benefit of U.S. Provisional Patent Application Serial No. 60/142,444 filed Jul. 6, 1999, which is incorporated herein by reference.

BACKGROUND

1. Field of the Invention

The present invention pertains to error correction of digital data, and particularly to error correction using the Berlekamp-Massey algorithm.

2. Related Art and Other Considerations

Error correction coding techniques are typically employed for digital data that is transmitted on a channel or stored/retrieved with respect to a storage device (such as, for example, an optical disk drive or magnetic media drive). With error correction coding, the data to be transmitted or stored is processed to obtain additional data symbols (called check symbols or redundancy symbols). The data and check symbols together comprise a codeword. After transmission or retrieval, the codeword is mathematically processed to obtain error syndromes which contain information about locations and values of errors. Certain principles regarding error correction coding are provided in Glover et al., *Practical Error Correction Design For Engineers*, 2$^{nd}$ Edition, Cirrus Logic (1991).

The Reed-Solomon codes are a class of multiple-error correcting codes. One of the most popular methods of decoding is to generate an error location polynomial $\sigma(x)$;

generate an error evaluator polynomial $\omega(x)$ from the error location polynomial;

perform a root search for the error locator polynomial to detect error locations; and then evaluate the error evaluator polynomial at the error location polynomial root to calculate an error value. Most logic circuits for error detection and correction implement the Berkekamp-Massey algorithm.

Examples of error correction coding, including utilization of Reed-Solomon codes, are provided by the following (all of which are incorporated herein by reference): U.S. Pat. No. 5,446,743; U.S. Pat. No. 5,724,368; U.S. Pat. No. 5,671,237; U.S. Pat. No. 5,629,949; U.S. Pat. No. 5,602,857; U.S. Pat. No. 5,600,662; U.S. Pat. No. 5,592,404; and, U.S. Pat. No. 5,555,516.

U.S. Pat. No. 5,446,743, entitled "Coefficient Updating Method And Apparatus For Reed-Solomon Decoder", incorporated herein by reference in its entirety, discloses a Reed-Solomon decoder which forms coefficients of an error locator polynomial $\sigma(x)$ in a bank of error locator registers and coefficients of an error evaluator polynomial $\omega(x)$ in a bank of intermediate registers ($\tau$ registers). The decoder of U.S. Pat. No. 5,446,743 comprises a plurality of "slices", each slice having one syndrome register, one of the error location registers, one of the intermediate registers, is and a modified syndrome register.

For each codeword input to the decoder of U.S. Pat. No. 5,446,743 there are two iterations: a first iteration for obtaining the coefficients of the error location polynomial and a second iteration for obtaining the coefficients of the error evaluator polynomial. Each error location iteration has two phases: a first phase (phase A) and a second phase (phase B). During phase A of each error locator iteration, a current discrepancy $d_n$ is generated and the coefficient values in the intermediate registers ($\tau$ registers) are updated. The current discrepancy $d_n$ is generated by a discrepancy determination circuit which adds multiplicative products from the slices. During phase B of each error locator.iteration, the coefficients values in the error location registers ($\sigma$ registers) are updated. At the end of phase B, the inverse of the discrepancy, i.e., $d_n^{-1}$, is outputted from a discrepancy inversion circuit. The inverse of the discrepancy becomes known as the inverse of the prior discrepancy or $d_{n-1}^{-1}$ during the next error location iteration, and is used for updating the coefficient values in the intermediate registers. The discrepancy determination circuit does not use a ROM-stored lookup table, but instead serially receives the discrepancy in a second basis representation (e.g., dual or $\beta$ basis representation) and produces the inverse thereof in a first basis representation ($\alpha$ basis representation).

Assuming its codewords to comprise m-bit symbols, the decoder of U.S. Pat. No. 5,446,743 thus takes m clock cycles to accomplish each phase of an iteration. Therefore, when m=8, sixteen clock cycles per iteration are required to determine the coefficients of the error location polynomial and another sixteen clock cycles are required to determine the coefficients of the error evaluator polynomial. Moreover, as noted above, such decoder requires four sets of registers per slice.

What is needed, and an object of the present invention, is an error correction technique which can perform error correction operations even more expeditiously.

BRIEF SUMMARY OF THE INVENTION

Using a Berlekamp-Massey process operating with unique recursion rules, a fast correction subsystem performs, for each codeword having m-bit symbols, a series of error locator iterations, followed by a series of error evaluator iterations, followed by a series of correction iterations to generate, and then use, an error pattern for correcting a codeword. The fast correction subsystem includes three sets of registers and three sets of multipliers distributed over v+1 component slices where v is the maximum number of symbol errors that can be corrected. In accordance with the recursion rules, a first set of registers ("$\sigma$ registers") ultimately contains quantities including coefficients of an error locator polynomial $\sigma(x)$ for the codeword. A second set of registers ("$\tau$ registers") are utilized, e.g., to update the $\sigma$ registers. A third set of registers ("R registers") ultimately contains quantities including coefficients of an error evaluator polynomial $\omega(x)$ for the codeword.

For each codeword, each error location iteration is performed in two phases. In the first phase [Phase A], the fast correction subsystem generates a quantity including a current discrepancy $d_n$ in an accumulator. Also during Phase A the fast correction subsystem of the present invention updates the contents of the $\tau$ registers according to the following general recursion rule:

$$\tau^{(n)}(x) = x*(\tau^{(n-1)}(x) + (\alpha^d d_{n-1})^{-1}\sigma^{(n)}(x)\text{CHANGE\_L})$$

for d not equal to zero. For one illustrated example embodiment, the general recursion rule for Phase A takes the following form:

$$\tau^{(n)}(x) = x*\left(\tau^{(n-1)}(x) + \alpha^{-3}\left(\left(\alpha^{-4}(\alpha^{-3}d_{n-1})\right)^{-1}\text{CHANGE\_L}\right)\sigma^{(n)}(x)\right)$$

$$= x*\left(\tau^{(n-1)}(x) + (\alpha^{-4}d_{n-1})^{-1}\sigma^{(n)}(x)\text{CHANGE\_L}\ (d = -4)\right)$$

In the second phase [Phase B] of an error locator iteration, the fast correction subsystem obtains a quantity including the inverse of the current discrepancy. The quantity including the inverse of the current discrepancy is used in Phase A of a next iteration as a quantity including the inverse of the prior discrepancy. Also, in Phase B of an error locator iteration, the fast correction subsystem updates the contents of the σ registers according the following general recursion rule:

$$\sigma^{(n+1)}(x) = \alpha^d(\sigma^{(n)} - d_n \tau^{(n)}) = \alpha^d \sigma^{(n)}(x) - \alpha^d d_n \tau^{(n)}(x)$$

for d not equal to zero (d being the same as for the τ recursion rule). For the illustrated example embodiment, the general recursion rule for Phase B takes the following form:

$$\sigma^{(n+1)}(x) = (\alpha^{-4}\sigma^{(n)}(x)) - (\alpha^{-3}d_n)(\tau^{(n)}(x))\alpha^{-1}$$
$$= (\alpha^{-4}\sigma^{(n)}(x)) - (\alpha^{-3}((\alpha^{-3}d_n)\alpha^2)(\tau^{(n)}(x)))$$
$$= \alpha^{-4}\sigma^{(n)}(x) - \alpha^{-4}d_n\tau^{(n)}(x) \text{ (i.e., } d = -4)$$

The t number of error locator iterations for a codeword are followed by t number error evaluator iterations for the codeword. Each error evaluator iteration also has both a Phase A and a Phase B. In the illustrated example, the error evaluator iterations for a codeword serve, e.g., to put $\alpha^{-7}\omega_k(x)$ in the R registers and to put $\alpha^{-3}\sigma(x)$ in the σ registers. In this regard, during Phase A of an error evaluator iteration, the fast correction subsystem multiplies the contents of a σ register of a last slice $(\alpha^{-4k}\sigma_{20-k})$ by a constant $\alpha^{-4k-3}$ to yield $\alpha^{-3}\sigma_{20-k}$, and generates $\alpha^{-4k-3}\omega_{19-k}$ in an accumulator. Then, in Phase B of the error evaluation iteration, the value $\alpha^{-3}\sigma_{20-k}$ is shifted into the σ register of the first slice, with previous values of $\alpha^{-3}\sigma_{20-k}$ from previous iterations being serially shifted into a σ register of an adjacent slice. Also during Phase B of the error evaluator iteration, the quantity $\alpha^{-7}\omega_{19-k}$ is generated and, on the last clock of Phase B, is parallel shifted into the R register of the first slice while R registers of other slices which have received $\alpha^{-7}\omega_{19-k}$ values parallel shift into to an R register of an adjacent slice.

In the correction operation, an error location is detected when the sum of the σ registers is 0. When an error location is detected, an error pattern ERR is formed, the error pattern ERR being the quotient DVD/DVR. DVD is the sum of the R registers and DVR is the sum of odd numbered σ registers. The error pattern ERR is output from error generator to an adder for use in correcting the codeword.

Advantageously, both Phase A and Phase B of both the error locator iterations and the error evaluator iterations each require only m/2 clocks. The expeditious operation of fast correction subsystem is facilitated by, among other things, specialized multiplication operations and feedback values used to implement, e.g., the unique recursion rules. The $\alpha^d$ term in the recursion rules provides flexibility in circuit implementation; e.g., allowing feedback multiplication for the σ registers rather than syndrome registers (R). In the illustrated embodiment, in the $\alpha^d$ term d preferably has the value of −4.

Several specialized multipliers are employed by the present invention. A first multiplier is used in Phase A of the error locator iteration to generate, in each slice, a contribution to the current discrepancy quantity (the current discrepancy quantity being, in an illustrated embodiment, $\alpha^{-3}d_n$). The first multiplier of a slice comprises two inner product circuits, each of which receive a syndrome value from the R register of the slice as a first input and an eight bit value in the σ registers of the slice as a second input. On each of m/2 clocks of Phase A the σ register is clocked with $\alpha^{-1}$ feedback. The contents of the σ register is output as a second input to a first of the two inner product circuits; an $\alpha^4$ multiple of the contents of the σ register is output as a second input to a second of the two inner product circuits. On each clock of Phase A of an error locator iteration both inner product circuits of the first multiplier output a bit of the contribution to the current discrepancy quantity $\alpha^{-3}d_n$, the highest order bit being output on the first clock, the second highest order bit being output on the second clock, and so forth. The first inner product circuit of the first multiplier thus outputs four bits of the lower order nibble of the contribution to the current discrepancy quantity $\alpha^{-3}d_n$ (highest order bit leading in the first clock); the second inner product circuit of the first multiplier thus outputs four bits of the higher order nibble of the contribution to the current discrepancy quantity $\alpha^{-3}d_n$ (highest order bit leading in the first clock).

The first multiplier is also employed, during Phase B of an error evaluator iteration, to generate, in each slice, a contribution to a quantity $\alpha^{-4-3}\omega_{19-k}$ in the accumulator. In this operation, the first multiplier multiplies the contents of the σ registers (clocked with an $\alpha^{-1}$ feedback multiplier) by the syndromes in accordance with the error evaluator polynomial.

A second multiplier is employed, e.g., during Phase B of an error locator iteration, to update the σ registers according to the unique recursion rule. The second multiplier also comprises two inner product circuits. Both of the inner product circuits of the second multiplier of a slice have contents of the τ register of that slice as a first input. A second input to the first inner product circuit of the second multiplier is an accumulator value; a second input to the second inner product circuit of the second multiplier is an $\alpha^4$ multiple of the accumulator value.

A third multiplier is employed, during Phase A of an error locator iteration, to update the τ registers according to the unique recursion rule. The third multiplier comprises two sets of eight AND gates (each set being represented by only one AND gate symbol in FIG. 3A). In a first set of eight AND gates comprising the third multiplier of a slice, each AND gates of the set receives a respective one of the eight bit contents of the σ register of the slice (in parallel) as its first input and, as its second input, four lower order bits (in serial, highest order bit leading) of the quantity including the inverse of the prior discrepancy. In a second set of eight AND gates, each AND gates of the set receives an $\alpha^4$ multiple of a respective one of the eight bit contents of the σ register of the slice (in parallel) as its first input and, as its second input, four higher order bits (in serial, highest order bit leading) of the quantity including the inverse of the prior discrepancy. With each clock of Phase A, the third multiplier thus receives two bits of the quantity including the inverse of the prior discrepancy, i.e., both a higher order nibble bit and a lower order nibble bit. The bits of the two nibbles comprising the quantity including the inverse of the prior discrepancy are applied in alpha basis representation, the most significant bit of each nibble leading on the first clock. During the second and subsequent clocks of the four clocks of Phase A of the error locator iteration, the contents of the σ registers are multiplied by an $\alpha^{-1}$ feedback multiplier. Thus, the σ registers contain $\sigma(x)\alpha^{-4}$.

The fast error correction subsystem of the present invention also includes an inverse generator. The inverse generator serves several functions, including the function of generating a quantity including an inverse of the current discrepancy during Phase B of an error locator iteration (i.e., $\alpha^7 d_{n-1}^{-1}$), which becomes the quantity including an inverse of the prior discrepancy $[\alpha^7 d_{n-1}^{-1}]$ during Phase A of the next error locator iteration). In so doing, the quantity including the current discrepancy is applied from the accumulator where it is generated to both of two inversion look up tables. Prior to being applied to a first of the inversion look up tables, the quantity including the current discrepancy is multiplied by $\alpha^{-4}$. Prior to being applied to a second of the inversion look up tables, the quantity including the current discrepancy is multiplied by $\alpha^{-8}$. Each inverse look up table serially outputs, in four successive clocks of Phase B, four bits of the quantity including the inverse of the prior discrepancy, i.e., $(\alpha^7 d_{n-1}^{-1})$. In the four successive clocks of Phase B, the first inversion look up table outputs the lower order nibble of the quantity including the inverse of the prior discrepancy, in β representation, least significant bit leading. Similarly, in the four successive clocks of Phase B, the first inversion look up table outputs the higher order nibble of the quantity including the inverse of the prior discrepancy, in β representation, least significant bit leading.

The inverse generator performs both a basis representation transformation and a bit order transformation for the quantity including the inverse of the prior discrepancy.

In this regard, the inverse generator serially outputs the quantity including the inverse of the prior discrepancy, i.e., $(\alpha^7 d_{n-1}^{-1})$, in α basis representation, two bits at a time in each of four clocks of Phase B, with most significant bits of each nibble leading in the first clock. The basis representation transformation and a bit order transformation for the quantity including the inverse of the prior discrepancy are accomplished by performing the following (over the four clocks of Phase B of the error locator iteration): (1) applying the output of the first inverse look up table to a first serial shift register; (2) summing the bits of the first two entered bit positions of the first serial shift register; (3) summing the output of (a) the first inverse look up table; the (b) second inverse look up table; and (c) the sum of (2). Thus, the output of the inverse generator becomes, during Phase A of the next error locator iteration, the quantity including the inverse of the prior discrepancy in a form usable by the third multiplier (α basis representation, two bits at a time in each of four clocks of Phase B, with most significant bits of each nibble leading in the first clock), e.g., for updating the τ registers.

In the illustrated example embodiment, the quantity $\alpha^{4k-3}\omega_{19-k}$ in the accumulator generated during Phase A of the error evaluator iteration must be multiplied by $\alpha^{4k-4}$ prior to being shifted into the R registers for use as error evaluator coefficients. The $\alpha_{4k-4}$ multiplication is accomplished using a fourth multiplier which performs an inner product of (1) an $\alpha^{-1}$ multiple of the contents of the accumulator, and (2) the constant $\alpha^{4k}$. The actual result is a times the product of the operands, i.e., $\alpha^{-4f-3}\omega_{19-k}\cdot\alpha^{-1}\cdot\alpha^{4k}\cdot\alpha^{-3}=\alpha^{-7}\omega_{19-k}$. The output of the fourth multiplier is two streams of serial bits, i.e., a most significant nibble bit stream and a least significant nibble bit stream, both bit streams being four bits in length, in β basis representation, and with most significant bit is leading. The output of the higher order nibble of the fourth multiplier is applied to the first serial shift register of the inverse generator; the output of the lower order nibble of the fourth multiplier is applied to the second serial shift register of the inverse generator. The contents of the two serial shift registers of the inverse generator are loaded in parallel into the R register of the first slice as the quantity $\alpha^{-7}\omega_{19-k}$ on the last clock of Phase B of the error evaluator iteration, and are in β basis representation. Simultaneously, any R register of other slices which have received $\alpha^{-7}\omega_{19-k}$ quantities are shifted into the R registers of the next slice.

In the correction operation, the error pattern ERR is generated by multiplication of an inverse of a divisor DVR by a dividend DVD. The dividend DVD is obtained from a sum of terms which include coefficients of an error evaluator polynomial; the divisor DVR is a sum of selected (e.g., odd numbered) terms including coefficients of the error locator polynomial σ. The error pattern ERR can then be used to correct the codeword.

The fourth multiplier and the inverse generator are also employed during the correction operation. In the correction operation, the sum of all the odd number σ registers resides in the accumulator (all eight bits) and represents a divisor DVR to be used in the correction procedure. The DVR value in the accumulator is applied to each of the inverse look up tables of the inverse generator for each of four clocks. At each of the four clocks the inverse look up tables both output a bit of the inverse of DVR (in β basis representation). In like manner with outputting the quantity including the inverse of the prior discrepancy, the inverse generator performs a basis transformation and bit order transformation for the inverse of DVR, outputting the inverse of DVR in two serial streams in four socks in α basis representation with most significant bit leading for each of the two nibble streams. The bit-outputted inverse of DVR is multiplied by the dividend DVD (the sum of the R registers) to generate the error pattern ERR. Thus, the inverse generator serves both to form the quantity including the inverse of the prior discrepancy during Phase B of the error locator iteration, as well as to determine an inverse of the DVR for correction, and in both instances provides a basis transformation and a bit order transformation for serial streams outputted therefrom.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 19 is a schematic diagram showing an IP adder circuit according to an embodiment of the invention.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well known devices, circuits, and methods are omitted so as not to obscure the description of the present invention with unnecessary detail. Similarly, while the example illustrated implementation employs the finite field generator polynomial is $x^8+x^4+x^3+x^2+1$, other field generators can also be used.

STRUCTURE: ERROR CORRECTION SYSTEM OVERVIEW

Figure 1:
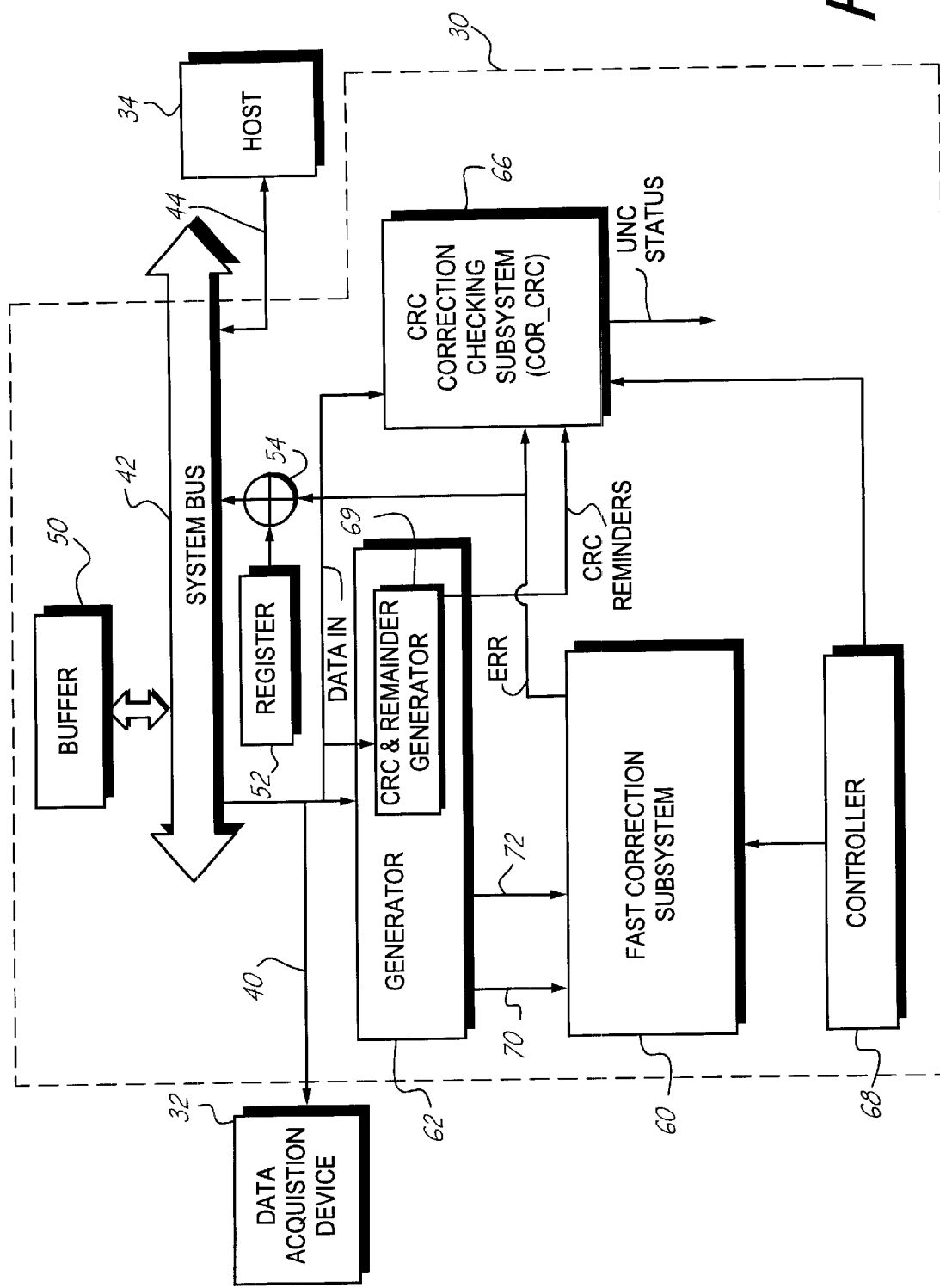
FIG. 1 is a schematic view showing generally a block diagram of an error correction system according to an embodiment of the invention.

FIG. 1 shows an example error correction system 30 of the present invention which obtains codewords of data from a data acquisition device 32. The data acquisition device 32 can be, for example, an optical or magnetic disk drive which transduces information relative to a rotating storage medium. Described below is a specific implementation of error correction system 30 which functions according to specific recursion rules for decoding the codewords obtained from data acquisition device 32 and for performing any necessary error correction with respect to data that is transmitted from error correction system 30 to a host device 34. The specific recursion rules and corresponding structure for implementation are discussed subsequently, followed by a description of operation of the example embodiment, as well as a description of the relation of the specific recursion rules to general recursion rules for which the FIG. 1 system is but an example implementation. It should therefore be understood at the outset that error correction system 30 of FIG. 1 is but one specific example of an implementation using the general recursion rules of the present invention.

The error correction system 30 includes a bus subsystem comprising input data bus 40, system bus 42, and host-connected output bus 44. The system bus 42 is connected to a buffer 50, as well as to an input terminal of register 52 and to an output terminal of adder 54. In addition, system bus 42 is connected intermediately to both input data bus 40 and host-connected output bus 44.

The error correction system 30 also comprises fast correction subsystem 60; generator 62 (which produces syndromes, erasure location values, and CRC remainder values); CRC correction checking subsystem 66; and correction controller 68. The generator 62 includes a CRC and remainder generator 69 which is shown in more detail in FIG. 7.

In a read operation, data in the form of codewords acquired by data acquisition device 32 is applied to generator 62. Each codeword typically comprises user data bytes, followed by CRC bytes, followed by ECC bytes. As the user data bytes of the codeword are received on line DATA_IN, the generator 62 computes CRC bytes. The CRC bytes computed by generator 62 over the user data bytes is compared with the CRC bytes included in the codeword to generate CRC remainders. The CRC remainders are applied on line CRC REMAINDER to CRC correction checking subsystem 66. In a manner understood by those skilled in the art, generator 62 also generates erasure location values (erasure pointers) and syndromes which are applied to fast correction subsystem 60 on lines 72 and 70, respectively.

In similar manner as described in U.S. Pat. Nos. 5,446,743 and 5,602,857, buffer 50 has stored therein a plurality of data blocks, each data block comprising a plurality of m-bit symbols. Three general operations can be executed in asynchronous manner, namely uncorrected data blocks from data acquisition device 32 fill buffer 50; uncorrected data blocks within buffer 50 are corrected by error correction system 30; and already-corrected data blocks within buffer 50 are emptied to host device 34 via host-connected output bus 44. These three general operations may be executed simultaneously on different sectors in an asynchronously overlapped manner. However, since the invention described herein concerns the decoding of a codeword, it should not be construed to be limited to any particular buffering scheme or data flow outside of fast correction subsystem 60.

In connection with the decoding of a codeword, fast correction subsystem 60 receives t number of m-bit syndromes from generator 62 on line 70 and m-bit erasure location values from generator 62 on line 72. The fast correction subsystem 60 is sequenced, timed, and controlled by signals applied thereto by correction controller 68. For example, for each codeword the correction controller 68 supervises the timing of both error locator iterations and error evaluator iterations (including Phase A and Phase B operations for both), as well as for a correction operation. In supervising the timing, the correction controller 68 applies clock signals and controls various gates and selectors so that fast correction subsystem 60 performs in the manner hereinafter described. Control lines from correction controller 68 are not always shown in the drawings nor are specific control signals necessarily discussed hereinafter, it being understood that the sequence of operations described herein are dictated by such signals output by correction controller 68.

After a series of error location iterations, fast correction subsystem 60 obtains values for the t+1 number of m-bit coefficients of the error locator polynomial σ(x). Upon completion of the series of error locator iterations for a codeword, fast correction subsystem 60 executes a series of error evaluator iterations to generate coefficients of an error evaluator polynomial ω(x) for the codeword. An error pattern ERR is generated by division operation wherein an inverse of a divisor DVR is multiplied by a dividend DVD. The dividend DVD is obtained from a sum of terms which include coefficients of an error evaluator polynomial; the divisor DVR is a sum of selected (e.g., odd numbered) terms including coefficients of the error locator polynomial σ(x). The error pattern ERR can then be used to correct the codeword.

As described below, the error correction system 30 of the present invention, and particularly fast correction subsystem 60, is improved over U.S. Pat. No. 5,446,743 in various respects, including utilization of different recursion rules and iteration speed. Whereas in U.S. Pat. No. 5,446,743 2mt clock cycles are required to determine the coefficients of the error location polynomial, advantageously the error correction system 30 of the present invention requires only mt clock cycles. Moreover, whereas in U.S. Pat. No. 5,446,743 four registers are required per slice, there are only three registers per slice for the error correction system 30 of the present invention.

STRUCTURE: FAST CORRECTION SUBSYSTEM

Figure 2:
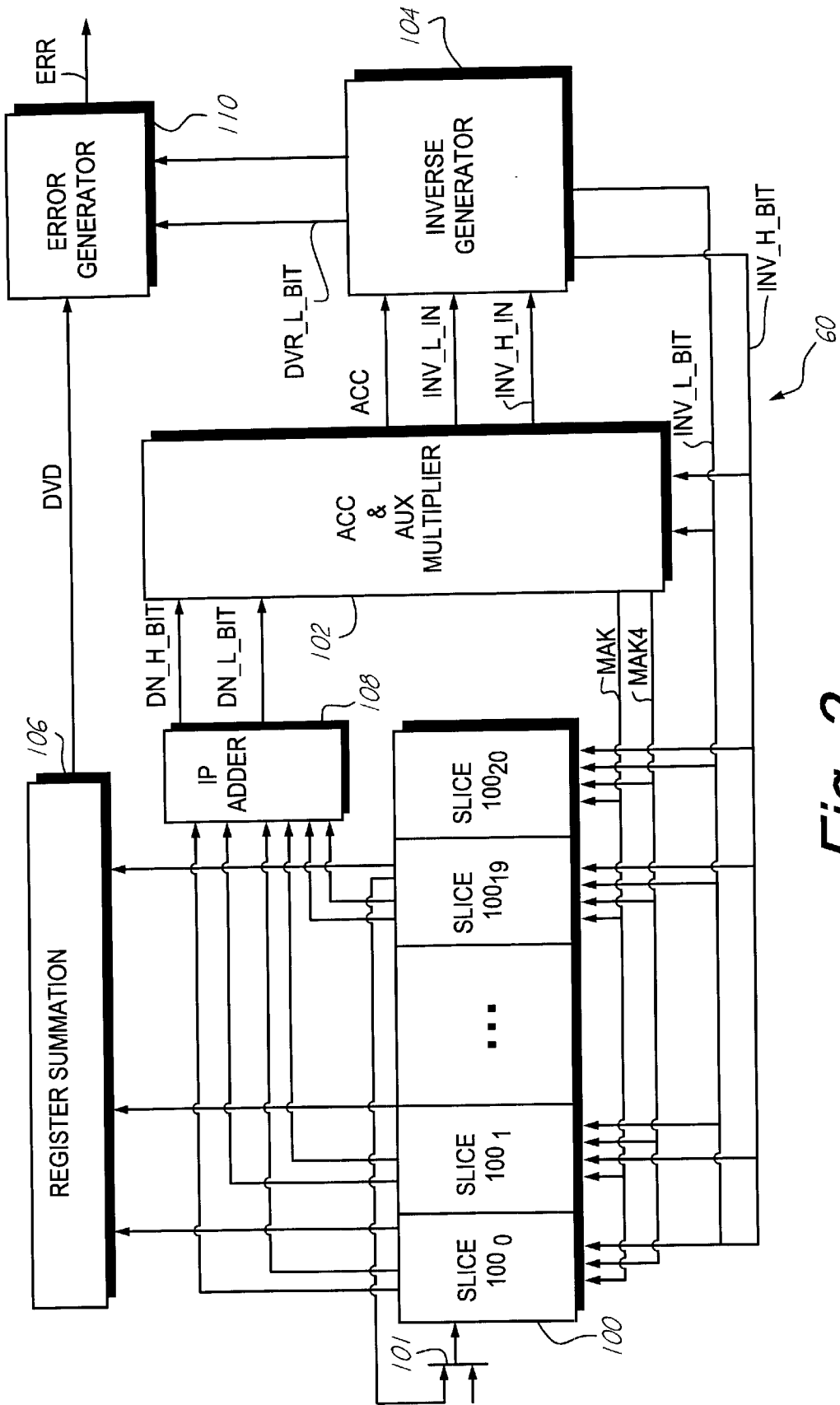
FIG. 2 is a schematic view showing a block diagram of a fast decoder of the error correction system of FIG. 1.

As shown in FIG. 2, fast correction subsystem 60 comprises twenty-one slices $100_0$–$100_{20}$; a first slice R register input MUX 101; an accumulator & auxiliary multiplier 102; an inverse generator 104; a register summation circuit 106 (see FIG. 18); and an IP adder circuit 108 (see FIG. 19). Nineteen of the slices, i.e., intermediate positioned slices $100_1$–$100_{19}$, have essentially identical structure, with a representative one of the slices $100_1$–$100_{19}$ being illustrated in FIG. 3A. A first one of the slices, i.e., first slice $100_0$, has the structure shown in FIG. 3B. A last one of the slices, i.e., last slice $100_{20}$, has the structure shown in FIG. 3C.

Figure 3A:
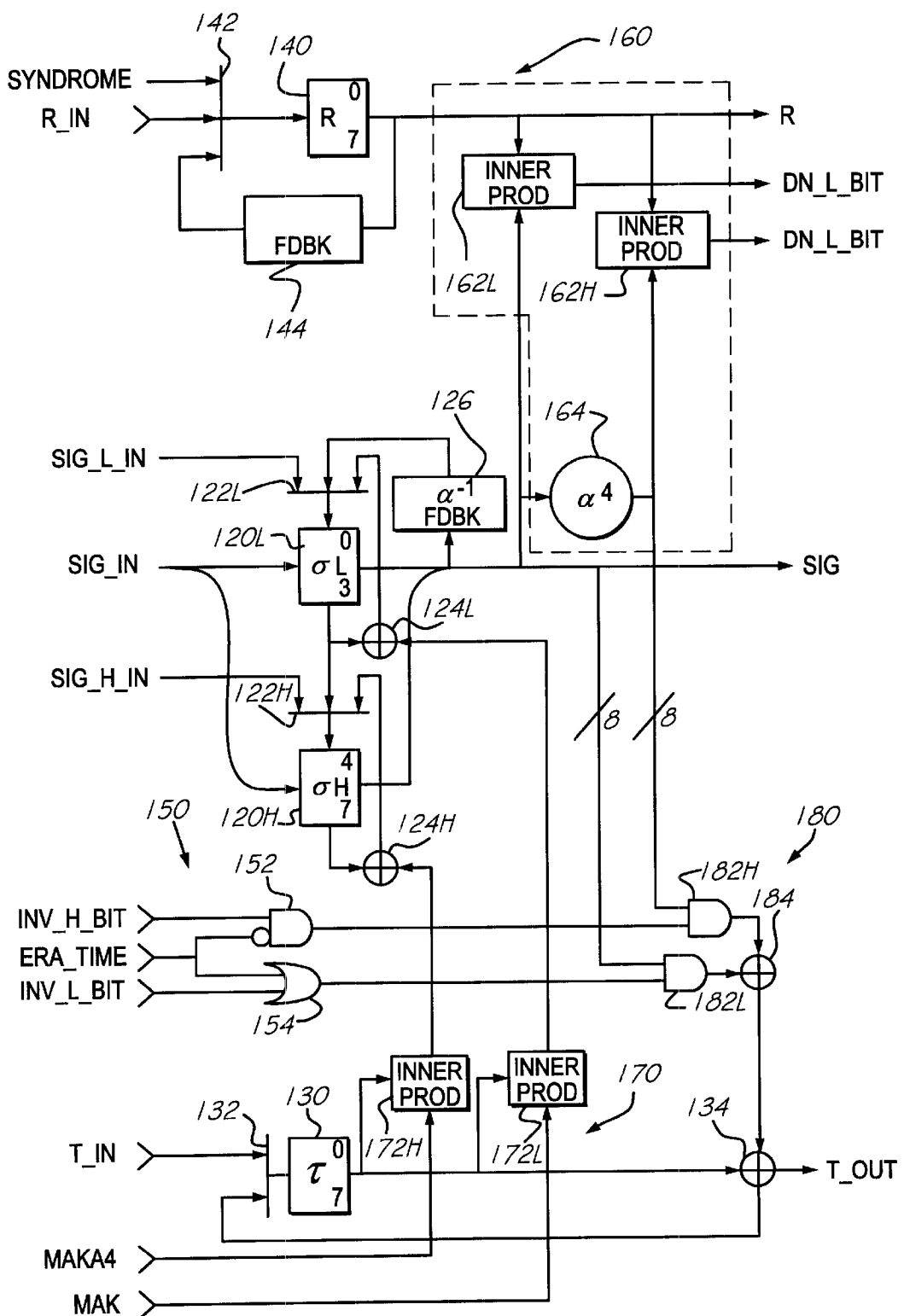
FIG. 3A is a schematic view of an intermediate slice included in the fast decoder of FIG. 2.

The structure of fast correction subsystem 60 is generally understood with respect to a representative slice 100, illustrated in FIG. 3A. Except as otherwise noted herein with respect to slice $100_{20}$, the representative slice 100 depicts the structure and operation of each of the slices $100_0$–$100_{19}$.

In addition to elements such as accumulator & auxiliary multiplier 102 and inverse generator 104, fast correction subsystem 60 includes three sets of registers and three different multipliers. These three sets of registers and three different multipliers are distributed throughout various ones of the slices 100. Since FIG. 3A shows only one of the representative or intermediate slices $100_1$–$100_{19}$ comprising fast correction subsystem 60, only a slice portion of each of the three sets of registers and a slice portion of each of the three different multipliers are shown in FIG. 3A. But since the structure of each of the intermediate slices $100_1$–$100_{19}$ resembles that of FIG. 3A, the overall structure of the three sets of registers and three different multipliers can easily be understood.

A first set of registers of fast correction subsystem 60 is used, e.g., to accumulate coefficients of an error locator polynomial. As such, the registers of the first set are is also known as σ or SIG registers. The first set of registers (σ registers 120) has two four bit registers per slice, such as registers 120L and 120H in FIG. 3A. The pair of registers 120L and 120H comprising a slice are collectively referenced herein as register pair 120P of the first set 120 of registers (the σ registers). As explained subsequently, the σ register 120H contains a high order nibble and the σ register 120L contains a low order nibble. Each register 120L and 120H has a corresponding input selector 122L, 122H.

For the intermediate slices $100_1$–$100_{19}$ and last slice $100_{20}$, an output terminal of σ register 120L is connected both to a first input of adder 124L and to a second input of input selector 122H; an output terminal of σ register 120H is connected to a first input of adder 124H. An output terminal of adder 124L is connected to a first input of input selector 122L; an output terminal of adder 124H is connected to a first input of input selector 122H.

For each slice 100 an input value can be shifted (from the left as shown in FIG. 3A) into σ registers 120L and 120H SIG_H_IN being shifted into σ register 120H and SIG_L_IN being shifted into σ register 120L. The contents of the σ registers 120L and 120H can be shifted out (toward the right as shown in FIG. 3A) on bus SIG, particularly on the high order bit of 120L and 120H (bits 3 and 7, respectively). In other words, for slice $100_i$ an input value can be shifted in on signals SIG_H_IN and SIG_L_IN from slice $100_{i-1}$, and the contents of σ registers 120L and 120H of slice $100_i$ can be shifted rightward to comparable σ registers 120L and 120H of slice $100_{i+1}$. The contents of σ register $120_{20}$ of slice $100_{20}$ can be multiplied by the constant in register 210, as hereinafter discussed.

Thus, values can be serially shifted into the σ registers 120 on lines SIG_L_IN and SIG_H_IN via input selectors 122L, 122H, respectively. In this regard, particularly in Phase B of the error evaluator iteration described subsequently, in four clocks four bits can be serially shifted into each of σ registers 120L and 120H. In particular, a higher order nibble can be shifted on bus SIG_H_IN into register 120H; a lower order nibble can be shifted on bus SIG_L_IN into register 120L. In four clocks the values in σ registers 120L and 120H can also be shifted to the next slice. In this regard, bits 7 and 3 of the bus SIG carry the serial transmission of the contents of σ registers 120H and 120L, respectively, in four clocks to the next slice.

The bus SIG is an eight bit bus, the higher order bit lines of which carry the contents of register 120H and the lower order bit lines of which carry the contents of register 120L. The bus SIG carries the contents of the registers 120L and 120H to an $\alpha^{-1}$ feedback multiplier 126; to two multipliers discussed subsequently (in all slices except last slice $100_{20}$), and to the pair of σ registers in the next slice 100 to the right. In view of the bus SIG being connected to an input of an $\alpha^{-1}$ feedback multiplier 126, the output of the feedback multiplier 126 is applied to a second input of input selector 122L.

The output on bus SIG is applied via multiplier 127 to the σ registers 120L and 120H during the Chien search operation. The multiplier factor for multiplier 127 is $\alpha^{-k}$.

The second set of registers comprises a τ register in each slice 100. FIG. 3A shows the τ register of one slice as register 130. Unlike registers 120L and 120H (which are four bit registers), each register of register second set is a single eight bit register. In the intermediate slices $100_1$–$100_{19}$ an input of register 130 is connected to input selector 132; an output of register 130 is connected to a first input of adder 134. A first input of input selector 132 is connected to a line T_IN which brings the contents of a comparable τ register from the adjacent slice 100 to the left; a second input of input selector 132 is connected to a first output of adder 134.

The third set of registers comprises a single eight bit R register 140 for each slice 100. All slices except last slice $100_{20}$ have an R register 140. One such R register 140 for an intermediate slice is illustrated in FIG. 3A as an eight bit register having an input connected to an output of input selector 142. A first input of input selector 142 is connected to line R_IN. A second input of input selector 142 is connected to line 70 to receive a syndrome from generator 62 at the beginning of an error locator iteration. A third input to input selector 142 is connected to feedback multiplier 144. The output of register 140 is applied on line R. Line R is connected, e.g., to an input of feedback multiplier 144. The feedback multiplier 144, utilized during a Chien search, has a feedback multiplier factor of $\alpha^{-(L+k)}$. The line R_IN carries a value to register 140 from a corresponding R register in the next slice 100 to the left; the line R carries the value in register 140 to a corresponding R value in the next slice 100 to the right, and also to a discrepancy-producing multiplier described below.

Each of the first slice $100_0$ and intermediate slices $100_1$–$100_{19}$ also has a gate section 150. The gate section 150 comprises an AND gate 152 and an OR gate 154. The AND gate 152 has a first input connected to line INV_H_BIT which carries an output from inverse generator 104. A second input of AND gate 152 is an inverting input and is connected to a control line ERA_TIME. A first input (non-inverting) of OR gate 154 is also connected to control line ERA_TIME; a second input to OR gate 154 is connected to line INV_L_BIT which carries an output from inverse generator 104.

As stated above, each intermediate slice 100 also has three different multipliers. A first of these multipliers, multiplier 160, is used during the error locator iteration to produce a current discrepancy. As shown in FIG. 3A and hereinafter described in more detail with reference to FIG. 14B, in each slice 100 the multiplier 160 includes two inner product circuits 162L and 162H, and an $\alpha^4$ multiplier 164. A first input of each of the inner product circuits 162L and 162H is connected to line R to receive all eight bits of R register 140. A second input of inner product circuit 162L is connected to bus SIG to receive the eight bits carried on bus SIG. A second input of inner product circuit 162H is connected to an output of $\alpha^4$ multiplier 164. An input to $\alpha^4$ multiplier 164 is connected to bus SIG to receive the eight bits carried on bus SIG. Thus, the second input of inner product circuit 162H receives the contents of σ registers 120L and 120H as multiplied by $\alpha^4$ multiplier 164.

Thus structured, in Phase A of an error locator iteration, multiplier 160 multiplies syndromes in register 140 by the contents of first coefficient register pairs 120H and 120L. The inner product circuit 162L outputs a serial value on line DN_L_BIT to accumulator & auxiliary multiplier 102; the inner product circuit 162H outputs a serial value on line DN_H_BIT to accumulator & auxiliary multiplier 102. As explained hereinafter, accumulator & auxiliary multiplier 102 includes an accumulator which, being connected to the multiplier 160, accumulates a current discrepancy quantity $d_n$ during Phase A of an error locator iteration.

A second of the multipliers having a portion thereof included in each intermediate slice 100 is multiplier 170. The multiplier 170, as shown in FIG. 3A and in FIG. 15, includes two inner product circuits 172L and 172H. A first input of each of inner product circuits 172L and 172H is connected to receive all eight bits output from τ register 130. A second input of inner product circuit 172L is connected to a line MAK emanating from accumulator & auxiliary multiplier 102; a second input of inner product circuit 172H is connected to a line MAK4 also emanating from accumulator & auxiliary multiplier 102. An output of inner product circuit 172L is connected to a second input of adder 124L; an output of inner product circuit 172H is connected to a second input of adder 124H.

As explained hereinafter, in Phase B of an error locator iteration the multiplier 170 functions as a σ register-updating multiplier 170. In updating the σ registers 120, the multiplier 170 multiplies τ registers 130 (the second set of registers) by the current discrepancy quantity output from accumulator & auxiliary multiplier 102.

A third of the multipliers having a portion thereof included in each intermediate slice 100 is multiplier 180. Multiplier 180, as shown in FIG. 3A and also FIG. 13B, includes two AND gates 182L and 182H, and adder 184. AND gates 182 comprise eight two-input AND gates which share a common second input. A first input to gate 182L is the eight bit value from registers 120L and 120H carried on bus SIG; a first input to gate 182H is the eight bit value from registers 120L and 120H carried on bus SIG multiplied by $\alpha^4$ multiplier 164. A second input to gate 182L is the output of OR gate 154; a second input to gate 182H is the output of AND gate 152. The output of gate 182H and gate 182L are summed at adder 184. The output of adder 184 is applied to an input of adder 134. It will be recalled that the output of adder 134 is applied via input selector 132 to τ register 130 of the same slice and to the τ register 130 of the next slice to the right. During Phase A of an error locator iteration, the multiplier 180 serves as a τ register-updating multiplier 180. In this regard, multiplier 180 updates the τ registers 130 (the second set of registers) by multiplying (for each slice) the quantity including the inverse of the prior discrepancy and the contents of the σ register 120 for the slice (carried on bus SIG). The quantity including the inverse of the prior discrepancy is input to multiplier 180 serially two bits at a time (on lines INV_H_BIT and INV_L_BIT) with highest order bits leading; the contents of the σ register 120 is input in parallel.

Figure 3B:
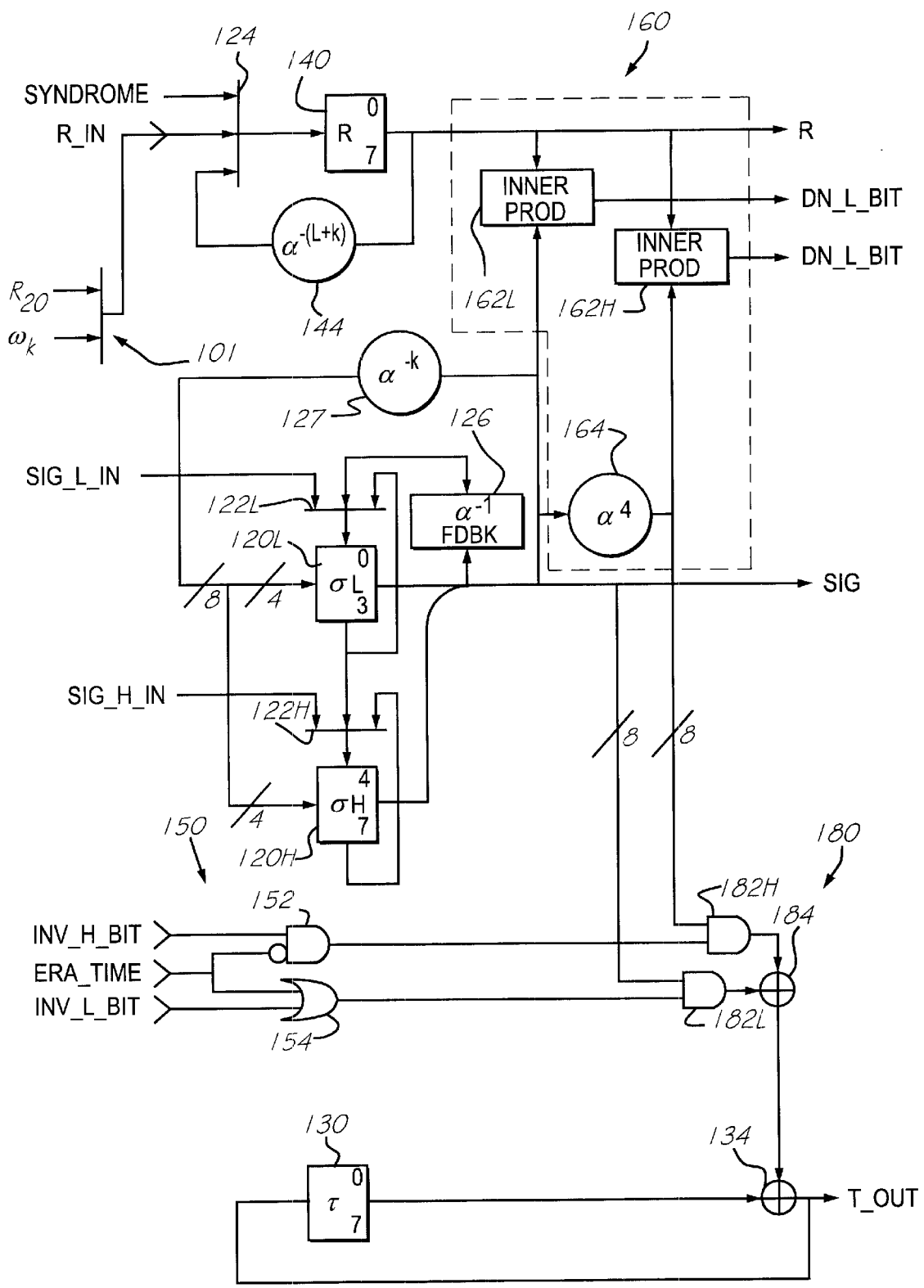
FIG. 3B is a schematic view of a first slice included in the fast decoder of FIG. 2.
Figure 3C:
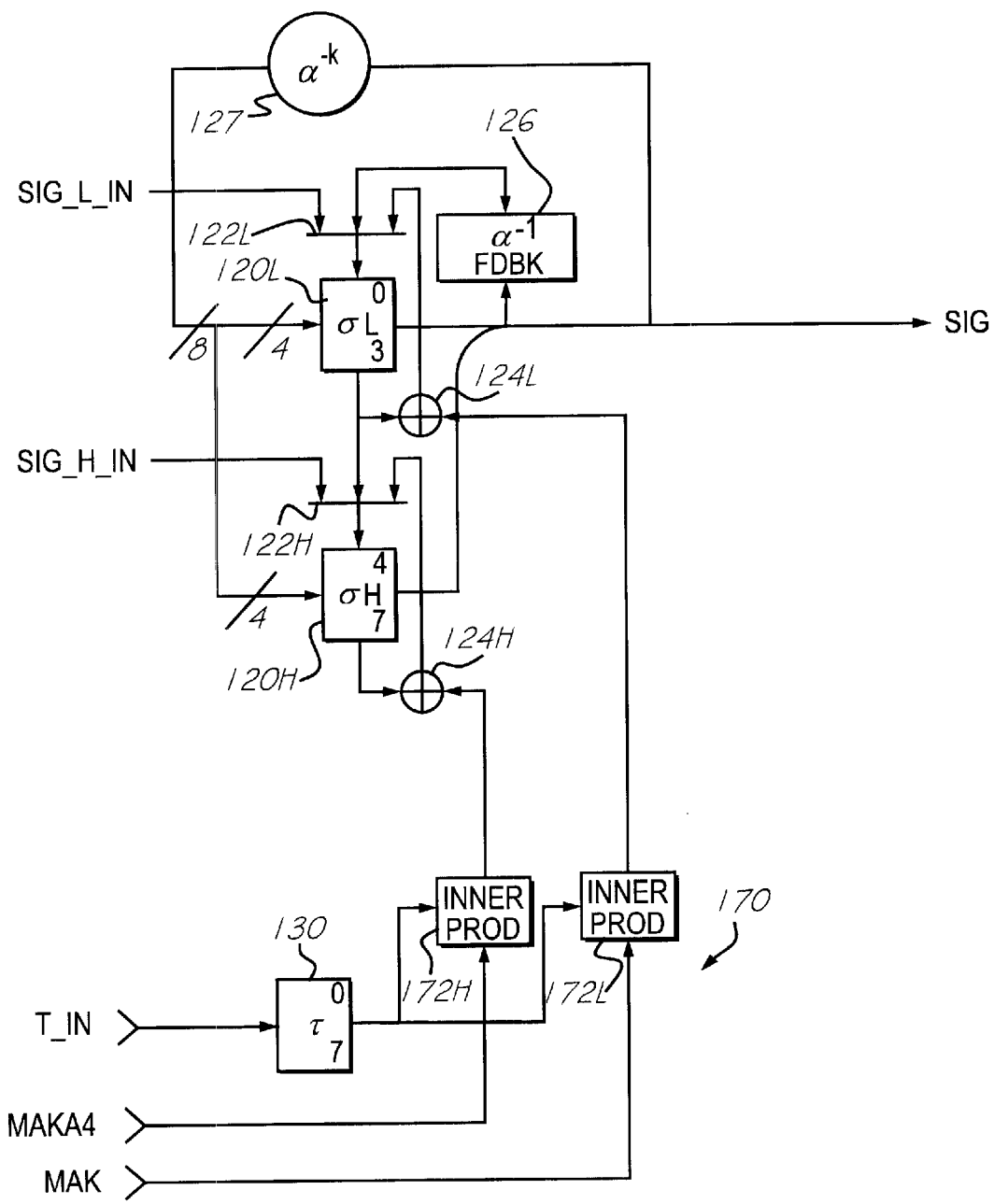
FIG. 3C is a schematic view of a last slice included in the fast decoder of FIG. 2.

For the most part, the preceding discussion has concerned the structure of the intermediate slices $100_1$–$100_{19}$ as illustrated in FIG. 3A. In view of the positions of first slice $100_0$ and last slice $100_{20}$ at the extremities of fast correction subsystem 60, the first slice $100_0$ and last slice $100_{20}$ each have structure which differs from that of the intermediate slices $100_1$–$100_{19}$. In this regard, and as shown in FIG. 3B, first slice $100_0$ has most of the same structure as intermediate slices $100_1$–$100_{19}$, but does not include (1) multiplier 170; (2) input selector 132 for τ registers 130; and (3) adders 124L and 124H. As mentioned previously, the first slice R register input MUX 101 can select either the value from the R register of the slice $100_{19}$ or an $\omega_k$ value to apply to the R register of slice $100_0$. As shown in FIG. 3C, last slice $100_{20}$ has essentially the same structure as intermediate slices $100_1$–$100_{19}$ with the exception of not including (1) R register 140; (2) gate section 150; (3) multiplier 160; and (4) multiplier 180.

The IP adder circuit 108 is shown in more detail in FIG. 19. IP adder circuit 108 comprises two adders, particularly adder 190H and adder 190L. Adder 190L receives, via AND gates $191L_0$–$191L_{19}$, the bit-output products of inner product circuits 162L of multipliers 160 of slices $100_0$–$100_{19}$, respectively. Whether a particular gate 191 associated with one of the multipliers 160 of slices $100_0$–$100_{19}$ is active depends on a respective control signal $G_0$–$G_{19}$. Similarly, adder 190H receives, via AND gates $191H_0$–$19H_{19}$, the bit-output products of inner product circuits 162H of multipliers 160 of slices $100_0$–$100_{19}$, respectively. Whether the bit-output products of inner product circuits 162H are gated through AND gates $191H_0$–$191H_{19}$ depends on the values of the control signals $G_0$–$G_{19}$. Adder 190L forms a value DN_L_BIT which is applied to accumulator and auxiliary multiplier 102 when the discrepancy $d_n$ is being accumulated. Adder 190H forms a value DN_H_BIT which is applied to accumulator and auxiliary multiplier 10 when the discrepancy $d_n$ is being accumulated. The control signals $G_0$–$G_{19}$ are employed to selectively preclude the products of multipliers 160 from being applied to accumulator & auxiliary multiplier at a time when the discrepancy $d_n$ is not being accumulated. For example, control signals $G_0$–$G_{19}$ are employed to selectively govern whether the products are utilized during an error evaluator iteration, since a progressively decreasing number of multipliers 160 are permitted to contribute for ω generation during an error evaluation iteration.

STRUCTURE: ACCUMULATOR & $\alpha^k$ MULTIPLIER

Figure 4:
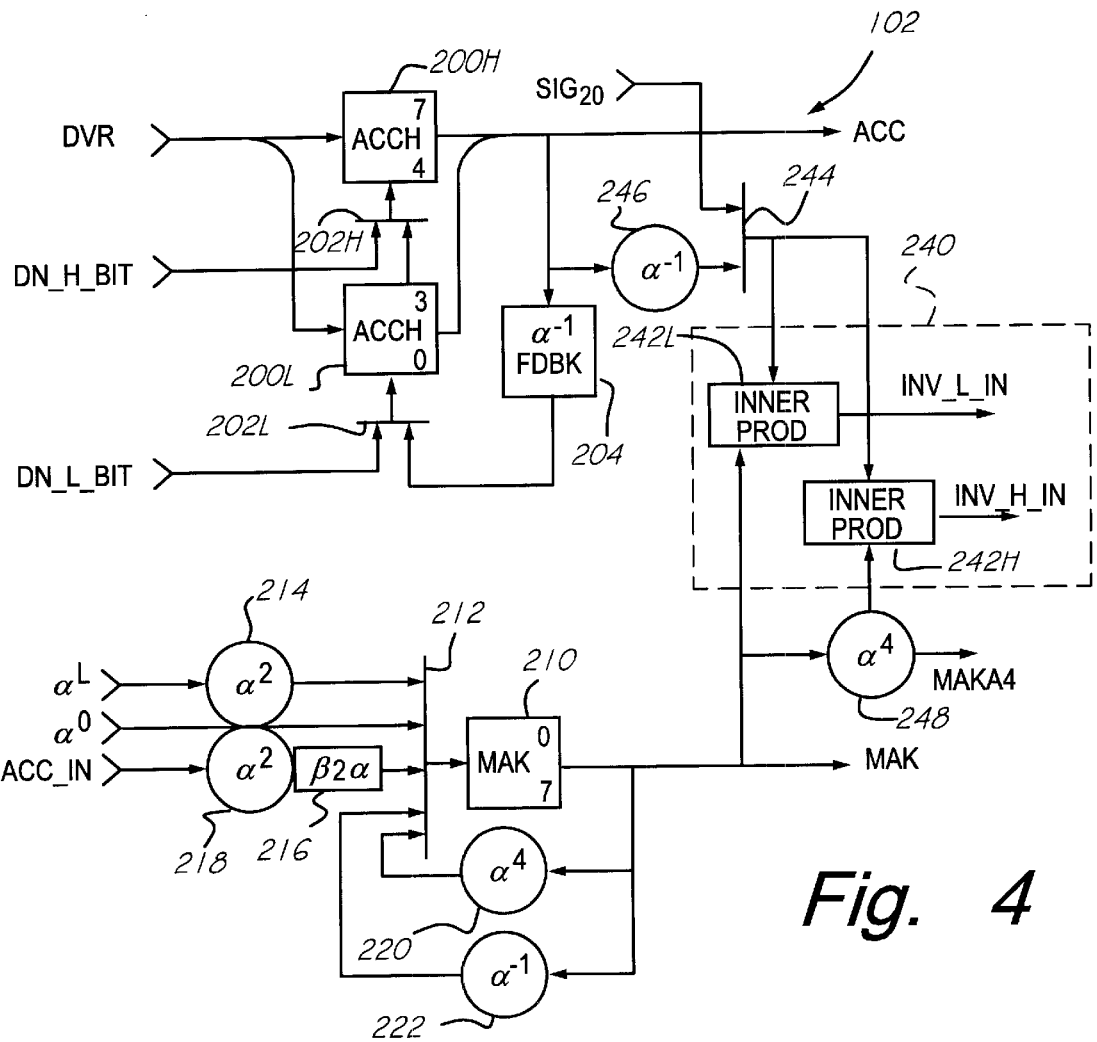
FIG. 4 is a schematic view of an accumulator and $\alpha^{4k}$ multiplier circuit included in the in the fast decoder of FIG. 2.

Details of accumulator & auxiliary multiplier 102 are shown in FIG. 4. The accumulator & auxiliary multiplier 102 includes two accumulation shift registers 200H and 200L. Each of the accumulation shift registers 200H, 200L has a respective input selector 202H, 202L. The outputs of accumulation shift registers 200H, 200L are applied to eight bit line ACC, with the four lower order bits carried on line ACC being from the contents of register 200L and the four higher order bits carried on line ACC being from the contents of register 200H. The line ACC is applied, e.g., to inverse generator 104, for purposes discussed below. The accumulation shift registers 200H and 200L are connected so that the value carried on lines DN_H_BIT and DN_L_BIT respectively, can be input by shifting. A first input to input selector 202L is carried on line DN_L_BIT from adders 190L (see FIG. 2); a first input to input selector 202H is carried on line DN_H_BIT from adders 190H (see FIG. 2).

A feedback $\alpha^{-1}$ multiplier 204 is provided for accumulation shift registers 200H, 200L. Line ACC is connected to an input of feedback $\alpha^{-1}$ multiplier 204. An output of feedback $\alpha^{-1}$ multiplier 204 is connected to a second input of input selector 202L, which feeds accumulation shift register 200L. An output of accumulation shift register 200L is connected to a second input of input selector 202H, which selectively feeds accumulation shift register 200H.

The accumulator & auxiliary multiplier 102 also includes an $\alpha^k$ multiplication or MAK register 210. The output of MAK register 210 is applied on line MAK shown in FIG. 4. The MAK register 210 is fed by an MAK input selector 212. A first input to MAK input selector 212 is connected to an output of $\alpha^2$ multiplier 214. Since $\alpha^2$ multiplier 214 receives a value $\alpha^L$ (for erasure correction) the output of $\alpha^2$ multiplier 214 is $\alpha^{L+2}$. A second input to MAK input selector 212 is a value $\alpha^0$. A third input to MAK input selector 212 is obtained from β-to-α basis conversion circuit 216. The β-to-α basis conversion circuit 216 is connected to received an output from $\alpha^2$ multiplier 218, which in turn has a value ACC_IN applied thereto. A fourth input to MAK input selector 212 is from a feedback $\alpha^4$ multiplier 220. A fifth input to MAK input selector 212 is from a feedback $\alpha^{-1}$ multiplier 222. Both $\alpha^4$ multiplier 220 and feedback $\alpha^{-1}$ multiplier 222 have the contents of MAK register 210 input applied thereto on line MAK.

The value ACC_IN which is applied to a multiplier 218 is the input to each of eight flip flops comprising the accumulation shift registers 200H, 200L. In other words, the value ACC_IN has a value which will be the value of accumulation shift registers 200H, 200L during the next clock cycle.

Figure 5:
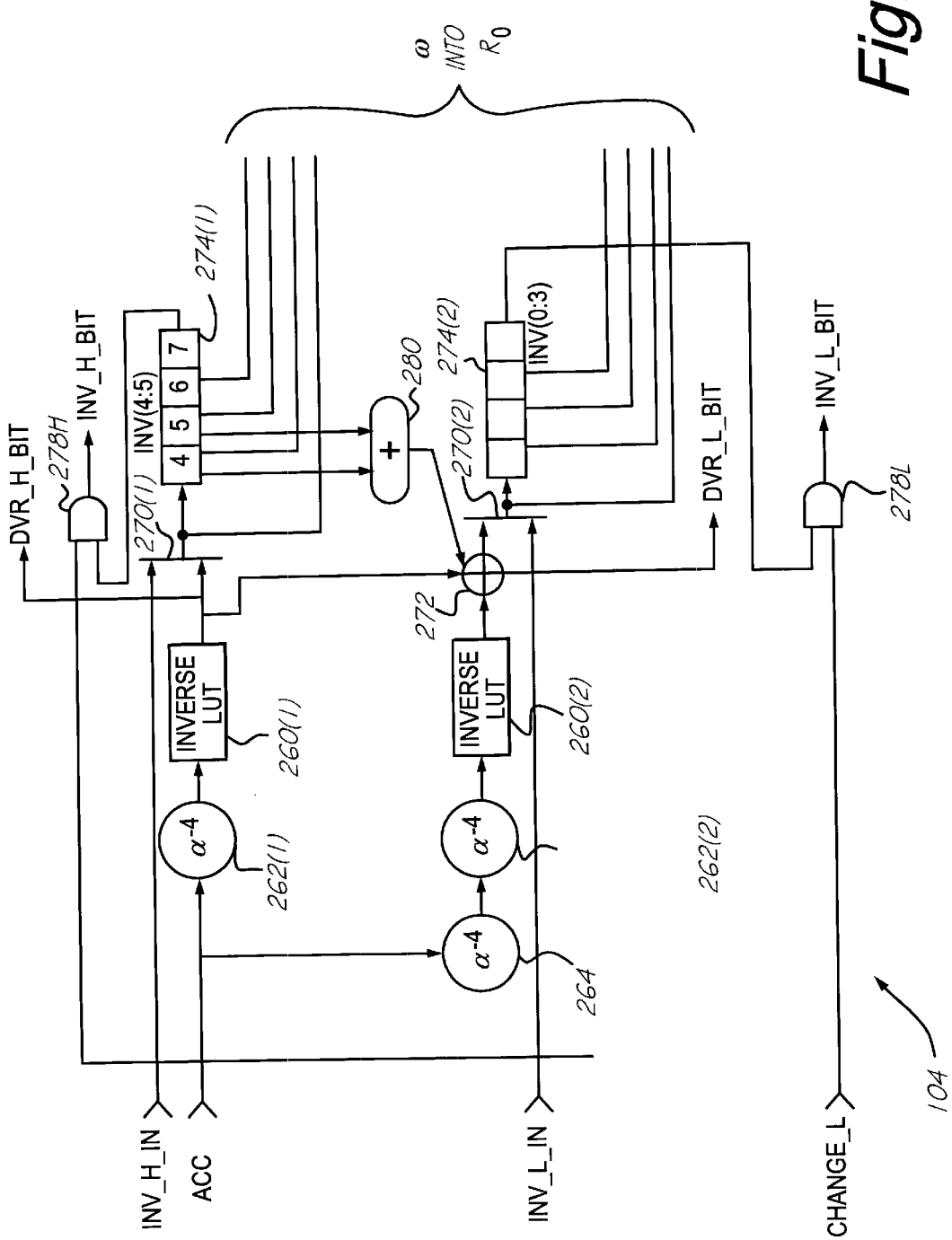
FIG. 5 is a schematic view of an inverse generator included in the fast decoder of FIG. 2.

The accumulator & auxiliary multiplier 102 also comprises a multiplier 240. The multiplier 240 comprises two inner product circuits 242L, 242H. Both inner product circuits 242L, 242H receive a first input from an input selector 244. A first input to input selector 244 is the contents of σ registers $120H_{20}$, $120L_{20}$, indicated as $SIG_{20}$ in FIG. 4. A second input to input selector 244 is obtained from an $\alpha^{-1}$ multiplier 246. The $\alpha^{-1}$ multiplier 246 receives its input on line ACC as the contents of accumulation shift registers 200H, 200L. The inner product circuit 242L receives its second input on line MAK (the contents of MAK register 210). The inner product circuit 242L receives its second input from a multiplier 248, which in turns receives its input on line MAK (the contents of MAK register 210). The outputs of inner product circuits 242L, 242H are shown in FIG. 4 as being applied to lines INV_L_IN and INV_H_IN respectively. As shown in FIG. 1 and FIG. 5, the lines INV_H_IN and INV_L_IN are connected to inverse generator 104 wherein the values applied thereon are temporarily stored in the INV registers 274(1) and 274(2), respectively, via muxes 270(1) and 270(2), respectively. The INV registers 274(1) and 274(2) are used to hold the output of multiplier 240 because multiplier 240 is only used during ω generation and no inversions are needed during that time.

STRUCTURE: INVERSE GENERATOR

The inverse generator 104 (shown in detail in FIG. 5) comprises two inverse look up tables (LUTs), specifically inverse look up table (LUT) 260(1) and inverse look up table (LUT) 260(2). The input to inverse look up table (LUT) 260(1) is connected to an output of $\alpha^{-4}$ multiplier 262(1); the input to inverse look up table (LUT) 260(2) connected to an output of $\alpha^{-4}$ multiplier 262(2), which in turn has its input connected to an output of $\alpha^{-4}$ multiplier 264. Both $\alpha^{-4}$ multiplier 262(1) and $\alpha^4$ multiplier 264 are fed the contents of the accumulation shift registers 200H, 200L on line ACC.

The output of inverse look up table (LUT) 260(1) is four serial bits which are carried on line DVR_H_BIT. The four serial bits output from inverse look up table (LUT) 260(1) on line DVR_H_BIT are applied to error generator 110 (see FIG. 6). In addition, the four serial bits output from inverse look up table (LUT) 260(1) are shifted on four clocks to a first input of an input selector 270(1) and to a first input of an adder 272. A second input of input selector 270(1) is obtained from line INV_H_IN (from multiplier 240 and specifically inner product circuit 242H of FIG. 4). The input selector 270(1) applies its selected value to register 274(1). When the output of inverse look up table (LUT) 260(1) is chosen by input selector 270(1), the four bit output of inverse look up table (LUT) 260(1) [viewed as being in β basis representation from the perspective of the LUT] is serially entered into register 274(1), with the least significant bit leading eventually occupying (after the four clocks of serial shifting) the position depicted as "7" in register is 274(1) [see FIG. 5].

The output from register 274(1) is applied, one bit at a time, to a first input of AND gate 278H. A second input of AND gate 278H receives a control signal on line CHANGE_L. The output of AND gate 278H is applied on line INV_H_BIT to each slice 100, and particularly to a first input of AND gate 152 of each slice for use in updating the contents of the τ registers 130.

The person skilled in the art will appreciate that, on the last clock of Phase B of an error location iteration, if both $d_n \ne 0$ and $L_m > L_n$, then CHANGE_L=1, $L_n = L_m$, and $L_m = L_n + 1$. Otherwise, CHANGE_L=0 and $L_n = L_m + 1$.

Initially, $L_n=0$ and $L_m=1$ (generally, $L_n=\text{ERA\_CNT}$ and $L_M=\text{ERA\_CNT}+1$).

The output of inverse look up table (LUT) 260(2) is four serial bits which are shifted on four clocks to a second input of adder 272. The four bit serial output of adder 272 is carried on line DVR_L_BIT, and is the sum of [1] the serial four bits output from inverse look up table (LUT) 260(1); [2] the serial four bits output from inverse look up table (LUT) 260(2); and [3] the sum of the bits in the positions in register 274(1) depicted by numerals "4" and "5". The sum of bits "4" and "5" from register 274(1) is obtained by summer 280 in FIG. 5. The sum from adder 272, carried on line DVR_H_BIT is applied to error generator 110 (see FIG. 6). In addition, the sum from adder 272 is applied to a first input of an input selector 270(2). A second input of input selector 270(2) is obtained from line INV_L_IN (from multiplier 240 and specifically inner product circuit 242L of FIG. 4). The value selected by input selector 270(2) is applied to register 274(2) with most significant bit position leading in the clocking into register 274(2), so that the most significant bit occupies the rightmost position in register 274(2) as shown in FIG. 5. When the values selected by input selector 270 are from the inverse lookup table (LUT) 260, such values are in alpha basis representation. Otherwise, the values selected by input selector 270 for temporary storage in registers 274 are in beta basis representation.

The output from register 274(2) is output, one bit at a time, to a first input of AND gate 278L. A second input of AND gate 278L receives the control signal on line CHANGE_L. The output of AND gate 278L is applied on line INV_L_BIT to each slice 100, and particularly to OR gate 154 of each slice (for use, e.g., in updating the contents of the τ registers 130).

STRUCTURE: REGISTER SUMMATION CIRCUIT

Figure 18:
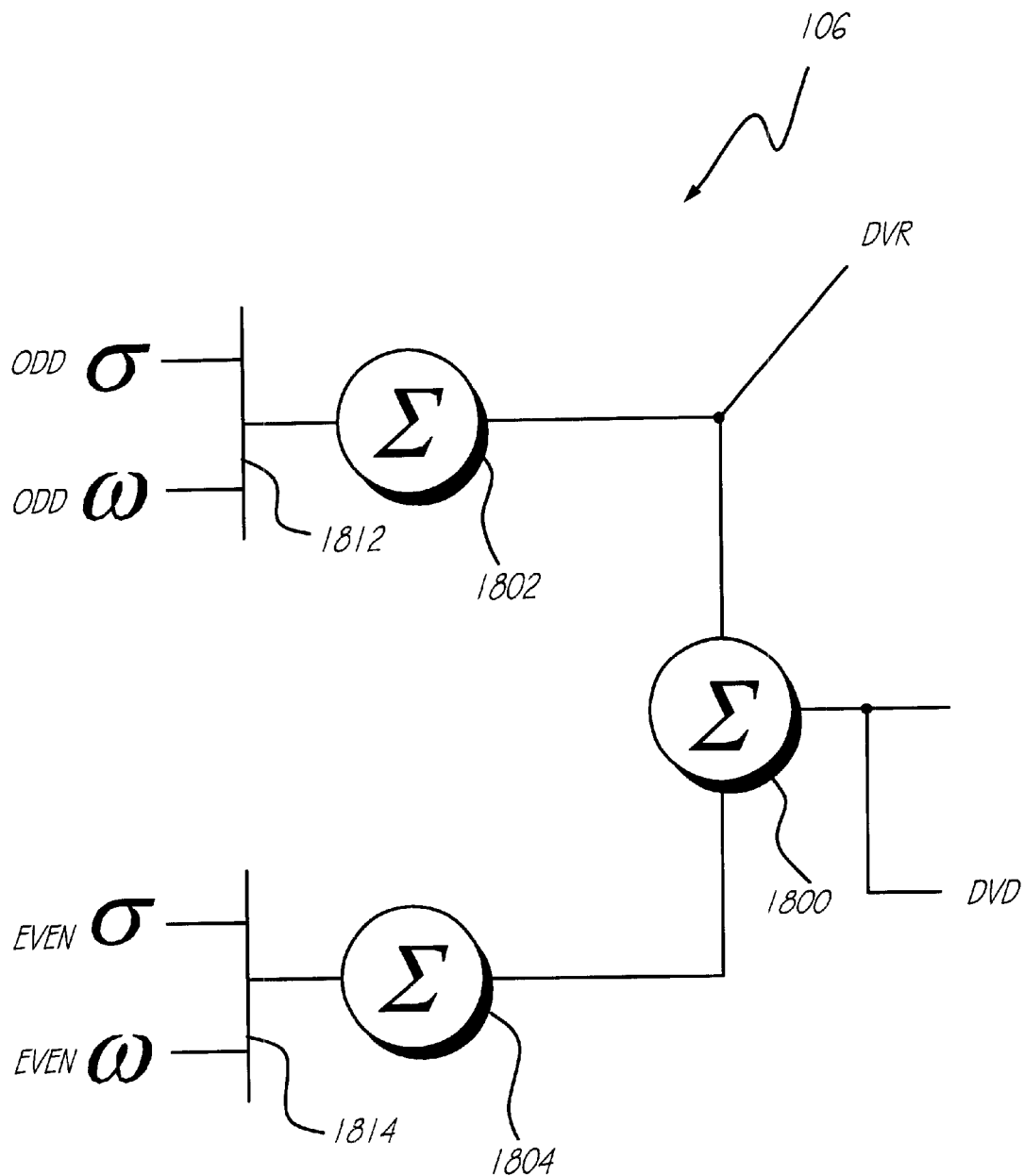
FIG. 18 is a schematic diagram showing a register summation circuit according to an embodiment of the invention.

Register summation circuit 106 is shown in more detail in FIG. 18 as comprising a main adder 1800, an odd register adder 1802, and an even register adder 1804. Inputs to the odd register adder are controlled by odd register MUX 1812; inputs to even register adder are controlled by even register MUX 1814. The odd register MUX 1812 controls whether (1) values from only odd numbered σ registers, or (2) values from only odd numbered ω (i.e., R) registers are summed by adder 1802. Similarly, even register MUX 1814 controls whether (1) values from only even numbered σ registers, or (2) values from only even numbered ω registers are summed by adder 1804. The output of adder 1802 is applied both to line DVR and to a first input terminal of main adder 1800, a second input terminal of main adder 1800 receiving the output of even adder 1804. The output of main adder 1800 is applied both as a root locator (root) signal and to the line DVD. As explained below, both lines DVR and DVD have significance, e.g., for error generator 110 (see FIG. 6).

STRUCTURE: ERROR GENERATOR

Figure 6:
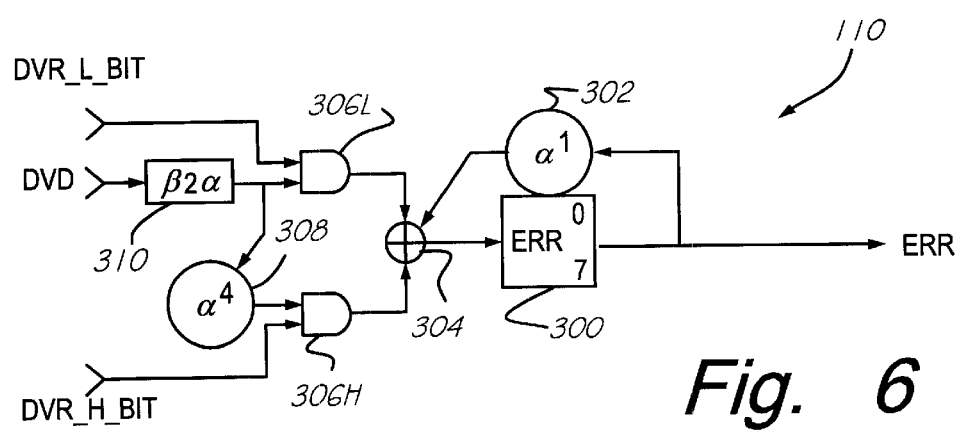
FIG. 6 is a schematic view of an error pattern generator for use with the fast decoder of FIG. 2.

The error generator 110, shown in FIG. 6, comprises an eight bit ERR register 300 which has $\alpha^1$ feedback multiplier 302 connected to its output. The output of ERR register 300 is carried on line ERR. The input for ERR register 300 is received from an output of adder 304. The adder 304 receives a first input from $\alpha^1$ feedback multiplier 302; a second input from AND gate 306L; and a third input from AND gate 306H. The AND gate 306L and AND gate 306H receive respective first inputs on respective lines DVR_L_BIT and DVR_H_BIT from inverse generator 104 (see FIG. 5). The AND gate 306H receives a second input from $\alpha^4$ multiplier 308, which in turn receives its input from β-to-α basis conversion circuit 310. The β-to-α basis conversion circuit 310 obtains its input from line DVD (see FIG. 18). The AND gate 306L receives its second input from β-to-α basis conversion circuit 310.

The β-to-α basis conversion circuit 216 and β-to-α basis conversion circuit 310 serve to convert values input thereon in β basis representation to α basis representation. Suitable circuitry for performing the functions of β-to-α basis conversion circuit 216 and β-to-α basis conversion circuit 310 can be developed by the person skilled in the art using combinatorial logic and the relations shown in Table 1. In Table 1, the bits shown in the left hand column are the input bits having beta basis representation, while the expressions in the right hand column indicate how the alpha basis representation conversion is achieved (e.g., using, for some bits, exclusive OR (XOR) operations).

Those skilled in the art will appreciate that fast correction subsystem 60, with its three sets of registers and its three multipliers, its accumulator & auxiliary multiplier 102, its inverse generator 104, and other elements, comprise a convolution circuit or convolutional generator for implementing a Berlekamp-Massey process.

STRUCTURE: CRC AND REMAINDER GENERATOR

Figure 7:
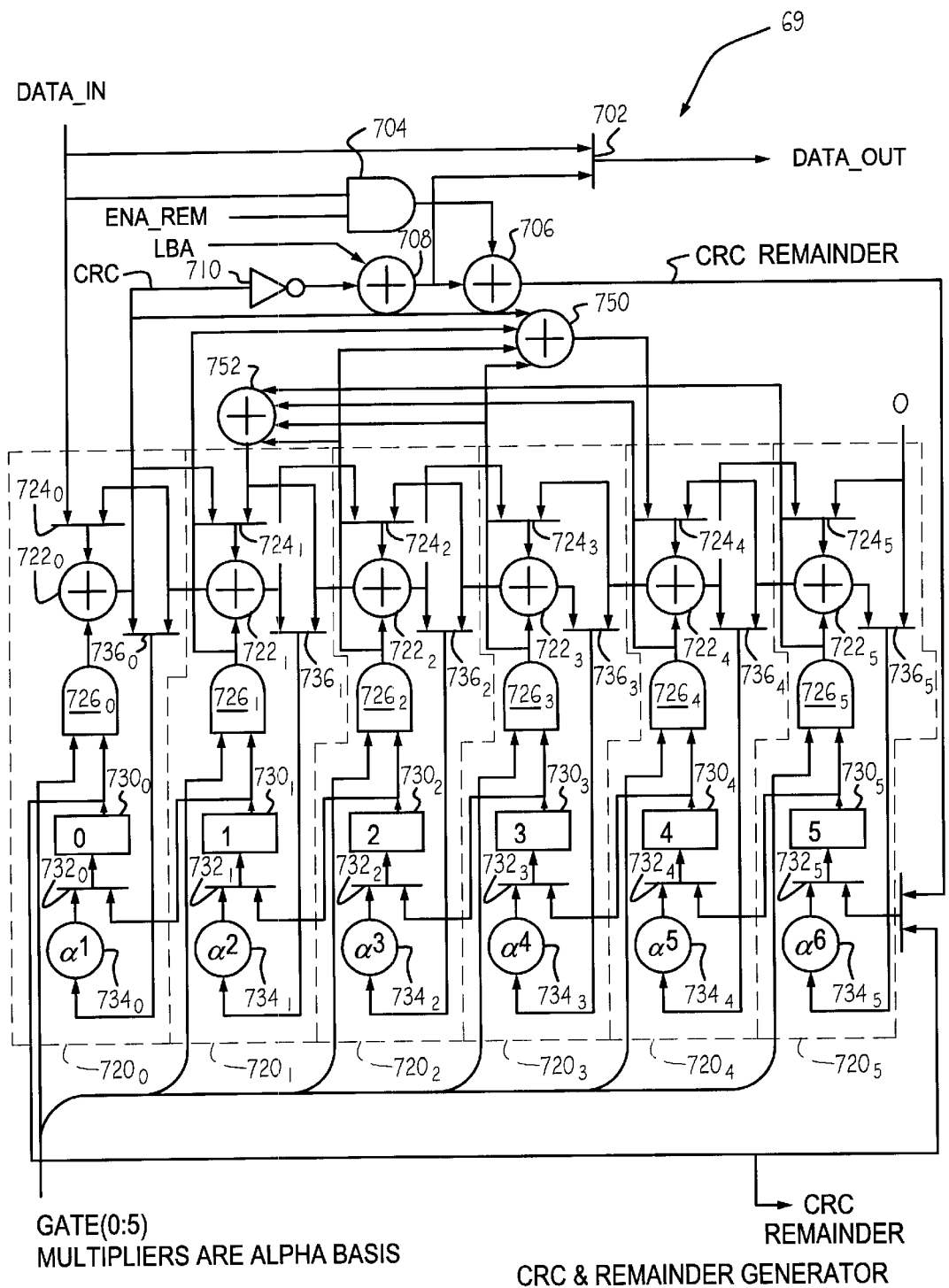
FIG. 7 is a schematic view of a CRC correction Checking Subsystem for use with the fast decoder of FIG. 2.

CRC and remainder generator 69 is illustrated in FIG. 7. In CRC correction checking subsystem 66, input line DATA_IN is connected, e.g., to a first input of selector 702 and to a first input of AND gate 704. A control signal ENA_REM is connected to a second input of AND gate 704 to signal when to generate CRC remainders. An output of AND gate 704 is connected to a first input of adder 706. Thus, when CRC remainders are to be generated, the CRC bytes from the codeword received from the data acquisition device 32 are applied via AND gate 704 to adder 706, for adding with inverted CRC bytes generated by CRC and remainder generator 69 (as applied on line CRC [see FIG. 7]). A second input of adder 706 is received from an output of adder 708. The output of adder 708 is also applied as a second input to selector 702. A first input to adder 708 is received as a signal LBA (Logical Block Address); a second input to adder 708 comes from inverter 710.

In addition, CRC and remainder generator 69 includes six sections $720_0$–$720_5$, each section 720 being framed by a broken line in FIG. 7. The components hereafter mentioned as being included in each of six sections $720_0$–$720_5$ are described with unsubscripted reference numerals. Each section 720 has an adder 722 having a first input which is selected by MUX 724. Each section 720 further comprises a AND gate 726 whose output is the second input to adder 722. A first input of AND gate 726 is the signal applied on line GATE(0:5). Each section 720 has a register 730 whose contents is the second input of AND gate 726. The input for register 730 is selected by MUX 732 from either feedback multiplier 734 or (except for register $730_5$) the contents of the register 730 for the next higher numbered section 720. Input for the feedback multiplier 734 of a section 720 is selected by a MUX 736 in that section 720. One input to the MUX 736 for each section 720 is the output from adder 722 of the same section.

An adder 750 receives input from each of the following: (1) the output of adder $722_0$; (2) the output of AND gate $726_1$; (3) the output of AND gate $726_2$; and (4) the output of AND gate $726_3$. An adder 752 receives input from each of the following: (1) the output of AND gate $726_3$; (2) the output of AND gate $726_3$; (3) the output of AND gate $726_4$; and (4) the output of AND gate $726_5$.

For MUXs $724_1$–$724_3$ and $724_5$, a first input is obtained from the output of the adder 722 for the preceding section 720. For MUX $724_4$, a first input is obtained from the output of adder 750. A second input for MUX $736_0$ is the output of adder $722_1$. A second input for MUX $724_1$ and MUX $736_1$ is the output of adder 752. A second input for MUX $736_2$ is the output of adder $722_3$. A second input for MUX $736_3$ is the output of adder $722_4$. A second input for MUX $736_4$ is the output of adder $722_5$. The second input to MUX $736_5$ is the value "0".

As understood from the foregoing, the contents of register $730_i$ for a section $720_i$ can be applied via MUX $732_{i-1}$ to the register $730_{i-1}$, for i=5, 4, 3, 2, 1. The contents of register $730_0$, on the other hand, is applied to output line CRC of CRC and remainder generator 69 and to a first input of MUX 760. A second input of MUX 760 is obtained from the output of adder 706. The output of MUX 760 is applied to MUX $732_5$ of section $720_5$.

Thus, in CRC and remainder generator 69, the CRC remainder bytes are shifted sequentially through registers $730_5$ to $730_0$, and then applied on line CRC REMAINDER to CRC correction checking subsystem 66. In addition, the CRC remainder bytes can be reloaded back into registers $730_5$ to $730_0$ for use in connection with subsequent operations involving the logical block address (LBA).

RECURSION RULES

The fast correction subsystem 60 of the present invention is structured to implement the following general recursion rules:

$$\tau^{(n)}(x)=x*(\tau^{(n-1)}(x)+(\alpha^d d_{n-1})^{-1}\sigma^{(n)}(x)CHANGE\_L) \quad \text{Eqn. 1}$$

$$\sigma^{(n+1)}(x)=\alpha^d(\sigma^{(n)}-d_n\tau^{(n)})=\alpha^d\sigma^{(n)}(x)-\alpha^d d_n\tau^{(n)}(x) \quad \text{Eqn. 2}$$

(with d not equal to zero in Eqn. 1 and Eqn. 2). One illustrative embodiment of the fast correction subsystem 60 of the present invention implements the following specific recursion rules (which are a special case of the general recursion rules wherein d=−4):

$$\tau^{(n)}(x)=x*(\tau^{(n-1)}(x)+(\alpha^{-4}d_{n-1})^{-1}\sigma^{(n)}(x)CHANGE\_L) \; (d=-4)=$$
$$x*(\tau^{(n-1)}(x)+\alpha^{-3}(((\alpha^{-4}(\alpha^{-3}d_{n-1}))^{-1}CHANGE\_L)\sigma^{(n)}(x) \quad \text{Eqn. 1A}$$

$$\sigma^{(n+1)}(x)=\alpha^{-4}\sigma^{-4}\sigma^{(n)}(x)-\alpha^{-4}d_n\tau^{(n)}(x) \; (\text{i.e., d=−4})=(\alpha^{-4}\sigma^{(n)}(x))-(\alpha^{-3}((\alpha^{-3}d_n)\alpha_2)(\tau^{(n)}(x) \quad \text{Eqn. 2A}$$

In Equation 1 and Equation 1A, the $\tau^{(n)}(x)$ refers to updating of values in the τ registers 130, which occurs during Phase A of an error locator iteration, and which uses the quantity including the inverse of the current discrepancy during Phase B of a prior error locator iteration ($d_{n-1}^{-1}$). In Equation 2 and Equation 2A, the $\sigma^{(n+1)}(x)$ refers to updating the values of the coefficients of the error locator polynomial, held in the σ registers 120. An explanation of the specific recursion rules of Equation 1A and Equation 2A, with corresponding referencing to structural elements of fast correction subsystem 60, ensues. Subsequently is provided a description of how Equation 1 and Equation 2 are generalizations of Equation 1A and Equation 2A, respectively, thus explaining that the implementation of fast correction subsystem 60 specifically described herein is but one example embodiment.

The generic Berlekamp-Massey algorithm is based on the following generic recursion rules:

$$d_n = \sum_{k=0}^{t-1} \sigma_k^{(n)} S_{n-k} \quad \text{Equation 3}$$

$$\sigma^{(n+1)}(x)=\sigma^{(n)}(x)-d_n\tau^{(n)}(x) \quad \text{Equation 4.}$$

$$\tau^{(n+1)}(x) = \begin{cases} x*\tau^{(n)}(x); & CHANGE\_L=0 \\ x*d_n^{-1}\sigma^{(n)}(x); & CHANGE\_L=1 \end{cases} \quad \text{Equation 5}$$

As is well known in the art, the expression CHANGE_L refers to a change in $L_n$, i.e. the order of σ(x) (i.e., the a coefficients).

A problem with the generic recursion rules is that $\sigma^{(n)}$ and $\tau^{(n)}$ must be available for updating both $\sigma^{(n+1)}$ and $\tau^{(n+1)}$. This requires extra registers for storing of the values $\sigma^{(n)}$ and $\tau^{(n)}$. As explained herein, the fast correction subsystem 60 of the present invention does not require such extra registers.

In the fast correction subsystem 60 of the present invention, the inverse generator 104 (see FIG. 5) produces a quantity which includes the inverse discrepancy $d^{-1}$ in alpha basis, high order bit first. Actually, in the context of phases of operations herein described, the quantity produced by inverse generator 104 becomes known as the inverse of the prior discrepancy and is denoted as $d_{n-1}^{-1}$, but for sake of explanation relative to equations such quantity is simply referred to below as the inverse discrepancy $d^{-1}$.

The τ update multiplication is of the following general form:

$$d^{-1}\sigma = \sum_{k=0}^{7}(d^{-1})_k\alpha^k\sigma = \sum_{k=0}^{3}(d^{-1})_{3-k}\alpha^{3-k}\sigma + \quad \text{Equation 6}$$
$$(d^{-1})_{7-k}\alpha^{7-k}\sigma$$
$$= \alpha^3\sum_{k=0}^{3}(d^{-1})_{3-k}(\alpha^{-k}\sigma) + (d^{-1})_{7-k}((\alpha^{-k}\sigma)\alpha^4)$$

$$\alpha^{-3}(d^{-1}\sigma) = \sum_{k=0}^{3}(d^{-1})_{3-k}(\alpha^{-k}\sigma) + (d^{-1})_{7-k}((\alpha^{-k}\sigma)\alpha^4) \quad \text{Equation 7}$$

The implementation specified by the right hand side of the above equations requires the bits of $d^{-1}$ be high order first (two bits at a time); requires that the contents of the σ registers 120L, 120H be multiplied by $\alpha^{-1}$ on each iteration; and produces $\alpha^{-3}$ times the desired product. While these multiplications are occurring, the contents of the σ registers 120L, 120H are also being multiplied by the syndromes in multiplier 160 to produce $d_n$.

The multiplier 160 must be configured to take in consideration the fact that the a registers 120 are multiplied by $\alpha^{-1}$ on each clock of phase A. Therefore, the output of multiplier 160, and particularly of inner product circuits 162L and 162H, is serial (two bits at a time) and is of the form:

$$(S\sigma)_{7-k} = \sum_{j=0}^{7} S_j(\alpha^{7-k}\sigma)_j = \sum_{j=0}^{7} S_j((\alpha^{-k}\sigma)\alpha^7)_j; k=0,1,2,3 \quad \text{Eqn. 8}$$

$$(S\sigma)_{3-k} = \sum_{j=0}^{7} S_j(\alpha^{3-k}\sigma)_j = \sum_{j=0}^{7} S_j((\alpha^{-k}\sigma)\alpha^3)_j; k=0,1,2,3 \quad \text{Eqn. 9}$$

Then, substituting $\sigma\alpha^{-3}$ for $\sigma$:

$$(S\sigma\alpha^{-3})_{7-k} = \sum_{j=0}^{7} S_j((\alpha^{-k}\sigma)\alpha^4)_j; k = 0, 1, 2, 3 \qquad \text{Eqn. 10}$$

$$(S\sigma\alpha^{-3})_{3-k} = \sum_{j=0}^{7} S_j(\alpha^{-k}\sigma)_j; k = 0, 1, 2, 3 \qquad \text{Eqn. 11}$$

Thus, the implementation of fast correction subsystem 60 as specified by the right hand sides of Equations 10 and 11 produces the output from multiplier 160 serially high order first (two bits at a time); requires the $\sigma$ registers 120 to be multiplied by $\alpha^{-1}$ on each iteration (e.g., by feedback multiplier 126); and produces $\alpha^{-3}$ times the desired is product. The sum of all these products, formed by the adders 190 in accumulator & auxiliary multiplier 102, produces $\alpha^{-3}d_n$, which herein is known as the current discrepancy quantity. The value $d_n$ itself is referred to as the current discrepancy.

During Phase A of the error locator iteration of the Berlekamp-Massey process, $\alpha^{-3}d_n$ (the current discrepancy quantity) is calculated and shifted into accumulation shift registers 200H, 200L. The $\sigma$ registers 120 are left with the contents $\alpha^{-4}\sigma^{(n)}(x)$. During Phase B of the error locator iteration of the Berlekamp-Massey process, the $\sigma$ registers 120 are updated with:

$$\sigma^{(n+1)}(x) = \sigma^{(n)}(x) - d_n\tau^{(n)}(x) \qquad \text{Equation 12.}$$

Equation 12 can be modified to use the available values:

$$\alpha^{-4}\sigma^{(n+1)}(x) = (\alpha^{-4}\sigma^{(n)}(x)) - (\alpha^{-3}d_n)(\tau^{(n)}(x))\alpha^{-1} \qquad \text{Equation 13.}$$

The calculation of Equation 13 yields $\alpha^{-4}$ times the desired update of the $\sigma$ registers 120, which is acceptable since multiplying a polynomial by a constant does not change its roots. Therefore, let $$\sigma^{(n+1)}(x) = (\alpha^{-4}\sigma^{(n)}(x)) - (\alpha^{-3}d_n)(\tau^{(n)}(x)\alpha^{-1} \qquad \text{Equation 14.}$$

which is equivalent to Equation 2A.

Solving for $\sigma^{(n)}$:

$$\sigma^{(n)}(x) = \alpha^4\sigma^{(n+1)}(x) + d_n\tau^{(n)}(x) \qquad \text{Equation 15.}$$

and therefore $$\sigma^{(n-1)}(x) = \alpha^4\sigma^{(n)}(x) + d_{n-1}\tau^{(n-1)}(x) \qquad \text{Equation 16.}$$

During Phase A, the $\tau$ registers 130 are updated with:

$$\tau^{(n+1)}(x) = x * \tau^{(n)}(x); \text{CHANGE\_L} = 0 \qquad \text{Equation 17}$$
$$= x * d_n^{-1}\sigma^{(n)}(x); \text{CHANGE\_L} = 1$$

and therefore $$\tau^{(n)}(x) = x * \tau^{(n-1)}(x); \text{CHANGE\_L} = 0 \qquad \text{Equation 18}$$
$$= x * d_{n-1}^{-1}\sigma^{(n-1)}(x); \text{CHANGE\_L} = 1$$

Substituting for $\sigma^{(n-1)}(x)$:

$$\tau^{(n)}(x) = x * d_{n-1}^{-1}(\alpha^4\sigma^{(n)}(x) + d_{n-1}\tau^{(n-1)}(x)); \text{CHANGE\_L} = 1 = x * (\tau^{(n-1)}(x) + d_{n-1}^{-1}\alpha^4\sigma^{(n)}(x); \text{CHANGE\_L} = 1 \qquad \text{Equation 19.}$$

Equation 19 can be modified to use the available values:

$$\tau^{(n)}(x) = x * (\tau^{(n-1)}(x) + (\alpha^{-3}d_{n-1})^{-1}\alpha^1\sigma^{(n)}(x)); \text{CHANGE\_L} = 1 \text{Eqn. 20.}$$

The multiplier 180 multiplies (1) the quantity including an inverse of the prior discrepancy by (2) the contents of the $\sigma$ registers 120, and yields $\alpha^{-3}$ times the product, as discussed above. Therefore, to compensate, a factor of $\alpha^3$ must be included, as understood below:

$$\tau^{(n)}(x) = x * (\tau^{(n-1)}(x) + \alpha^{-3}((\alpha^{-4}(\alpha^{-3}d_{n-1}))^{-1}\sigma^{(n)}(x))); \text{CHANGE\_L} = 1. \text{Eqn. 21.}$$

Accordingly, the current discrepancy quantity (i.e., $\alpha^{-3}d_{n-1}$, stored in accumulation shift registers 200H, 200L) is premultiplied by $\alpha^{-4}$ before being applied to inverse generator 104. In this regard, the premultiplication by $\alpha_{-4}$ is performed by feedback $\alpha^{-1}$ multiplier 204 (see FIG. 4). The expressions for both CHANGE\_L situations can be combined as follows (the parentheses showing the order of operations):

$$\tau^{(n)}(x) = x * (\tau^{(n-1)}(x) + \alpha^{-3}(((\alpha^{-4}(\alpha^{-3}d_{n-1}))^{-1} \text{ CHANGE\_L})\sigma^{(n)}(x))). \text{Eqn. 22.}$$

Thus, for Phase A of the error locator iteration, the recursion rule for fast correction subsystem 60 is as follows:

$$\tau^{(n)}(x) = x * (\tau^{(n-1)}(x) + \alpha^{-3}(((\alpha^{-4}(\alpha^{-3}d_{n-1}))^{-1} \text{ CHANGE\_L})\sigma^{(n)}(x))). \text{Eqn. 23.}$$

which is equivalent to Equation 1A. The value $\alpha^{-3}d_{n-1}$ is stored in accumulation shift registers 200H, 200L of accumulator & auxiliary multiplier 102. The value $\alpha^{-4}(\alpha^{-3}d_{n-1})$ is input from accumulator & auxiliary multiplier 102 to inversion inverse generator 104 is (see FIG. 5). INV\_L\_BIT and INV\_H\_BIT are the outputs of inverse generator 104.

Thus, in terms of the circuit elements and signal lines shown in fast correction subsystem 60, during Phase A of the error locator iteration the contents of a $\tau$ register 130 for slice 100$_k$ (referenced below as $T_k$) are updated as follows:

$$T_k = T_{k-1} + \Sigma_j \text{INV\_L\_BIT}_j^* \text{CHANGE\_L}^* (\alpha^{-j}\text{SIG}_{k-1}) + \Sigma_j \text{INV\_H\_BIT}_j^* \text{CHANGE\_L}^* (\alpha^{-j}\text{SIG}_{k-1})x\alpha^4 \qquad \text{Eqn. 24.}$$

where $\text{SIG}_{k-1}$ are the contents of the $\sigma$ register 120 for slice 100$_{k-1}$.

For Phase B of the error locator iteration, the recursion rule for fast correction subsystem 60 is as follows:

$$\sigma^{(n+1)}(x) = (\alpha^{-4}\sigma^{(n)}(x)) - (\alpha^{-3}d_n)(\tau^{(n)}(x)\alpha^{-1} = (\alpha^{-4}\sigma^{(n)}(x)) - (\alpha^{-3}d_n)\alpha^2(\tau^{(n)}(x) \qquad \text{Eqn. 25.}$$

As explained above, the value $\alpha^{-4}\sigma^{(n)}(x)$ is generated in the $\sigma$ registers 120 as a result of being multiplied by $\alpha^{-1}$ on each of the four clocks of Phase A. The quantity $\alpha^{-3}d_n$ is taken from the accumulation shift registers 200H, 200L at the end of Phase A. Since the $\sigma$ registers 120 shift from low to high, the $(\alpha^{-3}d_n)(\tau^{(n)})$ multiplication is performed serially, high order first. To do this, the contents of the accumulation shift registers 200H, 200L are multiplied by $\alpha^2$ (by $\alpha^2$ multiplier 218) before being loaded into MAK register 210. The multiplier structure for $\tau$ registers 130 and MAK register 210 yields $\alpha^{-3}$ times the desired result. In this regard, MAK register 210 is multiplied by $\alpha^{-1}$ (by feedback $\alpha_{-1}$ multiplier 222) on each clock of Phase B.

Thus, in terms of the circuit elements and signal lines shown in fast correction subsystem 60, during Phase B of the error locator iteration the contents of a $\sigma$ register 120 for slice 100$_k$ (referenced below as $\text{SIG}_k$) are updated as follows:

$$\text{SIG}_{k,3-j} = \text{SIG}_{k,3-j} + \text{INNER\_PROD}(T_k, \text{MAK } \alpha^{-j}); j = 0, 1, \text{Eqn. 26.}$$

$$\text{SIG}_{k,7-j} = \text{SIG}_{k,7-j} + \text{INNER\_PROD}(T_k, \text{MAK } \alpha^{-j}); j = 0, 1, \text{Eqn. 27.}$$

In the above expressions, MAK refers to the contents of MAK register 210 (see FIG. 6) of accumulator & auxiliary multiplier 102.

OPERATION: OVERVIEW

Figure 8:
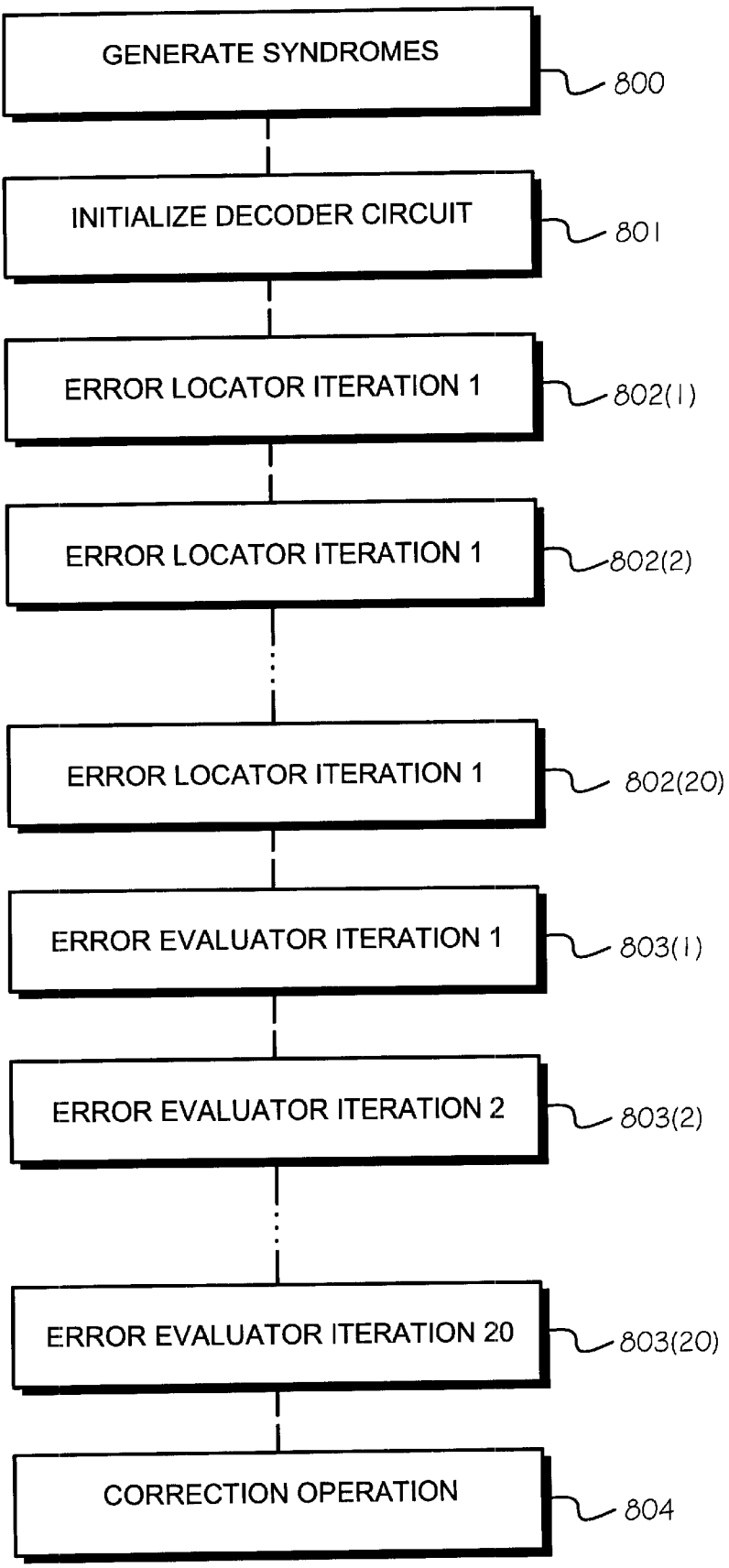
FIG. 8 is a flowchart showing basic operations performed by the error correction system of FIG. 2 for a codeword.

FIG. 8 shows general steps performed by fast correction subsystem 60 for error correction of a codeword according to a mode of the present invention. Step 800 indicates that syndromes $S_0, S_1, \ldots S_{19}$ are generated for the codeword by generator 62. Assuming that the Reed-Solomon codeword generator polynomial is $$\prod_{k=0}^{t-1}(x+\alpha^{L+k}),$$

the person skilled in the art will appreciate that the syndromes are calculated by generator 62 as $S_k = R(x) \mod(x+\alpha^{L+k})$ for $k=0, 1, \ldots t-1$. In the foregoing, "t" is the number of m-bit syndromes received from generator 62, which (as mentioned above) is twenty for the particular implementation shown in the drawings.

Step 801 is an initialization step. At step 801, the syndrome values $S_0, S_1, \ldots S_{19}$ are loaded into R registers 140. In addition, the σ registers 120 and the τ registers 130, along with other values, are initialized.

In the loading of syndrome values at step 801, syndrome $S_0$ is loaded into slice $100_0$ and syndrome $S_k$ is shifted into slice $100_{t-k}$ for $k=1, 2, \ldots t-1$. Within each intermediate slice 100, as shown in FIG. 3A, for example, a syndrome is shifted into the R register 140 from line SYNDROME via input selector 142. Initially syndrome $S_0$ is loaded into R register 140 of slice $100_0$, while syndrome values $S_1, S_2, \ldots S_{19}$ are loaded into R registers 140 of respective slices $100_{19}, 100_{18}, \ldots 100_1$. After the syndromes are initially loaded into the R registers 140 of the respective slices as just mentioned, during each subsequent iteration a forward parallel shift of the syndromes is performed. In this forward shift, the contents of each R register 140 (all eight bits in parallel) is shifted out on line R to the next slice (e.g., from slice 100 to slice $100_{i+1}$). In the shifting operation, the value in register R 140 of slice $100_i$ is applied on line R_IN to input is selector 142 of slice $100_{i+1}$, so that the value in register R 140 of slice $100_i$ can be loaded (eight bits in parallel) into the value in register R 140 of slice $100_{i+1}$. The output of register R of slice $100_{19}$ feeds the input of slice $100_0$ via MUX 101 so that a circular parallel shift of syndromes can be accomplished.

At step 801 the σ registers 120 for each of slices $100_1$–$100_{20}$ and τ registers 130 of each slices $100_0$–$100_{19}$ are reset to zero by correction controller 68 before the first phase of the first error locator iteration for the codeword. At this time, σ register 120 of slice $100_0$ is set to $\alpha^0$ in β basis representation. The correction controller 68 initializes the CHANGE_L SIGNAL to 1. Also, the INV register is initialized to the α basis representation of $\alpha^0$.

As depicted by steps 802 through 804 of FIG. 8, error correction system 30 of FIG. 1 performs three different operations with respect to each codeword. The first operation involves the error locator iterations of the Berlekamp-Massey process (step 802). The second operation involves the error evaluator iterations of the Berlekamp-Massey process (step 803). The third operation involves codeword correction (step 804).

The error locator operation has t=20 iterations and results in generating the error locator polynomial coefficients for the codeword in the σ registers 120. Using the fast correction subsystem 60 of the present invention, for each codeword each error locator iteration is performed in two phases. In the first phase [Phase A], the fast correction subsystem 60 basically performs such activities as (1) generating a current discrepancy quantity $\alpha^{-3}d_n$ in accumulator & auxiliary multiplier 102; and (2) updating the contents of the τ registers 130 according to the foregoing recursion rule for Phase A. In the second phase [Phase B], the fast correction subsystem 60 basically performs such activities as (1) obtain a quantity including the inverse of the current discrepancy; and (2) updating the contents of the σ registers 120 according the foregoing recursion rule for Phase B. Advantageously, both the first phase and the second phase each require only m/2 (e.g., four clocks). After each error locator iteration, the contents of the R registers (syndromes) are circularly shifted rightwardly.

As shown by events 803(1)–803(20) in FIG. 8, the twenty error locator iterations for a codeword are followed by twenty error evaluator iterations for the codeword. Each error evaluator iteration has both a Phase A and a Phase B, with each of Phase A and Phase B being four clocks. The twenty error evaluator iterations for a codeword serve, e.g., to put the coefficients of $\alpha^{-7}\omega(x)$ [$\omega(x)$ being the error evaluator polynomial] in the R registers 140 and to put the coefficients of $\alpha^{-3}\sigma(x)$ [$\sigma(x)$ being the error locator polynomial] in the σ registers 120. As used herein, the phrase "coefficients of an/the error evaluator polynomial" include coefficients of any non-zero multiple of an/the error evaluator polynomial (such as a $\alpha^{-7}$ multiple, for example). Similarly, the phrase "coefficients of an/the error locator polynomial" include coefficients of any non-zero multiple of an/the error locator polynomial (such as a $\alpha^{-3}$ multiple, for example).

The twenty error evaluator iterations for a codeword are performed preparatory to the correction operation shown as event 804 in FIG. 8. In the correction operation, an error location is detected when the sum of the SIG registers 120 is 0. When an error location is detected, the error pattern ERR is DVD/DVR where DVD is the sum of the R registers 140 and DVR is the sum of the odd numbered SIG registers 120 [see FIG. 18]. The error pattern ERR is output from error generator 110 (see FIG. 6) on line ERR to adder 54. As shown in FIG. 1, the bits in error of the codeword (stored in register 52) have the error pattern ERR added thereto by adder 54, resulting in a corrected codeword. The corrected codeword is applied via system bus 42 to buffer 50 (see FIG. 18). Various aspects of the operations summarized above are discussed in more detail below.

OPERATION: ERROR LOCATOR OPERATION: PHASE A

Figure 9A:
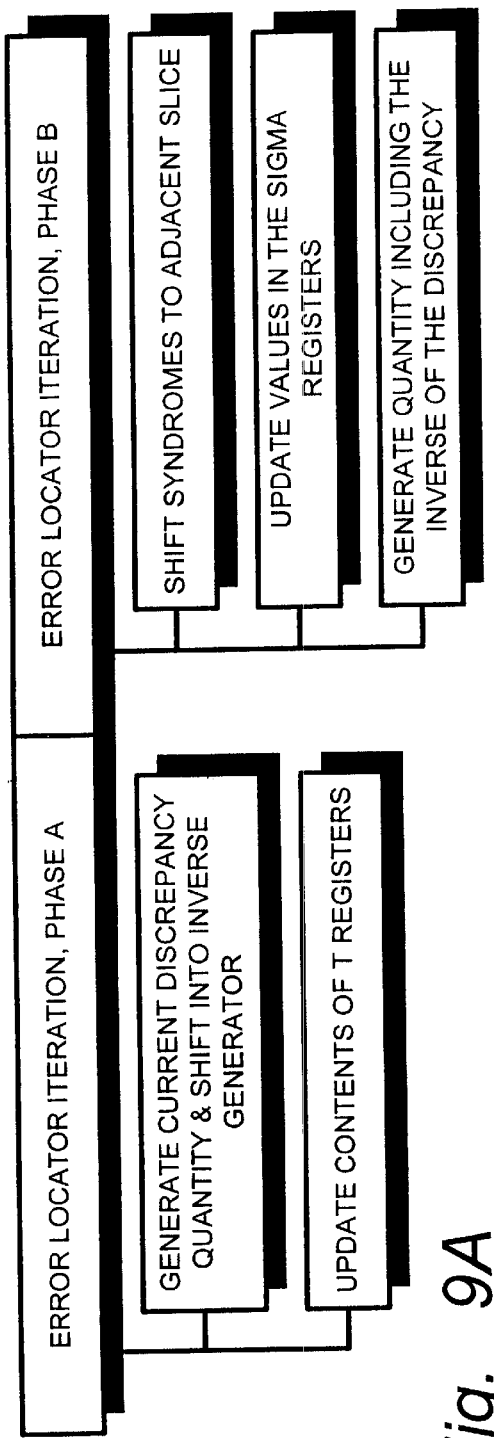
FIG. 9A is a schematic diagram showing basic activities occurring in Phase A and Phase B of an error locator iteration.
Figure 9B:
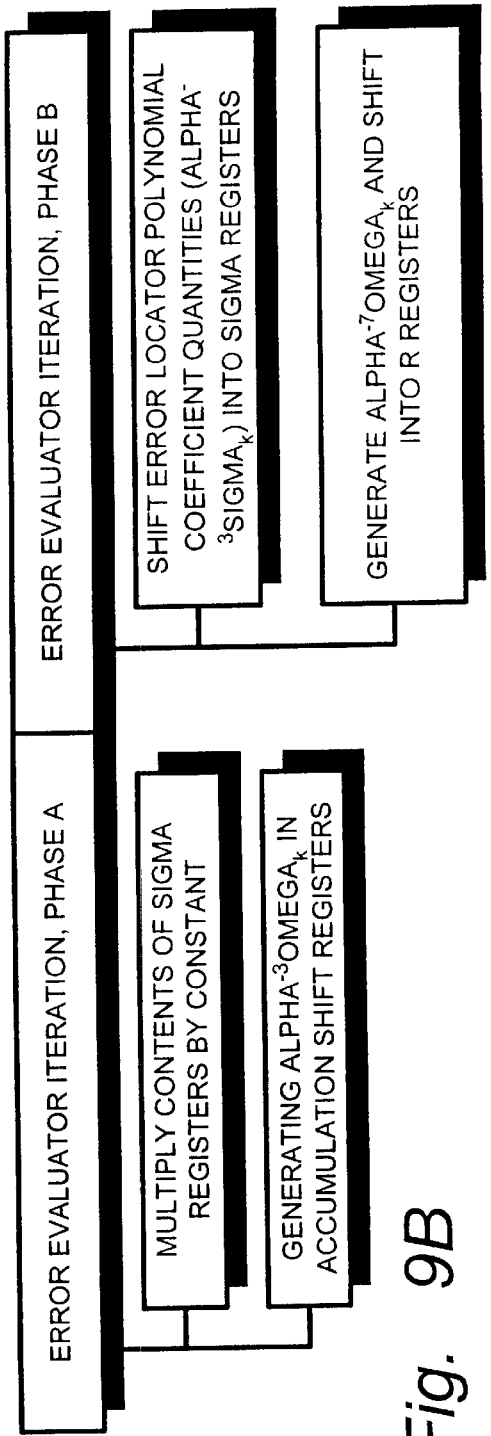
FIG. 9B is a schematic diagram showing basic activities occurring in Phase A and Phase B of an error evaluator iteration.

For each codeword, each of the twenty error locator iterations is performed in two phases. As shown in FIG. 9A, in the first phase [Phase A], the fast correction subsystem 60 basically performs such activities as (1) generating a current discrepancy quantity $\alpha^{-3}d_n$ in accumulator & auxiliary multiplier 102; and (2) updating the contents of the τ registers 130 according to the foregoing recursion rule for Phase A. During the first error locator iteration (step 802(1)), the σ register 120 of slice $100_0$ is initialized to $\alpha^0$ while all other slices 100 have the value zero initialized in the σ registers 120.

The current discrepancy quantity $\alpha^{-3}d_n$ is derived from the values stored in the σ registers 120 and the syndromes. In particular, the multiplier 160 of each slice makes a contribution to the current discrepancy quantity $\alpha^{-3}d_n$ by forming the inner product of contents of σ registers 120 and the syndromes (in register R 140). As explained previously, all eight bits of the contents of the σ registers 120 are received in parallel by multiplier 160; the syndrome is received in parallel into multiplier 160. The multiplier 160 of each slice $100_0$–$100_{19}$ serially outputs, two bits at a time (high order bits 7,3 first), a contribution to the current discrepancy quantity $\alpha^{-3}d_n$. In this regard, in the first clock of Phase A, inner product circuit 162L outputs bit 3 of the contribution and inner product circuit 162H outputs bit 7 of the contribution. On the second clock of Phase A, inner product circuit 162L outputs bit 2 of the contribution and inner product circuit 162H outputs bit 6 of the contribution. Such continues for four clocks, with inner product circuit 162L outputting bit 0 of the contribution and inner product circuit 162H outputting bit 4 of the contribution on the fourth clock. With each of the four clocks of Phase A the values in the σ registers are multiplied by $\alpha^{-1}$.

At each clock the serial outputs of the inner product circuits 162L and 162H of a slice $100_i$ (i=1, 2, . . . 19) are applied to adders 190L and 190H respectively (see FIG. 19). The outputs of adders 190L and 190H are applied as signals DN_L_BIT and DN_H_BIT respectively, to accumulator & auxiliary multiplier 102. In particular, in accumulator & auxiliary multiplier 102 signal DN_L_BIT is serially shifted into accumulation shift register 200L via input selector 202L; signal DN_H_BIT is serially shifted into accumulation shift register 200H via input selector 202H (see FIG. 4).

Thus, the adders 190 sum the serial outputs of multipliers 160 of each slice $100_i$ (i=1, 2, . . . 19) to obtain, in accumulation shift registers 200H, 200L, the current discrepancy quantity $\alpha^{-3d}{}_n$. In the above regard, it should be understood that all slices $100_i$ (i=0, 1, 2, . . . 19) are simultaneously conducting a multiplication and producing a two-bit-per-clock output, with the two bits being added (by adders 190L, 190H) to obtain the current discrepancy quantity $\alpha^{-3}d_n$.

Since, for the first error locator iteration (step 802(1)), slices $100_1$–$100_{19}$ (all slices except slice $100_0$) have the value zero initialized in the σ registers 120, slices $100_1$–$100_{19}$ contribute nothing to the current discrepancy quantity $\alpha^{-3}d_n$ during Phase A of the first error locator iteration. However, during the first error locator iteration the multiplier 160 of slice $100_0$ (which has been initialized with syndrome $S_0$ in register R 140 and with $\alpha^0$ in σ register 120) will produce meaningful output. For each of the four clocks in Phase A of the first error locator iteration, the two-bit output of multiplier 160 of slice $100_0$ is applied to adders 190 of slice $100_1$. As explained above, the highest order bits of each nibble are outputted during the first clock, the second highest order bits of each nibble are outputted during the second clock, and so forth. At the end of Phase A of the first error locator iteration, the accumulation shift registers 200H, 200L contain the eight bits output by multiplier 160 of slice $100_0$.

Thus, at the end of Phase A of an error locator iteration, all eight bits of the contribution to the current discrepancy quantity $\alpha^{-3}d_n$ have been loaded into accumulation shift registers 200H, 200L, the nibble having the higher order bits into register 200H and the nibble having the lower order bits into register 200L. After Phase A, the inverse generator 104 requires another four clocks—the four clocks of Phase B—in order to obtain, from the current discrepancy quantity $\alpha^{-3}d_n$, what will become (during the next iteration) the quantity including the inverse of the prior discrepancy (i.e., $\alpha^7d_{n-1}{}^{-1}$).

In addition to generating the current discrepancy quantity $\alpha^{-3}d_n$ in Phase A, the fast correction subsystem 60 during Phase A also updates the values of the τ registers 130. Basically, in order to update the values of the τ registers 130 during phase A, fast correction subsystem 60 uses τ register-updating multipliers 180 to multiply the values in the σ registers 120 by the quantity including the inverse of the prior discrepancy (i.e., $\alpha^7d_{n-1}{}^{-1}$). This implements Equation 24. The quantity including the inverse of the prior discrepancy (i.e., $\alpha^7d_{n-1}{}^{-1}$) is initialized to $\alpha^0$ (in α basis representation) in registers 274H, 274L (see FIG. 5).

During Phase A of each error locator iteration, for each slice 100 the contents of the σ registers 120 are transmitted to τ register-updating multiplier 180. In this regard, and as shown in FIG. 3A, for example, the eight bit contents of σ registers 120L, 120H are transmitted in parallel to multiple AND gate 182L, and the eight bit contents of a registers 120L, 120H as multiplied by $\alpha^4$ by multiplier 164 are transmitted in parallel to multiple AND gate 182H. AND gate 182L also serially receives, during the four clocks of Phase A, as a second input the sequential bits 3, 2, 1, and 0 of the value carried on line INV_L_BIT from inverse generator 104 (i.e., the four lower order bits of the quantity including the inverse of the prior discrepancy [$\alpha^7d_{n-1}{}^{-1}$]). Similarly, AND gate 182H also serially receives, during the four clocks of Phase A, as a second input the sequential bits 7, 6, 5, and 4 of the value carried on line INV_H_BIT from inverse generator 104 (i.e., the high lower order bits of the quantity including the inverse of the prior discrepancy [$\alpha^7d_{n-1}{}^{-1}$]). The adder 184 of τ register-updating multiplier 180 adds the two inputs from AND gates 182L and 182H together and its output is an input to adder 134. Adder 134 of slice $100_i$ adds the sum received from τ register-updating multiplier 180 to the contents of τ register 130 for slice $100_i$ for the first three clocks. The sum obtained by adder 134 is loaded via selector 132 into τ register 130 of slice $100_i$. On the fourth clock the sum obtained by adder 134 is loaded via selector 132 into τ register 130 of slice $100_{i+1}$. Since it requires only four clocks to receive the quantity including the inverse of the prior discrepancy (i.e., $\alpha^7d_{n-1}{}^{-1}$), it only takes four clocks to update the τ register 130.

Phase A execution of fast correction subsystem 60 differs from iteration to iteration primarily by the fact that R registers 140 and σ registers 120 have been loaded with different values. As explained below, during Phase B the syndrome values are circularly shifted and the σ registers 120 are updated. Hence, during a second error locator iteration for a codeword, two slices (e.g., slices $100_0$ and $100_1$) will be operative in yielding the current discrepancy quantity $\alpha^{-3}d_n$. Similarly, with respect to generation of the current discrepancy quantity $\alpha^{-3}d_n$, three slices will be operative during a third iteration, four slices during a fourth iteration, and so on until all slices are operative in the twentieth (last) error locator iteration.

Thus, at the end of each Phase A execution, fast correction subsystem 60 has generated current discrepancy quantity $\alpha^{-3}d_n$ in ACC register 200; and has updated the τ registers 130 of all slices.

OPERATION: ERROR LOCATOR OPERATION:
PHASE B

Phase B also has, in the illustrated embodiment, four clock cycles. As illustrated in FIG. 9A, three major actions occur during Phase B: (1) shifting of syndromes (all eight bits in parallel on the last clock only) to an adjacent slice; (2) updating values in the σ registers 120 using the values in the τ registers 130 and current discrepancy quantity $\alpha^{-3}d_n$ (which was just generated during Phase A); and (3) generating the quantity including the inverse of the discrepancy. Regarding the third of these actions, the quantity including the inverse of the discrepancy will become the quantity including the inverse of the prior discrepancy (i.e., $\alpha^7 d_{n-1}^{-1}$) during the next error locator iteration.

During Phase B of each error locator iteration, fast correction subsystem 60 shifts the syndrome values in preparation for a next Phase A so that a new discrepancy quantity $\alpha^{-3}d_n$ can be generated during Phase A of the next error locator iteration. In this respect, the syndrome value in R register 140 of slice 100$_i$ is shifted (all eight bits in parallel) on line R to input selector 142 of slice 100$_{i+1}$. The input selector 142 of slice 100$_{i+1}$ applies the syndrome from slice 100$_i$ into the R register 140 of slice 100$_{i+1}$. The output of slice 100$_{19}$ feeds MUX 101 and the input selector 142 of slice 100$_0$, forming a circular shift register.

Updating values in the σ registers 120 is performed primarily by multiplier 170 (see, e.g., FIG. 3A). In order to update the values in σ registers 120, the multiplier 170 uses the values in the τ registers 130 and current discrepancy quantity $\alpha^{-3d}{}_n$ which was just generated during Phase A. But since the σ registers 120 shift from low bit to high bit, the multiplication performed by σ register-updating multiplier 170 must output its product serially, high order bit first. In order to accomplish this, the MAK register 210 is utilized (see FIG. 4).

To make the current discrepancy quantity $\alpha^{-3}d_n$ usable by multiplier 170, i.e., to produce a serial output with high order bit first, the line ACC_IN carries a value which will be the value of accumulation shift registers 200H, 200L during the next clock cycle. Moreover, the value carried on line ACC_IN is multiplied by $\alpha^2$ and converted from β-to-α basis representation prior to being loaded (via MAK input selector 212) into MAK register 210. The basis-converted $\alpha^2$ multiple of the current discrepancy quantity $\alpha^{-3}d_n$ is thus stored in MAK register 210, and is output in parallel (8 bits) on line MAK. The contents of MAK register 210 is multiplied by $\alpha^4$ multiplier 248 for output in parallel on line MAKA4.

Thus, at the beginning of Phase B the σ register-updating multiplier 170, the multiplier 170 for slice 100$_i$ is ready to receive the quantity $\alpha^{-1}d_n$ on line MAK and the quantity $\alpha^{-1} \cdot d_n \cdot \alpha^4$ on line MAKA4 (eight bits on each line) as one input, and the contents of the τ register 130 for slice 100$_i$ as a second input. More particularly, the inner product circuit 172L receives the quantity $\alpha^{-1}d_n$ on line MAK as its first input; the inner product circuit 172H receives the quantity $\alpha^{-1}d_n$ (multiplied by $\alpha^4$) on line MAKA4 as its first input. Both inner product circuits 172L and 17211 receive their second input from the τ register 130 for slice 100$_i$.

Within each slice, on each clock of Phase B the serial output of multiplier 170 is added to the contents of σ register 120 using the adders 124 and input selectors 122 of that slice. In this regard, the serial output of inner product circuit 172L is applied as a first input to adder 124L, which receives the contents of σ register 120L as another input. The output of adder 124L is applied via input selector 122L to σ register 120L. Similarly, the serial output of inner product circuit 172H is applied as a first input to adder 124H, which receives the contents of σ register 120H as another input. The output of adder 124H is applied via input selector 122H to σ register 120H.

For the first clock of Phase B, the output from MAK register 210 on line MAK will be the initial value stored therein at the beginning of Phase B. However, for each clock of Phase B, the feedback $\alpha^{-1}$ multiplier 222 is invoked relative to the contents of MAK register 210. In this way, during the successive clocks of Phase B the contents of MAK register 210 becomes an $\alpha^{-1}$ multiple of the contents of the previous clock. Thus, for each successive clock of Phase B, the multiplier 170 of each slice receives on lines MAK and MAKA4 values which are $\alpha^{-1}$ multiples of the values received during the previous clock. This means that, for the second through fourth clocks of Phase B, the contents of MAK register 210 is multiplied by $\alpha^{-1}$, with the consequence that multiplier 170 yields $\alpha^{-3}$ times the desired results, i.e., the result is $\alpha^{-1}\alpha^3 = \alpha^{-4}d_n$, which is what is required by Equation 2A.

Phase B of the error locator iteration also involves generating the quantity which includes the inverse of the current discrepancy quantity $\alpha^{-3d}{}_n$, and which will become (during the next error locator iteration) the quantity which includes the inverse of the prior discrepancy (i.e., $\alpha^7 d_{n-1}^{-1}$). The current discrepancy quantity $\alpha^{-3}d_n$ has been accumulated in accumulation shift registers 200H, 200L during Phase A as described above, and is applied to inverse generator 104 at the beginning (first clock) of Phase B on line ACC as shown in FIG. 5. All eight bits of the current discrepancy quantity $\alpha^{3-}d_n$ are carried in parallel on line ACC. As indicated above, the value $\alpha^{-4}$ACC is input to the inverse look up tables (LUT) 260(1), 260(2). For this reason, the eight bits of the current discrepancy quantity $\alpha^{-3}d_n$ carried on line ACC are first applied to $\alpha^{-4}$ multiplier 262(1) prior to being applied to inverse look up table (LUT) 260(1). Similarly, the eight bits of the current discrepancy quantity $\alpha^{-3}d_n$ carried on line ACC are first applied to multiplier 264 and $\alpha^{-4}$ multiplier 262(2) prior to being applied to inverse look up table (LUT) 260(2). An implementation simplification is to include the $\alpha^{-4}$ multiplier 262 in inverse LUT 260 50 that only multiplier 264 is needed.

During the second clock of Phase B, the quantity applied on line ACC to inverse generator 104 is $\alpha^{-1}$ times $\alpha^{-3}d_n$, in view of the $\alpha^{-1}$ feedback around accumulation shift registers 200H, 200L (see feedback $\alpha^{-1}$ multiplier 204 in FIG. 4). Further, on the third clock of Phase B the quantity applied on line ACC to inverse generator 104 is a times $\alpha^{-3}d_n$; on the third clock of Phase B the quantity applied on line ACC to inverse generator 104 is $\alpha^{-3}$ times $\alpha^{-3}d_n$; in view of feedback $\alpha^{-1}$ multiplier 204. For each of the clocks of Phase B, multiples of these respective values are applied to the inverse look up tables (LUT) 260(1), 260(2). The feedback $\alpha^{-1}$ multiplier 204 is necessary for the inverse LUTs to produce an inverse with low order bit leading.

Each of the inverse look up tables (LUT) 260(1), 260(2) performs a lookup operation, and outputs a four bit serial value in β basis representation. The lookup operation performed by the inverse look up tables (LUT) 260(1), 260(2) is based on combinatorial logic, and is understood, e.g., with reference to Whiting, "Bit-Serial Reed-Solomon Decoders in VSLI", California Institute of Technology, 1984. The four output bits are clocked out of the inverse look up tables (LUT) 260(1), 260(2) on four successive clocks, the least significant of the four bits leading. The value obtained from inverse look up table (LUT) 260(1) is clocked via input selector 270(1) into register 274(1); and also applied to adder 272. The value obtained from inverse look up table (LUT) 260(2) is also clocked to adder 272, least significant bit leading. In addition, on each clock adder 272 also receives from summer 280 the sum of the two bit positions in register 274(1) which are closest to input selector 270(1).

Although the values shifted (in four clocks) into registers 274(1) and 274(2) are in β representation with least significant bit order leading, employment of summer 280 [for the purpose of adding adding the two bit positions in register 274(1)], as well as the addition performed by adder 272 results in a basis and bit order transformation of the quantities received from the LUTs. In particular, at the end of the four clocks of shifting into registers 274(1) and 274(2), register 274(1) contains an a basis representation of the high order nibble, highest bit (bit 7) leading, of the quantity including the inverse of the discrepancy. Similarly, at the end of the four clocks of shifting register 274(2) contains an a basis representation of the low order nibble, highest bit (bit 3) leading, of the quantity including the inverse of the discrepancy. At the first clock of the next Phase A, the quantity including the inverse of the discrepancy becomes the quantity including the inverse of the prior discrepancy.

OPERATION: ERROR EVALUATOR GENERATION: PHASE A

During the twenty error evaluator iterations, the fast correction subsystem 60 evaluates the error evaluator polynomial $\omega(x)=\Sigma \omega_k x^k$. The coefficients $\omega_k$ of the error evaluator polynomial are defined by:

$$\omega_k = \sum_{j=0}^{k} \sigma_j S_{k-j}, \quad k = 0, 1, \ldots t-1 \quad \text{Equation 29}$$

Two basic operations occur during Phase A of an error evaluator iteration. The first basic operation is multiplying the contents of $\sigma$ register $120_{20}$ (i.e., $SIG_{20}$ in slice $100_{20}$) by a constant $\alpha^{4k-3}$ to yield $\alpha^{-3}\sigma_{20-k}$. The second basic operation is generating $\alpha^{-4k-3}\omega_{19-k}$ in accumulation shift registers 200H, 200L. Then, in Phase B of the error evaluator iteration, the value $\alpha^{-3}\sigma_{20-k}$ is shifted into $\sigma$ register $120_0$ (as the values in $\sigma$ registers 120 are shifted right into an adjacent $\sigma$ register); the quantity $\alpha^{-7}\omega_{19-k}$ is generated in registers 274(1) and 274(2) of inverse generator 104 and shifted into R register $140_0$ of slice $100_0$ (while R registers 140 which have received $\alpha^{-7}\omega_{19-k}$ values shift those values right into an adjacent R register 140).

Before the first clock of the first phase A of the first error evaluator iteration, the MAK register 210 in accumulator & auxiliary multiplier 102 (see FIG. 4) is initialized at $\alpha^0$. In this regard, MAK input selector 212 selects the a input for application to MAK register 210. The contents of $\sigma$ register $120_0$ (also known as $SIG_{20}$) is input on bus $SIG_{20}$ to input selector 244 as a first input to multiplier 240. $SIG_{20}$ is multiplied by $\alpha^{-1}$ on each clock and the result from multiplier 240 is $\sigma \cdot MAK \cdot \alpha^{-3}$. The higher order nibble of $\alpha^{-3}SIG_{20}$ is shifted into register 274(1) while the lower order nibble of $\alpha^{-3}SIG_{20}$ is shifted into register 274(2). The shifting of the value $\alpha^{-3}SIG_{20}$ thus occurs two bits at a time, in beta representation, with highest order bit leading. Thus, during Phase A of an error evaluator iteration, the fast correction subsystem 60 multiplies the contents of $\sigma$ register $120_{20}$ (i.e., $SIG_{20}$ in slice $100_{20}$) by a constant $\alpha^{4k-3}$ to yield $\alpha^{4k-3} \cdot \sigma_{20-k}$. On iteration k, $SIG_{20}$ holds $\sigma_{20-k} \cdot \alpha^{4k}$.

Also in Phase A of each error evaluator iteration, the quantity $\alpha^{-3}\omega_{19-k}$ is generated in accumulation shift registers 200H, 200L. Advantageously the evaluation of the error evaluator polynomial $\omega(x)$ involves a calculation similar to that for calculating $d_n$ in Phase A of the error locator iteration. In this regard, at the beginning of Phase A of the first error evaluator iteration for a codeword, the syndromes S of the codeword are stored in the R registers 140. As explained above with reference to Phase B of the error locator iteration, the a values are stored in $\sigma$ registers 120. During Phase A of the error evaluator iteration, the $\sigma$ registers 120 are multiplied by $\alpha^{-1}$ on each clock (see feedback multiplier 126 in FIG. 3). Employment of the multipliers 160 of the slices $100_0$–$100_{19}$ and the adders 190, functioning in essentially the same manner as in Phase A of the error locator iteration, yields (in four clocks of Phase A of an error evaluator iteration) the quantity $\alpha^{-4k-3}\omega_{20-k}$ in ACC. During each of the four clocks, a bit is received on each of lines DN_H_BIT and DN_L_BIT into respective accumulation shift registers 200H, 200L (see FIG. 4).

OPERATION: ERROR EVALUATOR OPERATION: PHASE B

The multiplication of $\sigma$ by $\alpha^{-4}$ (occasioned by the feedback multiplication around the $\sigma$ registers) must be compensated by multiplying the second $\omega$ by $\alpha^4$, the third by $\alpha^8$, etc. During phase B, ACC (e.g., the contents of accumulation shift registers 200H, 200L) is multiplied by $\alpha^{-1}$ on each clock using $\alpha^{-1}$ multiplier 246. The input selector 244 selects the $\alpha^{-1}$ ACC quantity output by $\alpha^{-1}$ multiplier 246 for application as a first input to multiplier 240. On the last clock of Phase B, the contents of MAK register 210 is multiplied by $\alpha^4$ (by $\alpha^4$ multiplier 220). Thus, during Phase B the multiplier 240 multiplies $\alpha^{-1}$ ACC by MAK yielding $\alpha^{-3}$ times the desired product, i.e., $(((\alpha^{-4k-3}\omega)\alpha^{4k})\alpha^{-3} = \alpha^{-7}\omega$. Since MAK is initialized with $\alpha^4$ before the start of the first iteration and multiplied by $\alpha^4$ at the end of each Phase B, MAK holds $\alpha^4$ on iteration k.

The product $\alpha^{-7}\omega$ produced by multiplier 240 (in beta basis representation) is shifted in serial fashion, two bits at a time, most significant bits leading, on line INV_L_IN and INV_H_IN into registers 274(2) and 274(1), respectively. On the last clock of Phase B, the inputs to registers 274(2) and 274(1) are parallel shifted into R register $140_0$ of slice $100_0$ (see FIG. 5).

During Phase B, the contents of all of the $\sigma$ registers $120_0$–$120_{20}$ are being shifted right to the next adjacent one of the $\sigma$ registers $120_1$–$120_{20}$. Two bits are shifted for each clock of Phase B, a bit of a higher order nibble being shifted on bus SIG_H_IN and a bit of a lower order nibble being shifted on bus SIG_L_IN. On the last clock of Phase B, only those R registers 140 which have received an $\omega$ coefficient are byte-shifted (e.g., eight bits in parallel) to a right adjacent R register 140. For example, on the last clock of Phase B for the first error evaluator iteration, only the contents of R register $140_0$ are shifted; on the last clock of Phase B for the second error evaluator iteration, only the contents of R register $140_0$ and R register $140_1$ are shifted; and so forth.

Thus, with each successive error evaluator iteration, another $\alpha^{-7}\omega_{19-k}$ value is being shifted into R register $140_0$ and another $\alpha^{-3}\sigma_{20-k}$ value is being loaded into a register $120_0$, as well as already-computed $\alpha^{-7}\omega_{19-k}$ values being shifted (in parallel) rightward to R registers 140 in adjacent slices and already-computed $\alpha^{-3}\alpha_{20-k}$ values being serially shifted rightward to $\sigma$ registers 120 in adjacent slices. Moreover, the shifting of the $\sigma$ registers 120 rightward during each successive error evaluator iteration results in a different a value in register $SIG_{20}$, so that Phase A can be performed for each of the contents of the $\sigma$ registers 120 as generated in Phase B of the error locator iteration.

Thus, the twenty error evaluator iterations for a codeword serve, e.g., to put $\alpha^{-7}\omega(x)$ [$\omega(x)$ being the error evaluator polynomial] in the R registers 140 and to put $\alpha^{-3}\sigma(x)$ [$\sigma(x)$ being the error locator polynomial] in the $\sigma$ registers 120. The twenty error evaluator iterations for a codeword are performed preparatory to the correction operation shown as event 804 in FIG. 8.

OPERATION: CORRECTION OPERATION

The correction operation for a codeword, depicted as event 804 in FIG. 4, basically involves conducting a search (e.g., a Chien search) for the roots of the error locator polynomial, and then using error generator 110 upon obtaining the roots to generate an error pattern ERR to be utilized for correcting the codeword.

At the start of the correction operation for a codeword (shown as event 804 in FIG. 4), the R registers 140 contain $\alpha^{-7}\omega(x)$ and the SIG registers (i.e., σ registers 120) contain $\alpha^{-3}\sigma(x)$. During each clock of the Chien search, the R registers 140 are clocked with feedback ($\alpha^{-(L+k)}$) via multiplier 144 as applied by selector 142, and the SIG registers 120 are clocked with feedback ($\alpha^{-k}$) via multiplier 127. An error location is detected when, during the Chien search, the sum of the SIG registers 120 is determined by register summation circuit 106 (see FIG. 18) to be zero.

When an error location is detected, the error pattern ERR is generated by error generator 110. The error pattern ERR=DVD/DVR, where DVD is the sum of the R registers 140 and DVR is the sum of the odd numbered SIG registers 120. It is this error pattern ERR that is generated during the correction operation for a codeword, as described in more detail below. For each detected error location, the correction operation requires four clocks.

Since an error location is detected when the sum of the SIG registers 120 is 0, the sum of the SIG registers 120 is obtained by operating MUXes 1812 and 1814 so that odd and even SIG registers are summed by main adder 1800 (see FIG. 18). DVR, the sum of the odd numbered SIG registers 120, is obtained by operating MUX 1812 to select only the odd SIG registers for input to adder 1802. DVD, the sum of the R registers 140, is obtained by operating MUXes 1812 and 1814 so that odd and even SIG registers are summed by main adder 1800 (see FIG. 18).

The DVR is loaded (all eight bits in parallel) into ACC (i.e., accumulation shift registers 200H, 200L). The DVR is then applied on line ACC to each of inverse look up tables (LUT) 260(1) and (2) for each of four clocks. In practice the inverse look up tables (LUT) 260(1) and (2) are each fashioned to produce $\alpha^4$ times the inverse of the input thereto (i.e., 262(1) and 262(2) are built into tables 260(1) and 260(2), respectively). At each of the four clocks the inverse look up tables (LUT) 260(1) and (2) both output a bit of the inverse of the divisor (in β basis representation). Each of the inverse look up tables (LUT) 260(1) and 260(2) output four bits in serial (lowest order bit first), one bit per clock. The output from inverse look up table (LUT) 260(1) is applied to line DVR_H_BIT; to adder 272; and to register 274(1). The output from inverse look up table (LUT) 260(2) is applied to adder 272. The adder 272 adds the output from inverse look up table (LUT) 260(1), the sum from summer 280 (which adds the last two bit positions in register 274(1)), and the output from inverse look up table (LUT) 260(1) to produce the serial signal DVR_L_BIT. In similar manner as with the quantity including the inverse of the prior discrepancy as discussed above, the output of the DVR, two bits at a time (a bit per clock on each of lines DVR_H_BIT and DVR_L_BIT) is in a basis representation with highest order bit leading.

The inverse of the divisor DVR (now in a basis representation, serially presented two bits at a time with lowest order bit leading) is applied on line DVR_L_BIT to AND gate 306 and on line DVR_H_BIT to AND gate 306. The DVD value is applied (eight bits in parallel) to beta-to-alpha conversion circuit 310 for conversion to alpha basis. Since the inverse look up tables (LUT) 260(1) and (2) each produce $\alpha^4$ times the inverse, the inversion/multiplication by error generator 110 results in the proper error pattern being output from ERR register 300 on line ERR.

OPERATION: CRC GENERATION OPERATION

The CRC and remainder generator 69 is described above with respect to FIG. 7. The CRC and remainder generator 69 operates in similar manner to fast correction subsystem 60, except that the data is not interleaved.

During a time period known as "data time", MUXes 724 feeding adders 722 in each section 720 cause the adders 722 to be connected in a forward chain. During a time period known as "CRC time", MUXes 724 cause the adders 722 to be connected in a backward chain.

During a write mode of CRC time, the output of adder $722_0$ of section $720_0$ is inverted by inverter 710. The inverted output of adder $722_0$ is optionally added to the Logical Block Address (on line LBA) at adder 706 to produce the CRC bytes. These CRC bytes generated by CRC and remainder generator 69 are multiplexed with DATA_IN by selector 702 to produce DATA_OUT. In addition, these CRC bytes output by adder 708 are also shifted into the registers register 730, beginning first with register $730_5$ by virtue of application via MUX 760.

During a read mode of CRC time, re-generated CRC bytes are added to the CRC bytes acquired from the storage media or channel to produce a CRC remainder. The CRC remainder is shifted into the registers 730, starting with register $730_0$. After completion of the CRC time, the registers $730_0–750_5$ contain the CRC remainder bytes. When there are less than six CRC remainder bytes, the lower numbered registers 730 will contain zeros. If the LBA was included during the write mode but not included during the read mode, then the registers 730 will contain the CRC remainder bytes plus the LBA. If there are no errors, then registers 730 will contain only the LBA. During OFFLOAD, the register 730 are circularly shifted left, so that the CRC remainder bytes can be applied from register $730_0$ onto line CRC. After OFFLOAD the registers 730 are unchanged.

OPERATION: ERASURE CORRECTION OPERATION

When there are n>0 erasures, the first n Berlekamp-Massey iterations are used to generate the erasure locator polynomial, leaving it in the 0 registers 120 (i.e., the SIG registers). That is, $$SIG = \prod_{k=0}^{n-1} (1 + \alpha^{L_k} x),$$

where $L_k$ are the erasure locations. To do this, during the phase A, the τ update is:

$$\tau^{(n)}(x) = x * (\tau^{(n-1)}(x)) \qquad \text{Equation 30.}$$

The τ update is accomplished in one clock time by having $\tau^{(n-1)}(x)=0$ and asserting the signal ERA_TIME (see, e.g., FIG. 3). The σ registers 120 are multiplied by on that clock, as usual. During Phase B the desired a update is as shown by Equation 31.

$$\sigma^{(n+1)}(x) = \sigma^{(n)}(x) * (1 + \alpha^L x) \qquad \text{Equation. 31.}$$

Equally as good is:

$$\sigma^{(n+1)}(x) = \alpha^{-1}\sigma^{(n)}(x) * (1+\alpha^L x) = \alpha^{-1}\sigma^{(n)}(x) + \alpha^{L-1} x \sigma^{(n)}(x) \qquad \text{Eqn. 32.}$$

After Phase A the σ registers 120 are left with $\alpha^{-1}\sigma^{(n)}(x)$ and the τ registers 130 have $x\sigma^{(n)}(x)$. This results in Equation 33.

$$\text{SIG}_{k+1} = \text{SIG}_k + \alpha^{L-1} T_k \qquad \text{Equation 33.}$$

The T multiplication yields the desired product times $\alpha^{-3}$, as shown in Equation 34:

$$\text{SIG}_{k+1} = \text{SIG}_k + \alpha^{-3}(\alpha^{L+2} T_k) \qquad \text{Equation 34.}$$

The foregoing is accomplished by loading $\alpha^{L+2}$ into MAK register 210 (see input $\alpha^L$ in FIG. 4) during Phase A, and then performing the usual iteration during Phase B. On the last of the four clocks of Phase B the $\tau$ registers 130 are reset.

An important aspect of the present invention is provision of an error correction circuit which implements the general recursion rules (e.g., iteration equations) of the present invention to accomplish the following three actions during error locator iterations: (1) generating the current discrepancy $d_n$; (2) updating $\sigma_{n+1}$ using $\sigma^n$, $\tau^n$, and $d_n$, while computing $d_n^{-1}$; (3) updating $\tau^{n+1}$ using $\sigma^{n+1}$, $\tau^n$, and $d_n^{-1}$. As stated above and repeated below for convenience, the general recursion rules for the present invention are:

$$\tau^{(n)}(x) = x^*(\tau^{(n-1)}(x) + (\alpha^d d_{n-1})^{-1} \sigma^{(n)}(x) \text{CHANGE\_L} \qquad \text{Eqn. 1.}$$

$$\sigma^{(n+1)}(x) = \alpha^d(\sigma^{(n)} - d_n \tau^{(n)}) = \alpha^d \sigma^{(n)}(x) - \alpha^d d_n \tau^{(n)}(x) \qquad \text{Eqn. 2.}$$

(with d not equal to zero in Eqn. 1 and Eqn. 2). The specific recursion rules (for the illustrated embodiment which are a special case of the general recursion rules with d=−4) are:

$$\tau^{(n)}(x) = x^*(\tau^{(n-1)}(x) + \alpha^{-3}(((\alpha^{-4}(\alpha^{-3} d_{n-1})^{-1} \text{CHANGE\_L}) \sigma^{(n)}(x) \qquad \text{Eqn. 1A.}$$

$$\sigma^{(n+1)}(x) = (\alpha^{-4} \sigma^{(n)}(x) - (\alpha^{-3}((\alpha^{-3} d_n) \alpha^2(\tau^{(n)}(x))) \qquad \text{Eqn. 2A.}$$

The standard (generic) Berlekamp-Massey algorithm (see Equations 3–5) requires additional registers to save the previous value of σ since the updating of τ according to the generic algorithm utilizes the previous value of σ at a point at time at which the previous value of σ is otherwise not available (an update σ having already been computed). The recursion rules utilized by the present invention overcome the requirement of having extra registers, e.g., for saving the previous σ value, by updating $\tau^n$ (during Phase A) using the already updated value σ (the value σ having been updated during Phase B of the previous iteration).

Moreover, whereas the decoder of U.S. Pat. No. 5,446,743 required two syndrome registers per slice (e.g., a syndrome register and a modified syndrome register) and thus a total of four types of registers per slice, the fast correction subsystem 60 of the present invention need have only one syndrome register per slice. In the decoder of U.S. Pat. No. 5,446,743, the syndromes were multiplied by α feedback during each clock of the multiplication to obtain $d_n$, requiring that the original syndrome be saved in a special register. In the fast correction subsystem 60 of the present invention, on the other hand, the $\alpha^k$ term in the general recursion rules (with k not equal to zero) advantageously allows the σ registers to be multiplied by $\alpha^j$ on each clock of Phase A of an error locator iteration so that the syndromes do not have to be multiplied by α to obtain $d_n$. Thus, if there are n clocks per phase (i.e., the multiplications take n clocks per multiply), then k=nj and the σ registers are multiplied by $\alpha^k$ during Phase A when $d_n$ is generated. Such being the case, an additional register for syndromes is not required, meaning that only three types of registers (i.e., registers 120, 130, and 140) are required per slice for fast correction subsystem 60 of the present invention.

Figure 10A:
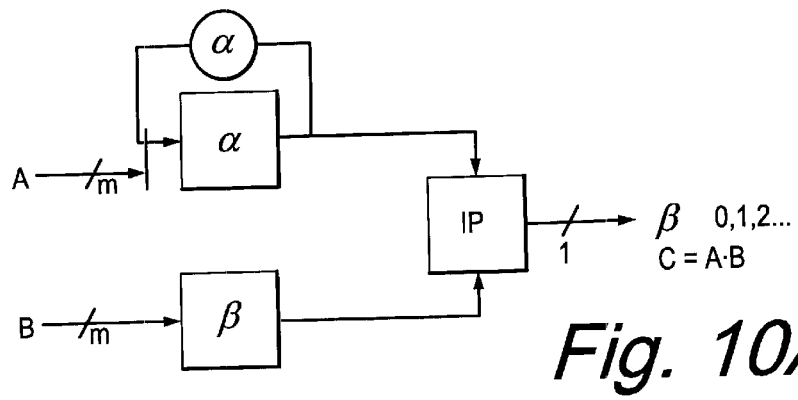
FIG. 10A–FIG. 10D are schematic diagrams of various types of parallel-in/serial out (PISO) multipliers.
Figure 10B:
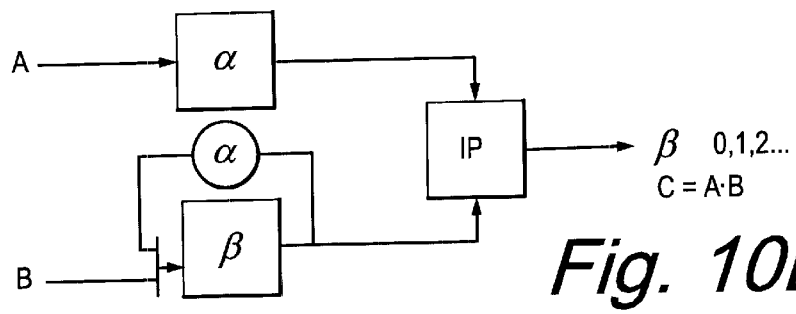
Figure 10C:
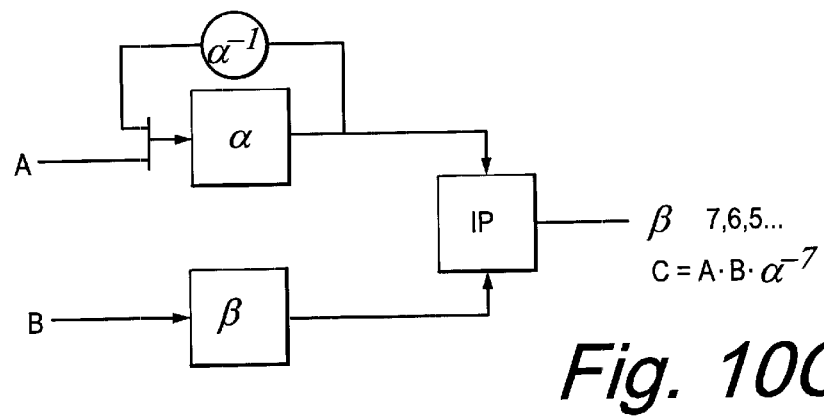
Figure 10D:
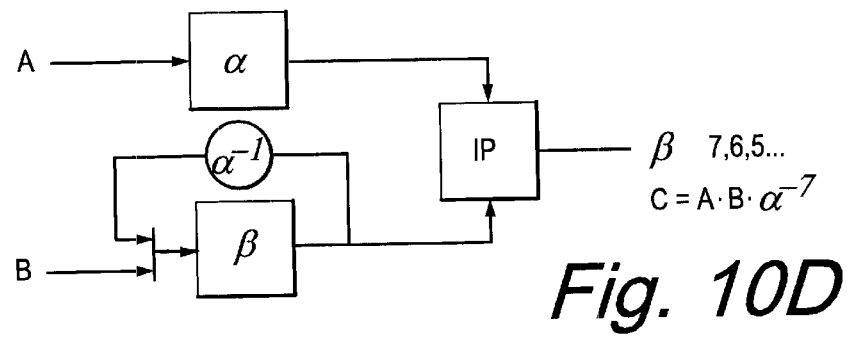

FIG. 10A–FIG. 10D show four basic types of parallel-in/serial-out multipliers (PISOs), each shown having two m-bit parallel inputs A and B (in α basis and β basis representations, respectively) and producing a serial product C (in β basis representation). Whereas the feedback elements of the PISOs of FIG. 10A and FIG. 10B have α multipliers, the feedback elements of the PISOs of FIG. 10C and FIG. 10D have $\alpha^{-1}$ multipliers. The PISOs of FIG. 10A and FIG. 10B generate C=A·B; the PISOs of FIG. 10C and FIG. 10D generate C=A·B·$\alpha^{-7}$. It is to be noted that the exponent of α in the product generated by the PISOs of FIG. 10C and FIG. 10D is m−1. The PISOs of FIG. 10A and FIG. 10B output the inner product C with lowest order bit leading (e.g., in the bit order 0, 1, 2, . . . etc.). The PISOs of FIG. 10C and FIG. 10D output the inner product C with highest order bit leading (e.g., in the bit order 7, 6, 5, . . . etc.). For the PISO of FIG. 10C and FIG. 10D, a constant multiplier of $\alpha^7$ could be inserted on any parallel input or parallel with the output to produce C=A·B.

Figure 11A:
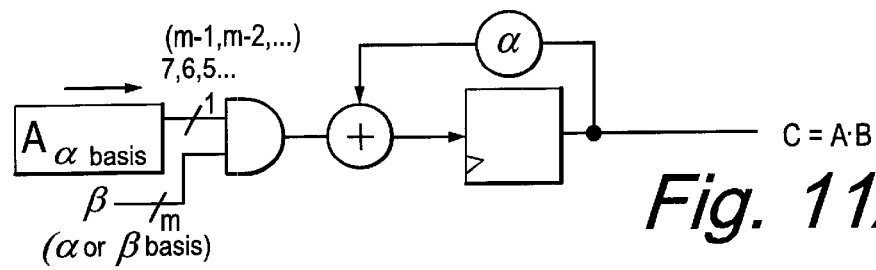
FIG. 11A–FIG. 11D are schematic diagrams of various types of serial-in/parallel-out (SIPO) multipliers.
Figure 11B:
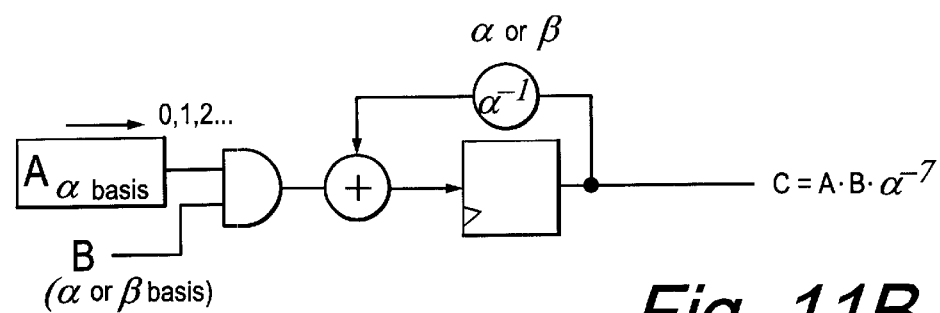
Figure 11C:
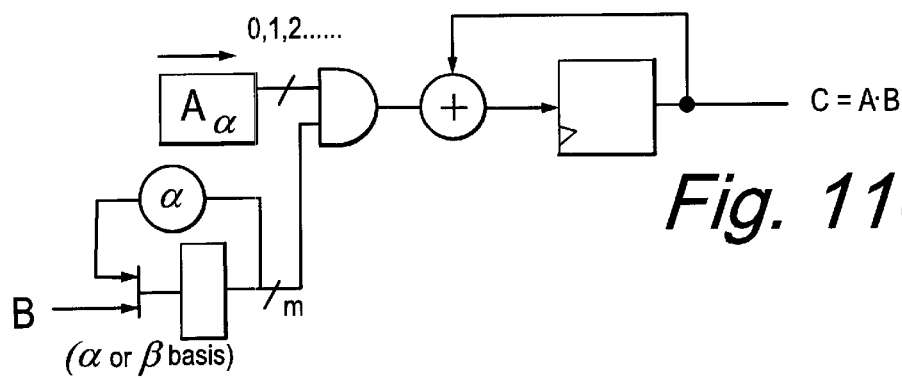
Figure 11D:
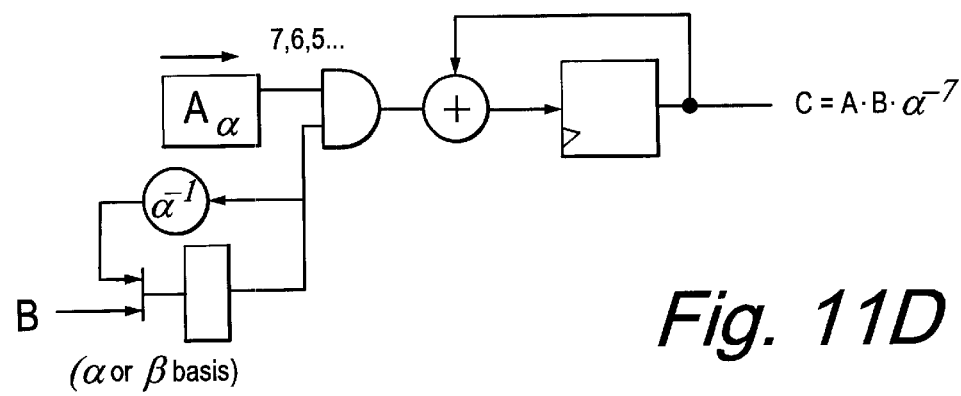

FIG. 11A–FIG. 11D show four basic types of serial-in/parallel-out multipliers (SIPOs), each shown having two serial inputs A and B (with input A being in α basis representation and input B being in either α or β basis representation) and producing a parallel product C (in same basis representation as input β). The SIPOs of FIG. 11A and FIG. 11B have feedback elements around the register in which the inner product is accumulated; the SIPOs of FIG. 11C and FIG. 11D have feedback elements around the B input register. Whereas the feedback elements of the SIPOs of FIG. 11A and FIG. 11C have α multipliers, the feedback elements of the SIPOs of FIG. 11B and FIG. 11D have $\alpha^{-1}$ multipliers. The SIPOs of FIG. 11A and FIG. 11C generate C=A·B; the SIPOs of FIG. 11B and FIG. 11D generate C=A·B·$\alpha^{-7}$ (it again being noted that the exponent of α in the product generated by the SIPOs of FIG. 11B and FIG. 11D is m−1). For the SIPO of FIG. 11B and FIG. 11D, a constant multiplier of α could be inserted on any parallel input or parallel with the output to produce C=A·B.

Figure 12:
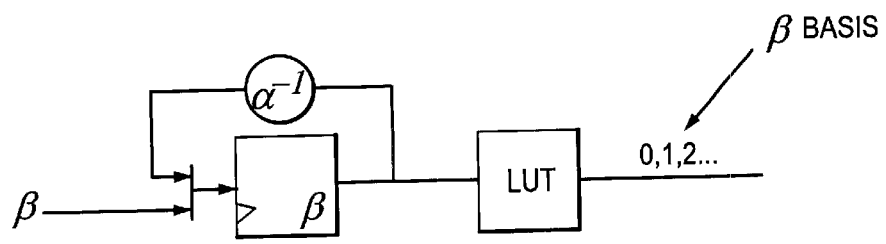
FIG. 12 is a schematic diagram of a prior art inversion circuit.

The fast correction subsystem 60 of the present invention uses a prior art inversion technique, generally depicted in FIG. 12, disclosed in Whiting, "Bit-Serial Reed-Solomon Decoders in VSLI", 1984. The inversion circuit of FIG. 12 employs an eight bit-in/one bit-out lookup table (LUT) to produce an inverse with β representation. In order to output two bits of the inverse per clock, the inverse generator 104 of the present invention (see FIG. 5) employs two lookup tables 260(1) and 260(2). Moreover, the fast correction subsystem 60 of the present invention overlaps inversion and multiplication for updating the τ registers (i.e., conducts the inverse and multiplication operations in the same phase of an error locator iteration). Accordingly, the present invention employs a SIPO for the τ register updating multiplication. Further, since the serial input must be in α basis representation, a basis conversion circuit is employed at the output of the inverse lookup tables 260(1) and 260(2) of the present invention (see FIG. 5). The particular structure of the basis conversion circuit is dependent upon the particular field generator utilized, the basis conversion circuit shown in FIG. 5 being for the particular field generator used for the example implementation.

Since the inversion performed by inverse generator 104 is to produce the inverse in serial with highest order bit leading, the τ update multiplier (shown as multiplier 180 in FIG. 3A) is a SIPO multiplier. Since the SIPOs of FIG. 11A and FIG. 11B have feedback multipliers around their accumulating registers, the SIPOs of FIG. 11A and FIG. 11B would require an additional register for maintaining an inviolate value of τ. Accordingly, the fast correction subsystem 60 of the present invention employs the basic SIPO multiplier of FIG. 11D having the general form shown in FIG. 13 as the τ register update multiplier 180 of the present invention. Using the SIPO multiplier of FIG. 11D also means that the value in the $\tau$ register is in the same basis as the value in the $\sigma$ register.

Figure 13:
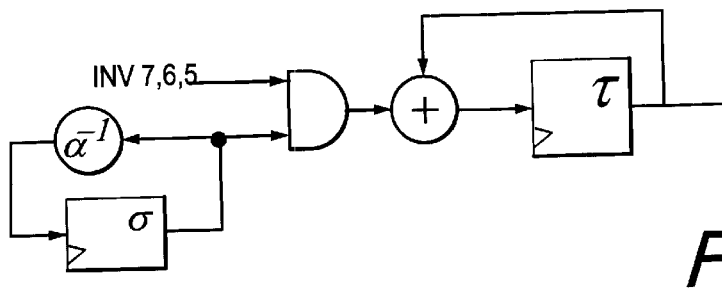
FIG. 13, FIG. 13A, and FIG. 13B are schematic diagrams showing transformation of a basic SIPO multiplier for use as a σ register-updating multiplier for the fast decoder of the error correction system of FIG. 1.
Figure 13A:
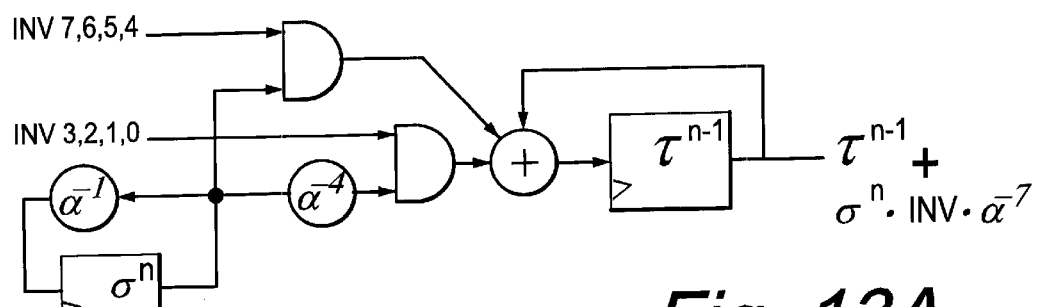
Figure 13B:
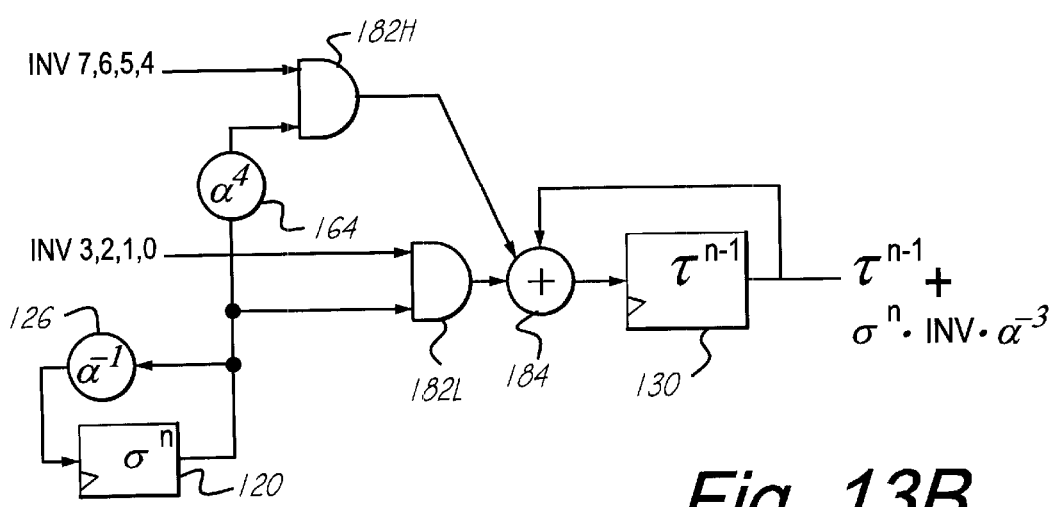

Since the fast correction subsystem 60 of the present invention processes two bits per clock, the basic SIPO multiplier of FIG. 13 becomes that shown in FIG. 13A, with two gates for receiving two respective serial input streams. Then, modifying the SIPO multiplier even further, as in the particularly illustrated example for multiplier 180, for convenience the output of the $\sigma$ register can be multiplied by $\alpha^4$ in the manner shown in FIG. 13B, yielding the product $\sigma \cdot INV \cdot 60^{-3}$. Since the SIPO multiplier of FIG. 13B corresponds to that shown as multiplier 180, e.g., in FIG. 3A, reference numerals from FIG. 3A have been inserted in FIG. 13B. It will be understood in FIG. 13B that the bits 7, 6, 5, 4 of the inverse are obtained from gate 152 and the bits 7, 6, 5, 4 of the inverse are obtained from gate 154.

The general recursion rule of the invention for updating $\tau$ requires the following calculation: $\tau^{(n-1)}(x)+(\alpha^d d_{n-1})^{-1}\sigma(x)^{(n)}$ (see Equation 1). This implies Equation 35:

$$\tau^{(n-1)}+\sigma^{(n)}\cdot INV\cdot\alpha^{-3}=\tau^{(n-1)}+(\alpha^d d_{n-1})^{-1}\sigma^{(n)} \qquad \text{Equation 35.}$$

Equation 35 further implies Equation 36:

$$INV=(\alpha^d\cdot(\alpha^{-3}d_{n-1}))^{-1} \qquad \text{Equation 35.}$$

Figure 14:
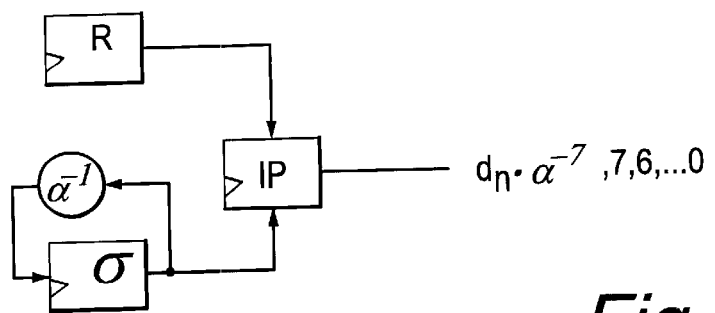
FIG. 14, FIG. 14A, and FIG. 14B are schematic diagrams showing transformation of a basic SIPO multiplier for use as a discrepancy-producing multiplier for the fast decoder of the error correction system of FIG. 1.
Figure 14A:
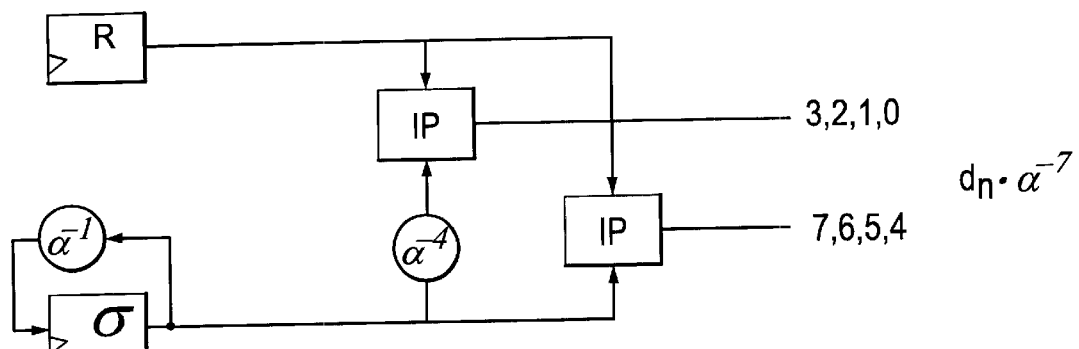
Figure 14B:
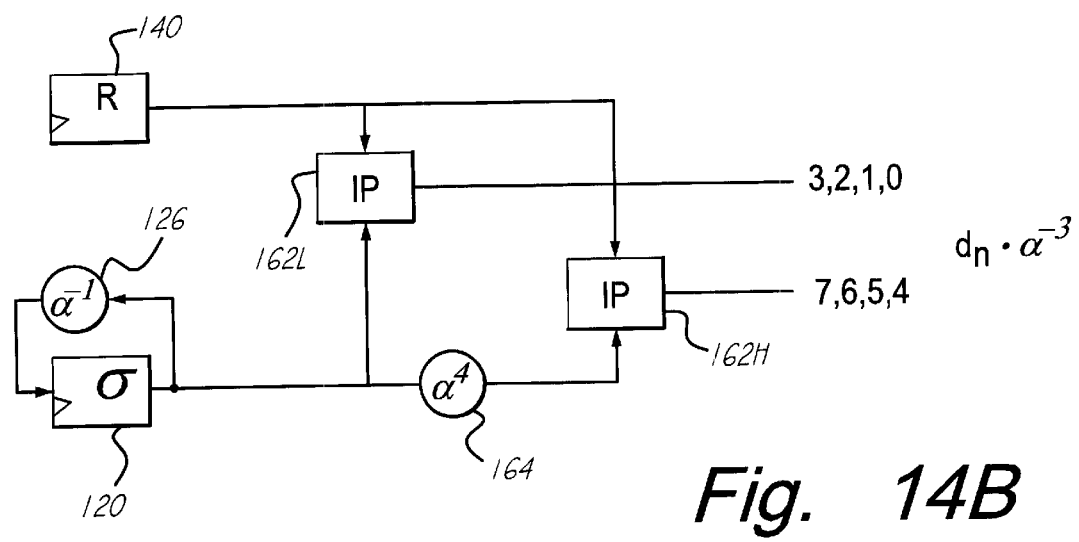

The structure of $\tau$ register-updating multiplier 180 having been described above, discussion now turns to the multiplier 160 which generates the current discrepancy $d_n$. While any of the multipliers of FIG. 10A through FIG. 10D or FIG. 11A through FIG. 11D could be utilized, in the example implementation (see, e.g., FIG. 3A) the PISO multiplier of FIG. 10D is chosen, taking the implementation shown generally in FIG. 14. The selection of the PISO multiplier of FIG. 10D is helpful in view of the fact that both multipliers share the $\sigma$ register 120, feedback 126 and $\alpha^4$ multiplier 164. Since the fast correction subsystem 60 of the present invention handles two bits per clock, the basic PISO multiplier of FIG. 14 is augmented as shown in FIG. 14A to have two inner product (IP) circuits, outputting two serial streams with highest order bits leading of the value $d_n\cdot\alpha^{-7}$. FIG. 14B shows a further evolution of the PISO multiplier of FIG. 14A, showing particularly multiplying the outputs of the $\sigma$ register by $\alpha^4$, thereby obtaining the two serial streams with value $d_n\cdot\alpha^{-3}$. In view of the correspondence of the PISO multiplier of FIG. 14B to the discrepancy-producing multiplier 160 of the invention (see, e.g., FIG. 3B), reference numerals from the discrepancy-producing multiplier 160 of FIG. 3B have been supplied in the PISO multiplier of FIG. 14B.

In the operation of the fast correction subsystem 60 of the present invention, after Phase A of an error locator iteration the $\sigma$ registers contain $\alpha^{-4}\sigma$, which implies that d=−4 in the recursion rules of the present invention for the particularly illustrated embodiment. Thus, using d=−4 in the general recursion rules of the invention as set forth in Equation 1 and Equation 2 result in the specific recursion rules employed for the example fast correction subsystem 60 illustrated in FIG. 3A, etc.

Figure 15:
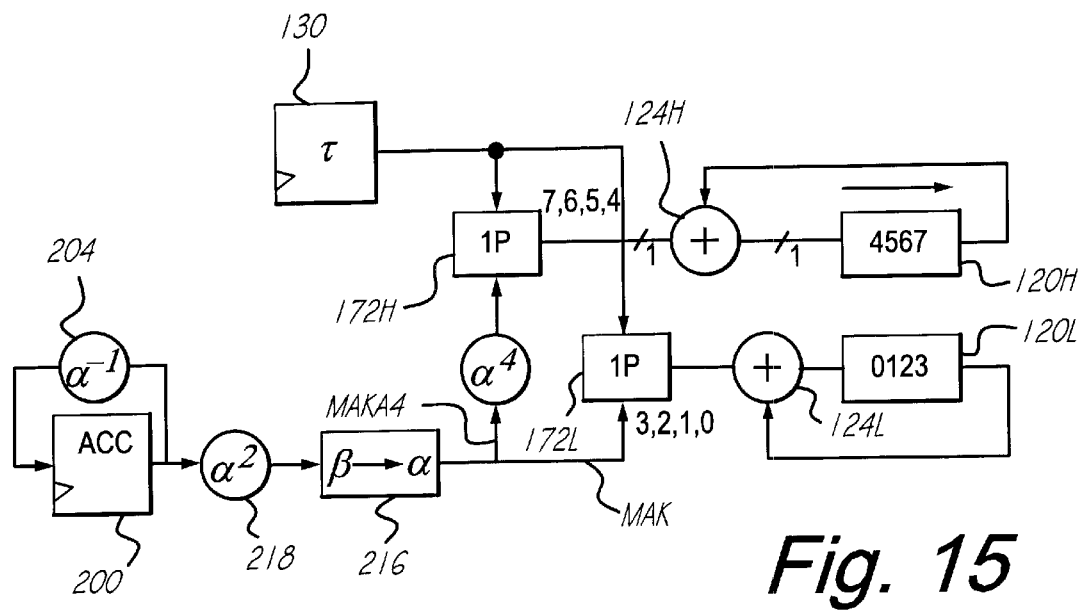
FIG. 15 is a schematic diagram showing a σ register-updating multiplier for the fast decoder of the error correction system of FIG. 1.

While any of the PISO multipliers of FIG. 10A–10D or the SIPO multipliers of FIG. 11A–FIG. 11D could be chosen for the $\sigma$ register-updating multipliers 170 of the present invention, the PISO multiplier of FIG. 10C is chosen for the illustrated implementation of FIG. 3A. FIG. 15 shows the PISO multiplier of FIG. 10C implemented in the context of fast correction subsystem 60, processing two bits per clock and with a multiplication by $\alpha^4$. In the PISO multiplier shown in FIG. 15, the accumulator register is accumulation shift registers 200H, 200L shown in FIG. 4, which initially contains $d_n\cdot\alpha^{-3}$) The basis converter 216 is utilized because the content of the $\tau$ register and $d_n$ are both in $\beta$ representation, whereas the PISO multiplier of FIG. 10C requires one of the inputs to be in $\alpha$ basis representation. When d=−4, the recursion rule of Equation 2 requires $\sigma^{(n+1)}(x)=\alpha^d(\sigma^{(n)}-d_n\tau^{(n)})=\alpha^{-4}\sigma^{(n)}(x)-\alpha^{-4}d_n\tau^{(n)}(x)$. Therefore, the $\sigma$ register-updating multiplier 170 of FIG. 15 must yield $(d_n\alpha^{-3})\alpha^2\cdot\tau^{(n)}\cdot\alpha^{-3}=\alpha^{-4}d_n\tau^{(n)}$. Thus, in the $\sigma$ register-updating multiplier 170 of FIG. 15, the $\alpha^2$ multiplier 218 is inserted to match the recursion rules.

Figure 16:
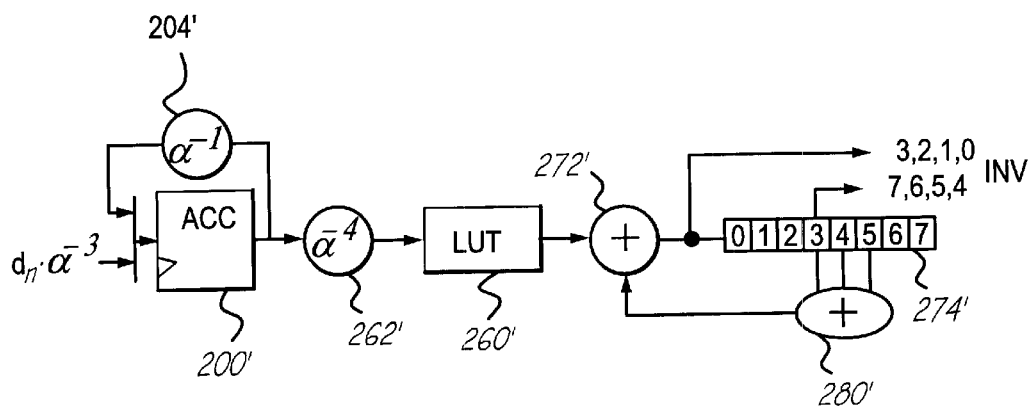
FIG. 16 is a schematic diagram showing an alternate embodiment of an inversion generation circuit according to an embodiment of the invention.

It will be observed from FIG. 5 that, in a high speed version of the fast correction subsystem 60 of the invention, the inverse is obtained at a rate of two bits per clock (there being four clocks per phase) using two lookup tables 260(1) and 260(2). In an alternate embodiment, illustrated in FIG. 16, an eight bit inverse can be obtained in eight clocks using a single lookup table (in the basic manner shown in FIG. 12 [e.g., not using two lookup tables]). The alternate implementation shown in FIG. 16 has an accumulation shift register 200' which initially has the value $d_n\cdot\alpha^{-3}$, and with feedback multiplier 204' (having a multiplier of $\alpha^{-1}$). The contents of the accumulation shift register 200' are applied to multiplier 262' (which multiplies by $\alpha^{-4}$) before being used for lookup table (LUT) 260'. The serial output of lookup table 260' is output as a first input to adder 272'. The output of adder 272' is fed serially into register 274', highest order bit leading. Selected bits from register 274', selected in accordance with the particular field generator polynomial employed, are added at adder 280'. The sum of adder 280' is applied as a second input to adder 272'. The sum of adder 272' is output as bits 3, 2, 1, and 0 of the inverse; bits 7, 6, 5, and 4 of the inverse are taken out of register 274'. Thus, obtaining an eight bit inverse in eight clocks using a single lookup table as shown in FIG. 16 is accomplished by generating $d_n$ (e.g., $d_n\cdot\alpha^{-3}$) during a first Phase A; generating the first four bits (bits 7, 6, 5, and 4) of $d_n^{-1}$ during Phase B; and then generating the last four bits (bits 3, 2, 1, and 0) of $d_n^{-1}$ during the next Phase A (and updating the $\tau$ registers using SIPOs).

If a Reed-Solomon corrector is pipelined, then the Berlekamp-Massey section typically passes the coefficients $\sigma(x)$ of the error locator polynomial and the coefficients ($\omega(x)$) of the error evaluator polynomial to another pipeline section for correction, while the next codeword arrives in the Berlekamp-Massey section. However, in a non-pipelined organization, the steps are done sequentially in a non-overlapped manner. In a non-pipelined organization it is advantageous to share circuitry as much as possible, e.g., to use the same circuit elements for accomplishing different functions. In this regard, by having an inverse generator 104 such as that shown in FIG. 5 with two lookup tables, the inverse discrepancy generator 104 can also be utilized for a division operation.

Figure 17A:
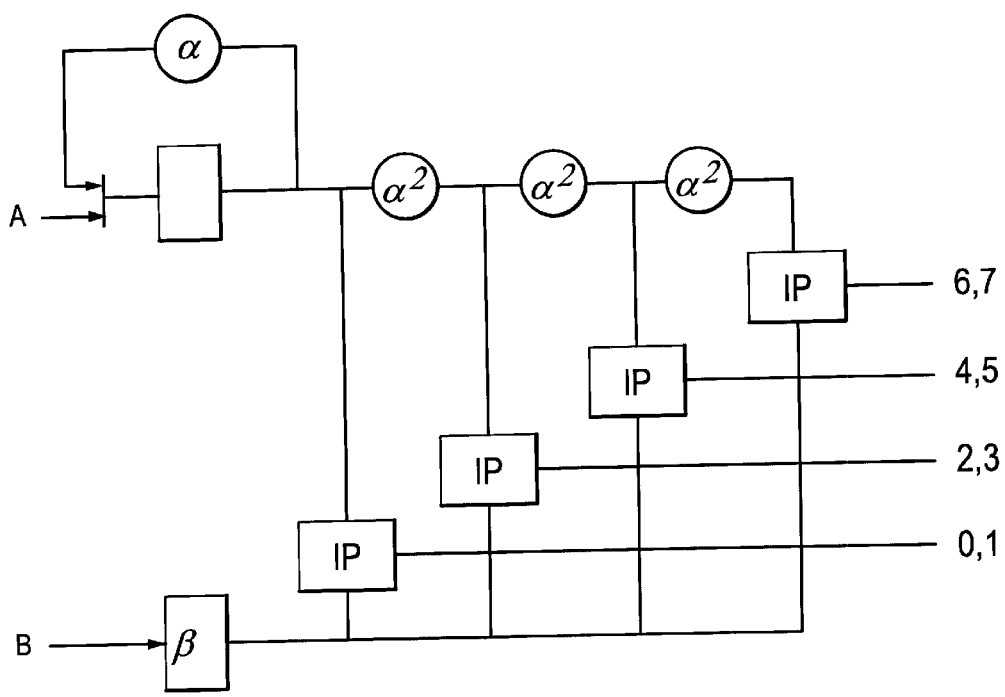
FIG. 17A and FIG. 17B are schematic diagrams showing examples of other multipliers which can be used in embodiments of the invention handling greater than 2 bits per clock.
Figure 17B:
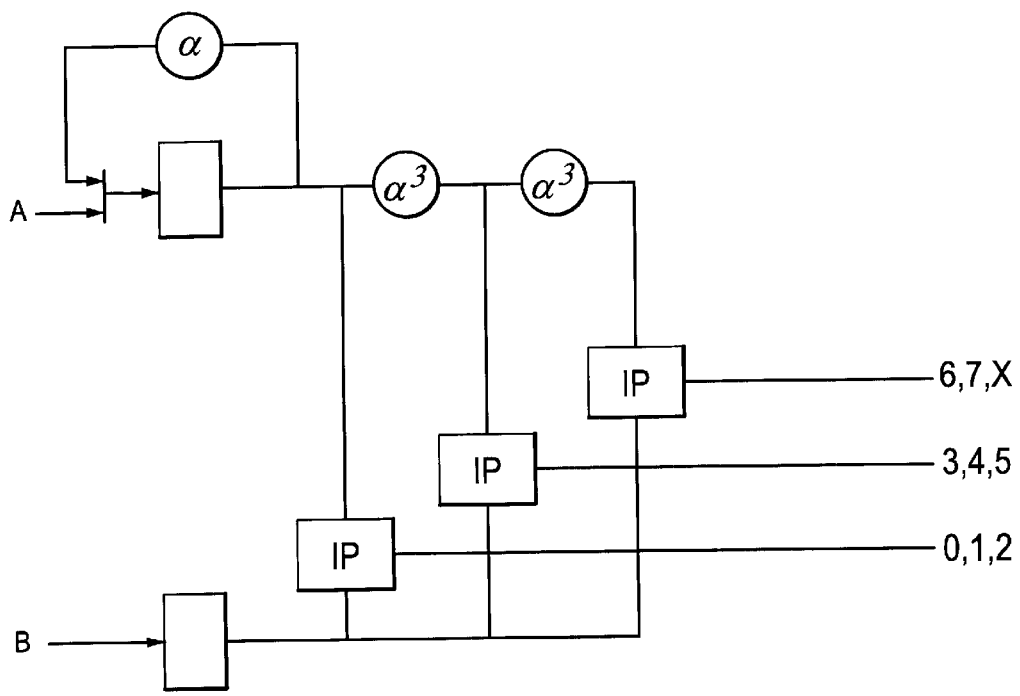

In the above regard, and as mentioned previously, the fast correction subsystem 60 of the present invention performs a division operation in four clocks for obtaining the error pattern ERR utilized for the correction (see, e.g., FIG. 6). By having the two inverse look up tables (LUT) 260, a serial inverse of a divisor can be obtained in four clocks, with the inverse then being used in a multiplication operation. Transformation of the divisor into its inverse results in a division operation being effectively performed via multiplication. In the operation of the inverse generator 104 and error generator 110, for each error generation the inverse DVR is output directly (as DVR_L_BIT and DVR_H_BIT) into the multiplier of FIG. 6, along with the other multiplication factor The fast correction subsystem 60 of the present invention processes two bits per clock, e.g., in various multiplication operations, it should be understood that a greater number of bits per clock can be processed in other embodiments. For example, FIG. 17A shows an example of the PISO multiplier of FIG. 10A which can be used in an embodiment which processes four bits per clock. The number of bits per clock can even be other than a power of two. In this regard, FIG. 17B shows an example of the is PISO a multiplier of FIG. 10A which can be used in an embodiment which processes three bits per clock.

The fast correction subsystem 60 of the present system uses a different inversion algorithm (e.g., different recursion rules) than that of U.S. Pat. No. 5,446,743, and for this (among other reasons) has each slice 100 performing each phase of its error locator iteration and error evaluation iteration in m/2 clocks rather than in m clocks, and with only three types of registers per slice. Moreover, fast correction subsystem 60 has certain structural differences, some of which are summarized below by way of example:

(1) The feedback around the σ registers 120L, 120H in each slice 100 is $\alpha^{-1}$ instead of α (see, e.g., feedback multiplier 126 in FIG. 3A).

(2) Multiplier 160 outputs two bits at a time, there being two inner product circuits 162L and 162H to produce two DN_BITs, i.e., DN_L_BIT from inner product circuit 162L and DN_H_BIT from inner product circuit 162H, respectively. The values DN_L_BIT and DN_H_BIT are produced high-order bit first, i.e. bits 7 & 3, then bits 6 & 2, etc. The values DN_L_BIT and DN_H_BIT from the slices 100 are added by adders 190, with the sums being shifted into accumulator & auxiliary multiplier 102.

(3) During phase A of an error locator iteration, the slices 100 receive a quantity including an inverse of the prior discrepancy two bits at a time, high order first, in alpha basis representation from the inverse generator 104 shown in FIG. 5. The inverse of the prior discrepancy is denoted as $d_{n-1}^{-1}$. The quantity including the inverse of the prior discrepancy is applied two bits at a time on respective lines INV_H_BIT and INV_L_BIT via gates 150 to τ register-updating multiplier 180 (see, e.g., FIG. 3A). The inversion is performed in Phase B of the previous error locator iteration.

(4) The multiplier 180, used e.g., for τ register-updating, receives two inputs:

(1) the first input, received serially, which is the quantity including an inverse of the prior discrepancy; and (2) the contents of the σ registers 120L, 120H (received in parallel). The output of the τ register-updating multiplier 180 is accumulated in the τ or T register 130. The contents of the τ register 130 is parallel shifted to the τ register 130 in the next slice on the last clock (5) FIG. 4 shows the accumulation shift registers 200H, 200L and the MAK (multiply by $\alpha^4$) register 210. FIG. 5 shows the bit order reversing circuit 274. FIG. 6 shows ERR register 300. The values in accumulation shift registers 200H, 200L and in bit order reversing circuit 274 are stored in bit-reversed order.

It should be understood that the principle of the present invention can operate in context of an interleaved correction system, with correction of one such interleave being described by the illustrated example.

Tables 2–23 describe example multiplier operations in accordance with examples of the present invention. In understanding Tables 2–3, X is a field element represented by a row vector where the high order bit is on the left. Each of the linear operators is of the form XT where T is the operator matrix. The result is a row vector representing the output field element where the high order bit is on the left. As an example, the matrix of Table 2 defines multiplication of an element in α representation by $\alpha^{-1}$. Output bit 7 is obtained by taking an inner product of the first column of T of Table 2 with X, i.e. O7=I0 (output bit 7 equals input bit 0). Also, O6=I7, O5=I6, O4=I5, O3=I4+I0, O2=I3+I0, O1=I2+I0, O0=I1. The $\alpha^{-1}$ FDBK block 26 in FIGS. 3 and 4 is obtained by taking the inner product of the last column of the matrix of Table 4 with the input, i.e. O=I7+I3+I2+I1.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

TABLE 1

BETA TO ALPHA BASIS REPRESENTATION CONVERSION

| Input Bits (B0–B7) in Beta Basis | Operation for Converting Corresponding Bit to Alpha Basis |
|---|---|
| B0 | B7 XOR B3 XOR B2 XOR B1 |
| B1 | B6 XOR B2 XOR B1 XOR B0 |
| B2 | B5 XOR B1 XOR B0 |
| B3 | B4 XOR B0 |
| B4 | B3 |
| B5 | B2 |
| B6 | B1 |
| B7 | B0 |

TABLE 2

T =
01000000
00100000
00010000
00001000
00000100
00000010
00000001
10001110
XT = X alpha^-1 (alpha rep)

TABLE 3

T =
11101000
01110100
00111010
00011101
10000000
01000000
00100000
00010000
XT = X alpha^4 (alpha rep)

TABLE 4

T =
00000001
10000000
01000000
00100000

TABLE 4-continued 00010001
00001001
00000101
00000010
XT = X alpha^-1 (beta rep)

TABLE 5

T =
00000010
00000001
10000000
01000000
00100010
00010011
00001011
00000101
XT = X alpha^-2 (beta rep)

TABLE 6

T =
00000101
00000010
00000001
10000000
01000101
00100111
00010110
00001011
XT = X alpha^-3 (beta rep)

TABLE 7

T =
00001011
00000101
00000010
00000001
10001011
01001110
00101100
00010110
XT = X alpha^-4 (beta rep)

TABLE 8

T =
00010110
00001011
00000101
00000010
00010111
10011101
01011000
00101100
XT = X alpha^-5 (beta rep)

TABLE 9

T =
00101100
00010110
00001011
00000101
00101110
00111011

TABLE 9-continued 10110001
01011000
XT = X alpha^-6 (beta rep)

TABLE 10

T =
01011000
00101100
00010110
00001011
01011101
01110110
01100011
10110001
XT = X alpha^-7 (beta rep)

TABLE 11

T =
10110001
01011000
00101100
00010110
10111010
11101100
11000111
01100011
XT = X alpha^-8 (beta rep)

TABLE 12

T =
01100011
10110001
01011000
00101100
01110101
11011001
10001111
11000111
XT = X alpha^-9 (beta rep)

TABLE 13

T =
11000111
01100011
10110001
01011000
11101011
10110010
00011110
10001111
XT = X alpha^-10 (beta rep)

TABLE 14

T =
10001111
11000111
01100011
10110001
11010111
01100100
00111101

TABLE 14-continued

00011110
XT = X alpha^-11 (beta rep)

TABLE 15

T =
00011110
10001111
11000111
01100011
10101111
11001001
01111010
00111101
XT = X alpha^-12 (beta rep)

TABLE 16

T =
00111101
00011110
10001111
11000111
01011110
10010010
11110100
01111010
XT = X alpha^-13 (beta rep)

TABLE 17

T =
01111010
00111101
00011110
10001111
10111101
00100100
11101000
11110100
XT = X alpha^-14 (beta rep)

TABLE 18

T =
11110100
01111010
00111101
00011110
01111011
01001001
11010000
11101000
XT = X alpha^-15 (beta rep)

TABLE 19

T =
11101000
11110100
01111010
00111101
11110110
10010011

TABLE 19-continued 10100001
11010000
XT = X alpha^-16 (beta rep)

TABLE 20

T =
11010000
11101000
11110100
01111010
11101101
00100110
01000011
10100001
XT = X alpha^-17 (beta rep)

TABLE 21

T =
10100001
11010000
11101000
11110100
11011011
01001100
10000111
01000011
XT = X alpha^-18 (beta rep)

TABLE 22

T =
01000011
10100001
11010000
11101000
10110111
10011000
00001111
10000111
XT = X alpha^-19 (beta rep)

TABLE 23

T =
10000111
01000011
10100001
11010000
01101111
00110000
00011111
00001111
XT = X alpha^-20 (beta rep)

What is claimed is:
1. A convolutional generator comprising:
a first set of registers;
a second set of registers;
a multiplier;
wherein the convolutional generator operates upon a codeword and syndromes generated for the codeword by using a first recursion rule to generate coefficients of an error locator polynomial σ(x) for the codeword in the first set of registers, the coefficients of the error locator polynomial being generated in the first set of registers using the multiplier, wherein the multiplier updates the first set of registers by multiplying contents $\tau^n(x)$ of the second set of registers by a current discrepancy quantity, the current discrepancy quantity including a current discrepancy $d_n$ and being derived from values stored in the first set of registers and syndromes, wherein the contents $\tau^n(x)$ of the second set of registers are updated using updated values $\sigma^n(x)$ of the first set of registers by the convolutional generator using a second recursion rule; wherein the first recursion rule is:

$$\sigma^{(n+1)}(x)=\alpha^d(\sigma^{(n)}-d_n\tau^{(n)})=\alpha^d\sigma^{(n)}(x)-\alpha^d d_n\tau^{(n)}(x)$$

the second recursion rule is:

$$\tau^{(n)}(x)=x^*(\tau_{(n-1)}(x)+(\alpha^d d_{n-1})^{-1}\sigma^{(n)}(x)\text{CHANGE\_L})$$

wherein CHANGE_L refers to a change in the length of a connection polynomial, and wherein d is non-zero.

2. The apparatus of claim 1, wherein the first recursion rule is:

$$\sigma^{(n+1)}(x)=(\alpha^{-4}\sigma^{(n)}(x))-(\alpha^{-3}d_n)(\tau^{(n)}(x))\alpha^{-1}=(\alpha^{-4}\sigma^{(n)}(x))-(\alpha^{-3}((\alpha^{-3}d_n)\alpha^2)(\tau^{(n)}(x))$$

the second recursion rule is:

$$\tau^{(n)}(x)=x^*(\tau^{(n-1)}(x)+\alpha^{-3}(((\alpha^{-4}(\alpha^{-3}d_{n-1}))^{-1}\text{CHANGE\_L})\sigma^{(n)}(x))).$$

3. The apparatus of claim 1, wherein $d_{n-1}^{-1}$ is an inverse of a prior discrepancy, wherein the second recursion rule is implemented by a multiplier which updates the second set of registers, and wherein a quantity including the inverse of the prior discrepancy is received two bits at a time at the multiplier which updates the second set of registers.

4. The apparatus of claim 3, wherein the quantity including the inverse of the prior discrepancy is received in α basis representation at the multiplier which updates the second set of coefficient registers.

5. The apparatus of claim 3, wherein bits of each nibble of the quantity including the inverse of the prior discrepancy are serially received in most significant bit order.

6. The apparatus of claim 1, wherein the registers included in the first set of registers have an $\alpha^{-1}$ multiplier connected between an input and output of the registers.

7. The apparatus of claim 1, wherein the codeword contains m-bit symbols, and wherein the generator performs plural error locator iterations for determining the coefficients of the error locator polynomial, each error locator iteration having no more than m/2 clock cycles.

8. The apparatus of claim 7, further comprising a third set of registers which obtain coefficients of an error evaluator polynomial, wherein the generator performs plural error evaluator iterations for determining the coefficients of the error evaluator polynomial, each error locator iteration having no more than m/2 clock cycles.

9. The apparatus of claim 8, wherein m is 8.

10. The apparatus of claim 1, wherein the generator comprises plural slices, wherein the first set of registers comprises a high order nibble coefficient register and a low order nibble coefficient register for each slice.

11. The apparatus of claim 10, further comprising for each slice a discrepancy-producing multiplier which multiplies a selected one of the syndromes by the contents of the high order nibble coefficient register and by the contents of the low order nibble coefficient register.

12. The apparatus of claim 11, wherein the discrepancy-producing multiplier multiplies the contents of the higher order nibble coefficient register by a factor $\alpha^4$ prior to multiplying by the selected one of the syndromes.

13. The apparatus of claim 11, further comprising an accumulator, and wherein the discrepancy-producing multiplier outputs an inner product two bits at a time to the accumulator.

14. The apparatus of claim 13, further comprising an $\alpha^{-1}$ multiplier connected between an input and output of the accumulator.

15. The apparatus of claim 13, wherein bits of each nibble of the inner product is serially output by the discrepancy-producing multiplier in most significant bit order.

16. The apparatus of claim 13, wherein the accumulator accumulates the current discrepancy quantity, and wherein the current discrepancy quantity is $\alpha^{-3}d_n$.

17. The apparatus of claim 13, wherein the generator further comprises an inverse generator which receives the current discrepancy quantity in β basis representation from the accumulator and which serially outputs a quantity including the inverse of a prior discrepancy in a basis representation, the inverse of a prior discrepancy being $d_{n-1}^{-1}$.

18. The apparatus of claim 17, wherein the inverse generator serially outputs each nibble of the quantity including the inverse of the prior discrepancy in most significant bit order.

19. The apparatus of claim 17, wherein the inverse generator comprises:

a first inverse look up table which receives a parallel input value and which serially outputs a first value in β basis representation in least significant bit order;

a second inverse look up table which receives the parallel input value and serially outputs a second value in β basis representation in least significant bit order;

a first shift register which receives the serially output first value from the first inverse look up table;

a summer forms a summation of preselected bit positions of the first shift register;

an adder which adds (1) the first value; (2) the second value; and (3) summation of the summer;

a second shift register which receives serially the output of the adder; and wherein contents of the first shift register comprise higher order bits of an inverse of the input value in a basis representation; and contents of the second shift register comprise lower order bits of an inverse of the input value in a basis representation.

20. The apparatus of claim 1, further comprising:

an accumulator wherein the current discrepancy quantity is accumulated;

an inverse generator which receives the current discrepancy quantity in β basis representation and serially outputs a quantity including the inverse of a prior discrepancy in α basis representation, the inverse of a prior discrepancy being $d_{n-1}^{-1}$.

21. A convolutional generator comprising:

a first set of registers used to accumulate coefficients of an error locator polynomial for a codeword;

a second set of registers used to update the first set of registers;

a third set of registers into which syndromes for the codeword are at least initially loaded;

a first multiplier which serially outputs, two bits at a time, an inner product of the syndromes in the third set of registers and contents of the first set of registers;

an accumulator connected to the first multiplier for accumulating an accumulation value therein;

an inverse generator which receives the accumulation value in β basis representation and which serially outputs, two bits at a time, an α basis representation of an inverse of the accumulation value;

a second multiplier which uses the accumulation value and contents of the second set of registers to update the first set of registers and a third multiplier which uses the a basis representation of the inverse of the accumulation value and contents of the first set of registers to update the second set of registers.

22. The apparatus of claim 21, further comprising plural slices, each slice comprising:
one of the plural first coefficient register pairs;
one of the second set of coefficient registers;
a slice portion of the first multiplier;
a slice portion of the second multiplier; and,
a slice portion of the third multiplier.

23. The apparatus of claim 21, wherein the first multiplier outputs bits of two nibbles of the inner product in most significant bit order.

24. The apparatus of claim 21, wherein the accumulation value has a factor $\alpha^{-3}$.

25. The apparatus of claim 21, wherein the accumulation value includes a current discrepancy $d_n$.

26. The apparatus of claim 21, wherein the registers included in the first set of registers have an $\alpha^{-1}$ multiplier connected between an input and output of the registers.

27. The apparatus of claim 21, wherein the codeword contains m-bit symbols, and wherein the generator performs plural error locator iterations for determining the coefficients of the error locator polynomial, each error locator iteration having no more than m/2 clock cycles.

28. The apparatus of claim 27, wherein the third set of registers eventually contain coefficients of an error evaluator polynomial, and wherein the generator performs plural error evaluator iterations for determining the coefficients of the error evaluator polynomial, each error locator iteration having no more than m/2 clock cycles.

29. The apparatus of claim 27, wherein m is 8.

30. The apparatus of claim 21, further comprising an $\alpha^{-1}$ multiplier connected between an input and output of the accumulator.

31. The apparatus of claim 21, wherein the inverse generator serially outputs each nibble of the quantity including the inverse of the prior discrepancy in most significant bit order.

32. The apparatus of claim 21, wherein the inverse generator comprises:
a first inverse look up table which receives a parallel input value and which serially outputs a first value in β basis representation in least significant bit order;
a second inverse look up table which receives the parallel input value and serially outputs a second value in β basis representation in least significant bit order;
a first shift register which receives the serially output first value from the first inverse look up table;
a summer which forms a summation of preselected bit positions of the first shift register;
an adder which adds (1) the first value; (2) the second value; and (3) summation of the summer;
a second shift register which receives serially the output of the adder; and
wherein contents of the first shift register comprise higher order bits of an inverse of the input value in α basis representation; and contents of the second shift register comprise lower order bits of an inverse of the input value in α basis representation.

33. The apparatus of claim 32, wherein the parallel input value is received from the accumulator, and wherein the accumulation value accumulated in the accumulator is obtained from the first multiplier.

34. The apparatus of claim 32, wherein the parallel input value is received from the accumulator, and wherein the accumulation value accumulated in the accumulator is a sum of selected ones of the registers of the first set of registers.

35. The apparatus of claim 21, further comprising an error pattern generation circuit which uses the α basis representation of the inverse of the accumulation value output from the inverse generator to generate an error pattern.

36. An inverse generator comprising:
a circuit which receives a parallel input value in β basis representation and which serially outputs, two bits at a time, an α basis representation of an inverse of the parallel input value.

37. The apparatus of claim 36, wherein the inverse generator comprises:
a first inverse look up table which receives the parallel input value and which serially outputs a first value in β basis representation in least significant bit order;
a second inverse look up table which receives the parallel input value and serially outputs a second value in β basis representation in least significant bit order;
a first shift register which receives the serially output first value from the first inverse look up table;
a summer forms a summation of preselected bit positions of the first shift register;
an adder which adds (1) the first value; (2) the second value; and (3) summation of the summer;
a second shift register which receives serially the output of the adder; and
wherein contents of the first shift register comprise higher order bits of an inverse of the input value in α basis representation; and contents of the second shift register comprise lower order bits of the inverse of the input value in α basis representation.

38. The apparatus of claim 36, wherein the inverse generator receives a current discrepancy quantity produced by a convolutional generator operating on a codeword as the parallel input value.

39. The apparatus of claim 36, wherein the inverse generator receives a sum of selected registers of a convolutional generator as the parallel input value.

40. The apparatus of claim 39, further comprising an error pattern generation circuit which uses the α basis representation of the inverse of the input value in α basis representation to generate an error pattern.

41. The apparatus of claim 36, wherein the codeword contains m-bit symbols, and wherein the inverse generator generates the inverse of the input value in α basis representation in no more than m/2 clock cycles.

42. A method of operating a convolutional generator which operates upon a codeword, the method comprising:
using a first recursion rule to generate coefficients of an error locator polynomial σ(x) for the codeword in a first set of registers, the coefficients of the error locator polynomial being generated by multiplying contents τ"(x) of a second set of registers by a current discrepancy quantity which includes a current discrepancy $d_n$;
updating the contents τ"(x) of the second set of registers using a second recursion rule;

the first recursion rule being:

$$\sigma^{(n+1)}(x)=\alpha^d(\sigma^{(n)}-d_n\tau^{(n)})=\alpha^d\sigma^{(n)}(x)-\alpha^d d_n\tau^{(n)}(x)$$

the second recursion rule being:

$$\tau^{(n)}(x)=x*(\tau^{(n-1)}(x)+(\alpha^d d_{n-1})^{-1}\sigma^{(n)}(x)\text{CHANGE\_L})$$

wherein CHANGE_L refers to a change in the length of a connection polynomial, and wherein d is non-zero.

43. The method of claim 42, wherein the first recursion rule is:

$$\sigma^{(n+1)}(\alpha^{-4}\sigma^{(n)}(x))\_31\ (\alpha^{-3}d_n))(\tau^{(n)}(x))\alpha^{-1}=(\alpha^{-4}\sigma^{(n)}(x))-(\alpha^{-3}((\alpha^{-3}d_n)\alpha^2(\tau^{(n)}(x))$$

the second recursion rule is:

$$\tau^{(n)}(x)=x*(\tau^{(n-1)}(x)+\alpha^{-3}(((\alpha^{-4}(\alpha^{-3}d_{n-1}))^{-1}\text{CHANGE\_L})\sigma^{(n)}(x))).$$

44. The method of claim 42, wherein $d_{n-1}^{-1}$ is an inverse of a prior discrepancy, wherein the method further comprises:
   implementing the second recursion rule using a multiplier which updates the second set of registers; and
   applying a quantity including the inverse of the prior discrepancy two bits at a time to the multiplier which updates the second set of registers.

45. The method of claim 44, further comprising applying the quantity including the inverse of the prior discrepancy in α basis representation to the multiplier which updates the second set of coefficient registers.

46. The method of claim 44, wherein bits of each nibble of the quantity including the inverse of the prior discrepancy are serially received in most significant bit order.

47. The method of claim 42, further comprising providing an $\alpha^{-1}$ feedback multiplication for the first set of registers.

48. The method of claim 42, wherein the codeword contains m-bit symbols, and wherein the method comprises performing plural error locator iterations for determining the coefficients of the error locator polynomial, each error locator iteration having no more than m/2 clock cycles.

49. The method of claim 48, wherein the method further comprises performing plural error evaluator iterations for determining the coefficients of the error evaluator polynomial, each error locator iteration having no more than m/2 clock cycles.

50. The method of claim 48, wherein m is 8.

51. The method of claim 42, further comprising:
   taking an inner product of contents of the first set of registers and syndromes in a third set of registers; and
   outputting the inner product two bits at a time to an accumulator.

52. The method of claim 51, further comprising providing an $\alpha^{-1}$ feedback multiplication for the accumulator.

53. The method of claim 51, further comprising serially outputting bits of each nibble of the inner product in most significant bit order.

54. The method of claim 51, further comprising accumulating in the accumulator the current discrepancy quantity, and wherein the current discrepancy quantity is $\alpha^{-3}d_n$.

55. The method of claim 54, further comprising:
   transmitting the current discrepancy quantity from the accumulator to an inverse generator which receives the current discrepancy quantity in β basis representation;
   serially outputting from the inverse generator a quantity including the inverse of a prior discrepancy in α basis representation, the inverse of a prior discrepancy being $d_{n-1}^{-1}$.

56. The method of claim 42, further comprising:
   accumulating the current discrepancy quantity in an accumulator;
   applying the current discrepancy quantity in β basis representation to an inverse generator;
   serially outputting from the inverse generator in α basis representation a quantity including the inverse of a prior discrepancy, the inverse of a prior discrepancy being $d_{n-1}^{-1}$.

57. The method of claim 56, further comprising serially outputting each nibble of the quantity including the inverse of the prior discrepancy in most significant bit order.

58. The method of claim 56, further comprising:
   (a) applying a parallel input value to a first inverse look up table and serially outputting from the first look up table a first value in β basis representation in least significant bit order;
   (b) applying a parallel input value to a second inverse look up table and serially outputting from the second look up table a second value in β basis representation in least significant bit order;
   (c) receiving the serially output first value from the first inverse look up table in a first shift register;
   (d) forming a summation of preselected bit positions of the first shift register in a
   (e) adding (1) the first value; (2) the second value; and (3) summation;
   (f) serially applying the sum of (e) to a second shift register;
   (g) serially outputting contents of the first shift register as higher order bits of an inverse of the input value in α basis representation; and
   (h) serially outputting contents of the second shift register as lower order bits of an inverse of the input value in α basis representation.

59. A method of operating an inverse generator, the method comprising:
   applying a parallel input value in β basis representation to the inverse generator; and
   serially outputting from the inverse generator, two bits at a time, an α basis representation of an inverse of the parallel input value.

60. The method of claim 59, further comprising:
   (a) applying a parallel input value to a first inverse look up table and serially outputting from the first look up table a first value in β basis representation in least significant bit order;
   (b) applying a parallel input value to a second inverse look up table and serially outputting from the second look up table a second value in β basis representation in least significant bit order;
   (c) receiving the serially output first value from the first inverse look up table in a first shift register;
   (d) forming a summation of preselected bit positions of the first shift register in a summer;
   (e) adding (1) the first value; (2) the second value; and (3) summation;
   (f) serially applying the sum of (e) to a second shift register;
   (g) serially outputting contents of the first shift register as higher order bits of an inverse of the input value in α basis representation; and
   (h) serially outputting contents of the second shift register as lower order bits of an inverse of the input value in α basis representation.

61. The method of claim 60, further comprising applying to the inverse generator as the parallel input value a current discrepancy quantity produced by a convolutional generator operating on a codeword.

62. The method of claim 61, wherein the codeword contains m-bit symbols, and wherein the inverse generator generates the inverse of the input value in α basis representation in no more than m/2 clock cycles.

63. The method of claim 60, further comprising applying to the inverse generator a sum of selected registers of a convolutional generator as the parallel input value.

64. The method of claim 63, further comprising applying the inverse of the input value in α basis representation to an error pattern generation circuit for generating an error pattern.

65. A slice of an error correction circuit for a Reed-Solomon decoder, the slice comprising:
- a first set of registers used to accumulate coefficients of an error locator polynomial for a codeword having t correction signals;
- a second set of registers used to update the first set of registers;
- a third set of registers into which syndromes for the codeword are at least initially loaded;
- the first set of registers, the second set of registers, and the third set of registers being distributed over t+1 component slices;
- a first multiplier which prepares an inner product of the syndromes in the third set of registers and contents of the first set of registers;
- an accumulator connected to the first multiplier for accumulating an accumulation value therein;
- an inverse generator which receives the accumulation value and outputs an inverse of the accumulation value;
- a second multiplier which uses the accumulation value and contents of the second set of registers to update the first set of registers;
- a third multiplier which uses the inverse of the accumulation value and contents of the first set of registers to update the second set of registers;
- wherein at least one of the first multiplier, second multiplier, and third multiplier also perform an $\alpha^d$ multiplication (d not equal to zero) whereby no sets of registers other than the first set of registers, the second set of registers, and the third set of registers are utilized in the slices to determine coefficients of the error locator polynomial.

66. The apparatus of claim 65, wherein d equals −4.

67. A convolutional generator comprising:
- a first set of registers;
- a second set of registers;
- an updating multiplier;
- a feedback multiplier;
- wherein the convolutional generator operates upon a codeword and syndromes generated for the codeword by using a first recursion rule to generate coefficients of an error locator polynomial σ(x) for the codeword in the first set of registers, the coefficients of the error locator polynomial being generated in the first set of registers using the updating multiplier, the updating multiplier updating the first set of registers by multiplying contents τ″(x) of the second set of registers by a current discrepancy quantity, the current discrepancy quantity including a current discrepancy $d_n$ and being derived from values stored in the first set of registers and syndromes, and wherein the contents τ″(x) of the second set of registers are updated by the convolutional generator using a second recursion rule; wherein the feedback multiplier is provided for the first set of registers whereby contents of the first set of registers are clocked with a feedback value on a clock of an error locator iteration; wherein the first recursion rule is an expression employed by the convolutional generator for updating the second set of registers and the second recursion rule is an expression employed by the convolutional generator for updating the first set of registers.

68. The apparatus of claim 67, wherein the first recursion rule is:

$$\sigma^{(n+1)}(x) = \alpha^d(\sigma^{(n)} - d_n \tau^{(n)}) = \alpha^d \sigma^{(n)}(x) - \alpha^d d_n \tau^{(n)}(x)$$

the second recursion rule is:

$$\tau^{(n)}(x) = x * (\tau^{(n-1)}(x) + (\alpha^d d_{n-1})^{-1} \sigma^{(n)}(x) \text{CHANGE\_L})$$

wherein CHANGE_L refers to a change in the length of a connection polynomial, and wherein d is non-zero.

69. The apparatus of claim 68, wherein
the first recursion rule is:

$$\sigma^{(n+1)}(x) = (\alpha^{-4} \sigma^{(n)}(x)) - (\alpha^{-3} d_n)(\tau^{(n)}(x) \alpha^{-1} = (\alpha^{-4} \sigma^{(n)}(x)) - (\alpha^{-3}((\alpha^{-3} d_n) \alpha^2 (\tau^{(n)}(x)))$$

the second recursion rule is:

$$\tau^{(n)}(x) = x * (\tau^{(n-1)}(x) + \alpha^{-3}(((\alpha^{-4}(\alpha^{-3} d_{n-1}))^{-1} \text{CHANGE\_L}) \sigma^{(n)}(x))).$$

70. The apparatus of claim 67, wherein the feedback value is $\alpha^{-1}$.

* * * * *